(12) United States Patent
Petta et al.

(10) Patent No.: US 11,610,984 B2
(45) Date of Patent: Mar. 21, 2023

(54) SPIN TO PHOTON TRANSDUCER

(71) Applicant: The Trustees of Princeton University, Princeton, NJ (US)

(72) Inventors: Jason Petta, Princeton, NJ (US); Xiao Mi, Princeton, NJ (US); David Zajac, Gibsonia, PA (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 17/389,117

(22) Filed: Jul. 29, 2021

(65) Prior Publication Data

US 2021/0367065 A1 Nov. 25, 2021

Related U.S. Application Data

(62) Division of application No. 16/534,431, filed on Aug. 7, 2019, now Pat. No. 11,121,239.

(Continued)

(51) Int. Cl.
*H01L 29/66* (2006.01)
*H01L 29/165* (2006.01)
(Continued)

(52) U.S. Cl.
CPC ...... *H01L 29/66977* (2013.01); *H01L 29/165* (2013.01); *H01L 29/423* (2013.01);
(Continued)

(58) Field of Classification Search
CPC ..... H01L 27/18; H01L 27/20; H01L 29/0657; H01L 29/0684; H01L 29/0692; H01L 29/12; H01L 29/122; H01L 29/127; H01L 29/165; H01L 29/167; H01L 29/41; H01L 29/423; H01L 29/42396; H01L 29/66007; H01L 29/66227; H01L 29/66439; H01L 29/66977; H01L 29/66984; H01L 29/7613; H01L 29/82; B82Y 10/00; G06N 10/00

See application file for complete search history.

(56) References Cited

U.S. PATENT DOCUMENTS

| | | |
|---|---|---|
| 10,192,976 B2 | 1/2019 | Petta et al. |
| 2018/0330266 A1 | 11/2018 | Simmons et al. |
| 2020/0027972 A1 | 1/2020 | Petta et al. |

OTHER PUBLICATIONS

Mi et al., "A coherent spin-phonton interface in silicon", Nature vol. 555, Mar. 2018, 15 pages.

(Continued)

*Primary Examiner* — Cheung Lee
(74) *Attorney, Agent, or Firm* — BakerHostetler

(57) ABSTRACT

Methods, devices, and systems are described for storing and transferring quantum information. An example device may comprise at least one semiconducting layer, one or more conducting layers configured to define at least two quantum states in the at least one semiconducting layer and confine an electron in or more of the at least two quantum states, and a magnetic field source configured to generate an inhomogeneous magnetic field. The inhomogeneous magnetic field may cause a first coupling of an electric charge state of the electron and a spin state of the electron. The device may comprise a resonator configured to confine a photon. An electric-dipole interaction may cause a second coupling of an electric charge state of the electron to an electric field of the photon.

20 Claims, 36 Drawing Sheets
(35 of 36 Drawing Sheet(s) Filed in Color)

Related U.S. Application Data

(60) Provisional application No. 62/715,533, filed on Aug. 7, 2018.

(51) Int. Cl.
   *H01L 29/423* (2006.01)
   *H01L 29/76* (2006.01)

(52) U.S. Cl.
   CPC .... *H01L 29/7613* (2013.01); *H01L 29/66439* (2013.01); *H01L 29/66984* (2013.01)

(56) References Cited

OTHER PUBLICATIONS

Benito et al., "Input-output theory for apin-photon coupling in Si double quantum dots", Physical Review B96, Dec. 2017, 11 pages.
Borjans et al., "Long-Range Microwave Mediated Interactions Between Electron Spins", department of Physics, Princeton University, Princeton, New Jersey, May 12, 2019, 6 pages.
Sillanpaa, M. A., Park, J. I. & Simmonds, R. W. Coherent quantum state storage and transfer between two phase qubits via a resonant cavity. Nature 449,438-442 (2007).
Nigg, S. E., Fuhrer, A. & Loss, D. Superconducting grid-bus surface code architecture for hole-spin qubits. Phys. Rev. Lett. 118, 147701 (2017).
Astner et al., "Coherent Coupling of Remote Spin Ensembles Via a Cavity Bus", Phys. Rev. Lett. 118,140502 (2017), 11 pages.
Corcoles et al., "Demonstration of a quantum error detection code using a square lattice of foursuperconducting qubits", Nat. Commun. 6, 6979 (2015), 10 pages.
Cottet et al., "Spin Quantum Bit with Ferromagnetic Contacts for Circuit QED", Phys.: Condens. Matter 29,433002 2017), 4 pages.
Yang et al., "Spin-valley lifetimes in a silicon quantum dot with tunable valley splitting" Nat. Commun. 4, 2069 (2013), 17 pages.
Petta et al., "Coherent Manipulation of Copied Electron Spins in Semiconductor Quantum Dots", Science 309,2180 (2005), 11 pages.
Zajac et al., "Quantum CNOT Gate for Spins in Silicon", Science (2017), 27 pages.
Watson et al., "A programmable two-qubit quantum processor in silicon", arXiv:1708.04214, 22 pages.
Mi et al., "Circuit quantum electrodynamics architecture for gate-defined quantum dots in silicon", Science 335,156 (2017), 5 pages.
Bienfait et al., "Controlling Spin Relaxation with a Cavity", Nature (London) 531, 74 (2016), 22 pages.
Mi et al., "A coherent spin-photon interface in silicon", Nature 25769, 15 pages.
Borselli et al., "Measurement of Valley Splitting in High-Symmetry Si—SiGe Quantum Dots", Appl. Phys. Lett. 98, 123118 (2011), 4 pages.
Jamonneau et al., "Coherent Population Trapping of a Single Nuclear Spin Under Ambient Conditions", Phys. Rev. Lett. 116, 043603 (2016), 13 pages.
Burkard et al., "Dispersive Readout of Valley Splittings in Cavity-Coupled Silicon Quantum Dots", Phys. Rev. B 94, 195305 (2016), 8 pages.
Waldherr et al., "Quantum Error Correction in a Solid-State Hybrid Spin Register", Nature (London) 506, 204 (2014), 10 pages.
Taylor et al., "Electrically-Protected Resonant Exchange Qubits in Triple Quantum Dots", Phys. Rev. Lett. 111, 050502 2013), 5 pages.
Russ et al., "Long distance coupling of resonant exchange qubits", Phys. Rev. B 92, 205412 (2015), 12 pages.
Kim et al., "Microwave-Driven Coherent Operation of a Semiconductor Quantum Dot Charge Qubit", Nat. Nanotechnol. 10, 243 (2015), 9 pages.
Veldhorst et al., "An addressable quantum dot qubit with fault-tolerant control fidelity", Nat. Nanotechnol. 9, 981(2014), 10 pages.
Mamoglu et al., "Quantum information processing using quantum dot spins and cavity—QED", Phys. Rev. Lett. 83, 4204 (1999), 6 pages.
Kubo et al., "Hybrid quantum circuit with a superconducting qubit coupled to a spin ensemble", Phys. Rev. Lett. 107, 220501 (2011), 25 pages.
Hu et al., "Strong coupling of a spin qubit to a superconducting stripline cavity", Phys. Rev. B 86, 035314 (2012), 6 pages.
Hanson et al., "Spins in few-electron quantum dots", Rev. Mod. Phys. 79, 1217 (2007), 52 pages.
Duan et al., Long-distance quantum communication with atomic ensembles and linear optics. Nature 414, 413 (2001), 11 pages.
Monroe et al., "Scaling the Ion Trap Quantum Processor", Science 339, 1164 (2013), pp. 1164-1169.
Axline et al., "On-demand quantum state transfer and entanglement between remote microwave cavity memories", Nat. Phys. 14, 705 (2018), 23 pages.
Preskill, "Reliable quantum computers", Proc. R. Soc. London, Ser. A 454, (1998) pp. 385-410.
Veldhorst et al., "A two-qubit logic gate in silicon" Nature 526, 410 (2015), 11 pages.
Fujita et al. "Coherent shuttle of electron-spin states", Npj Quantum Inf. 3, 22 (2017), 6 pages.
Mills et al., "Shuttling a single charge across a one-dimensional array of silicon quantum dots", Nat. Commun. 10, 1063 (2019), 12 pages.
Rau, et al., "Cavity QED in Superconducting Circuits: Susceptibility at Elevated Temperatures", Phys. Rev. B 70, 249701 (2013), 7 pages.
Dehollain et al., "Bell's inequality violation with spins in silicon", Nat. Nanotechnol. 11, Mar. 2016, pp. 242-247.
Veldhorst et al., "An addressable quantum dot qubit with fault-tolerant control-fidelity", Nat. Nanotechnol. 9, Dec. 2014, pp. 981-985.
Zajac et al. "Resonantly driven CNOT gate for electron spins", Science 359, Jan. 2018, pp. 439-442.
Mamoglu, "Cavity QED based on collective magnetic dipole coupling: spin ensembles as hybrid two-level systems", Phys. Rev. Lett. 102, 083602, Feb. 2009, 4 pages.
Amsuss et al., "Cavity QED with magnetically coupled collective spin states", Phys. Rev. Lett. 107, 060502, Aug. 2011, 5 pages.
Trif et al., "Spin dynamics in InAs nanowire quantum dots coupled to a transmission line", Phys. Rev. B 77, 045434 (2008), 14 pages.
Beaudoin et al., "Coupling a single electron spin to a microwave resonator: collrolling transverse and longitudinal couplings". Nanotechnology 27, 464003 (2016), 13 pages.
Frey et al., "Dipole coupling of a double quantum dot to a microwave resonator", Phys. Rev. Lett. 108, 046807 (2012), 5 pages.
Viennot, "Coherent coupling of a single spin to microwave cavity photons", Science 349, Jul. 2015, pp. 408-411.
Raimond et al., "Colloquium: Manipulating quantum entanglement with atoms andphotons in a cavity", Rev. Mod. Phys. 73, 565 Aug. 2001, pp. 565-582.
Trif et al., "Spin dynamics in InAs nanowire quantum dots coupled to a transmission line", Phys. Rev. B 77, 045434, Jan. 2008, 14 pages.
Novikov et al., "Raman coherence in a circuit quantum electrodynamics lambda system", Nat. Phys. 12, 75, Nov. 2015, 7 pages.
Kubo, "Turn to the dark side", Nat. Phys. 12,, Jan. 2016, 3 pages.
Collett et al., "Squeezing of intracavity and traveling-wave light fields produced in parametric amplification", Phys. Rev. A 30, Sep. 1984, pp. 1386-1391.
Gardiner et al., "Input and poutput in damped quantum systems: Quantum stochastic differential equations and the master equation", Phys. Rev. A 31, Jun. 1985, pp. 3761-3774.
Thompson et al., "Observation of Normal-Mode Splitting for an Atom in an Optical Cavity", Phys. Rev. Lett. 58, Feb. 1992, pp. 1132-1135.
Taylor et al., "Fault-tolerant architecture for quantum computation using electrically controlled semiconductors spins", Nat. Phys. 1, Dec. 2005, pp. 177-183.
Reed et al., "Realization of three-qubit quantum error correction with superconducting cii cuits". Nature (London) 482, Feb. 2012, pp. 382-385.

(56) References Cited

OTHER PUBLICATIONS

Petersson, "Quantum Coherence in a One-Electron Semiconductor Charge Qubit", Phys. Rev. Lett. 105,246804, Dec. 2010, 4 pages.
Maune et al., "Coherent singlet-triplet oscillations in a silicon-based double quantum dot", Nature 481, Jan. 2012, 15 pages.
Taylor et al., "Electrically Protected Resonant Exchange Qubits in Triple Quantums Dots",Phys. Rev. Lett. 111, 050502, Aug. 2013, 5 pages.
Pfaff et al., "Controlled release of multiphoton quantum states from a microwave cavity memory", Nat. Phys. 13, 882, Jun. 2017, 6 pages.
Zajac et al., "Scalable Gate Architecture for a One-Dimensional Array of Semiconductor Spin Qubits", Phys. Rev. Appl. 5, 054013, Nov. 2016, 8 pages.
Fano, "Effects of Configuration Interaction on Intensities and Phase Shifts", Phys. Rev. 124, 1866, Dec. 1961, pp. 1866-1878.
Tyryshkin et al., "Electron spin coherence exceeding seconds in high-purity silicon", Nat. Mater. 11, (2012), 18 pages.
Saeedi et al., "Room-temperature quantum bit storage exceeding 39 minutes using ionized donors in silicon-28", Science 342, 830-833 (2013).
Loss et al., "Quantum computation with quantum dots", Phys. Rev. A 57, (1998), 20 pages.
Petta, et al. "Coherent manipulation of coupled electron spins in semiconductor quantum dots", Science 309, (2005), 11 pages.
Neumann, et al., "Multipartite entanglement among single spins in diamond", Science 320,1326-1329 (2008).
Zwanenburg et al., "Silicon quantum electronics" Rev. Mod. Phys. 85, 961-1019 (2013).
Takeda et al., "A fault-tolerant addressable spin qubit in a natural silicon quantum dot" Set. Adv. 2, e 1600694 (2016), 23 pages.
Mcneil et al., "On-demand single-electron transfer between distant quantum dots" Nature 477,439-442 (2011).
Baart et al., "Single-spin CCD" Nat. Nanotechnol. 11, (2016), 26 pages.
Flentje et al., Coherent long-distance displacement of individual electron spins. Nat. Common. 8, 501 (2017), 27 pages.
Baart et al., Coherent spin-exchange via a quantum mediator. Nat. Nanotechnol. 12, (2016), 23 pages.
Bruhat et al., "Strong coupling between an electron in a quantum dot circuit and a photon in a cavity", Phys.. Rev. B 98, (2016), 19 pages.
Mi et al., "Strong coupling of a single electron in silicon to a microwave photon" Science 355, (2017), 10pages.
Stockklauser et al. "Strong coupling cavity QED with gate-defined double quantum dots enabled by a high impedance Yesonator", Phys. Rev. X 7, 011030 (2017), 6 pages.
Thompson et al. "Observation of normal-mode splitting for an atom in an optical cavity", Phys. Rev. Lett. 68, 1132-1135(1992).
Brune et al., "Quantum Rabi oscillation: a direct test of field quantization in a cavity", Phys. Rev. Lett. 76,1800-1803 K1996).
Wallraff et al., "Strong coupling of a single photon to a superconducting qubit using circuit quantum electrodynamics", Nature 431, 162-167 (2004).
Blais et al., "Cavity quantum electrodynamics for superconducting electrical circuits: an architecture for quantum computation", Phys. Rev. A 69, 062320 (2004), 14 pages.
Childress et al., "Mesoscopic cavity quantum electrodynamics with quantum dots", Phys. Rev. A 69, 042302 (2004), 8 pages.
Schuster et al., "High-cooperativity coupling of electron-spin ensembles to superconducting cavities", Phys. Rev. Lett. 105, 140501 (2010), 4 pages.
Bienfait et al., Controlling spin relaxation with a cavity. Nature 531, (2016), 22 pages.
Eichler et al., "Electron spin resonance at the level of 104 spins using low impedance superconducting resonators", Phys. Rev. Lett. 118, 037701 (2017), 5 pages.
Cottet et al., Spin quantum bit with ferromagnetic contacts for circuit QED. Phys. Rev. Lett. 105, 160502 (2010), 4 pages.
Petersson et al., "Circuit quantum electrodynamics with a spin qubit", Nature 490, (2012), 11 pages.
Kawakami et al., "Electrical control of a long-lived spin qubit in a Si/SiGe quantum dot", Nat. Nanotechnol. 9, (2014), 33 pages.
Burkard et al., "Ultra-long-distance interaction between spin qubits", Phys. Rev. B 74, 041307 (2006), 5 pages.
Jin et al., "Strong coupling of spin qubits to a transmission line resonator", Phys. Rev. Lett. 108, 190506 (2012), 5 pages.
Benito et al., "Input-output theory for spin-photon coupling in Si double quantum dots", Phys. Rev. B 96, 235434 K2017), 13 pages.
Schuster et al., "ac Stark shift and dephasing of a superconducting qubit stongly coupled to a cavity field", Phys. Rev Lett. 94, 123602 (2005), 4 pages.
Mi et al., "Circuit quantum electrodynamics architecture for gate-defined quantum dots in silicon", Appl. Phys. Lett. 110 043502 (2017).
Mi et al., "High-resolution valley spectroscopy of Si quantum dots", Phys. Rev. Lett. 119, 176803 (2017), 5 pages.
Probst et al., "Inductive-detection electron-spin resonance spectroscopy with 65 spins/V Hz sensitivity", Appl. Phys. Lett. 111, 202604 (2017), 6 pages.
Majer et al., "Coupling superconducting qubits via a cavity bus", Nature 449, (2007), 6 pages.
Zajac et al., "A reconfigurable gate architecture for Si/SiGe quantum dots", Appl. Phys. Lett. 106, 223507 (2015), 5 pages.
Elzerman et al., Single-shot read-out of an individual electron spin in a quantum dot. Nature 430, (2004), 13 pages.
Fowler et al., "Surface codes: towards practical large-scale quantum computation", Phys. Rev. A 86, 032324 K2012), 54 pages.
Samkharadze et al.. "Strong spin-photon coupling in silicon", Science, Nov. 2017, 5 pages.
Landig et al., "Coherent spin-qubit photon coupling", Nature, Jul. 2018, 8 pages.
Debnath et al., "Demonstration of a small programmable quantum computer with atomic qubits", Nature 536, (2016), 10 pages.
Yoneda et al., A > 99:9% fidelity quantum-dot spin qubit with coherence limited by charge noise. Preprint at https://arxiv.org/abs/1708.01454 (2017), 22 pages.
Samkharadze et al., "High-kinetic-inductance superconducting nanowire resonators for circuit QED in a magnetic field", Phys. Rev. Appl. 5, 044004 (2016), 10 pages.
Wallraff et al., "Vacuum Rabi splitting in a semiconductor circuit QED system". Phys. Rev. Lett. 111, 249701 (2013), 2 pages.
Wallraff et al., "Approaching unit visibility for control of a superconducting qubit with dispersive readout", Phys. Rev. Lett. 95. 060501 (2005), 5 pages.

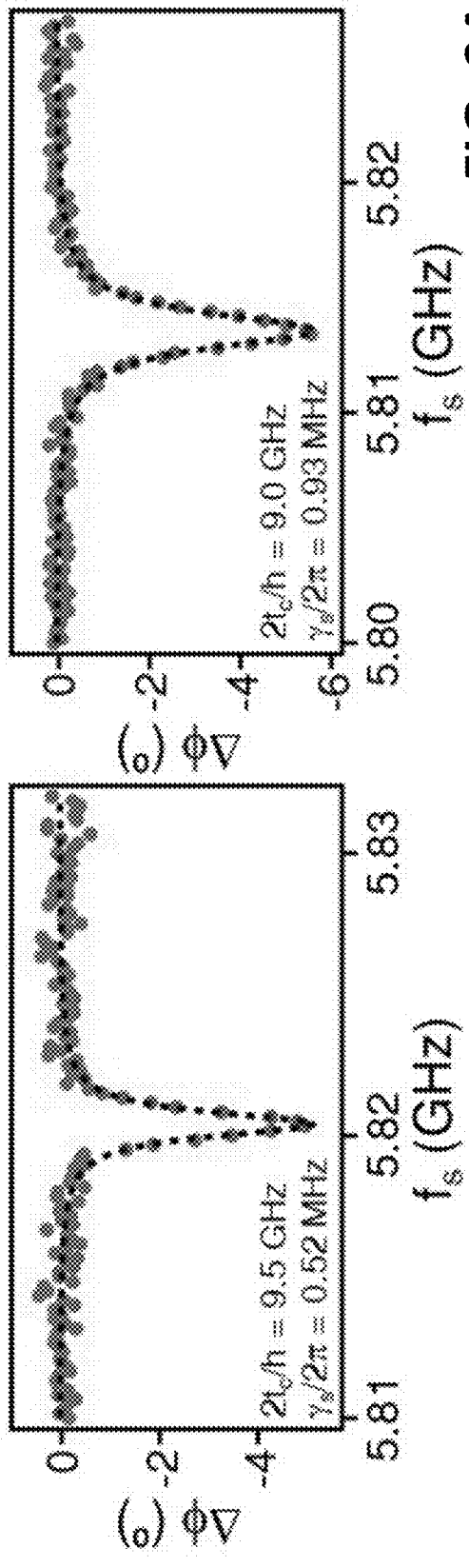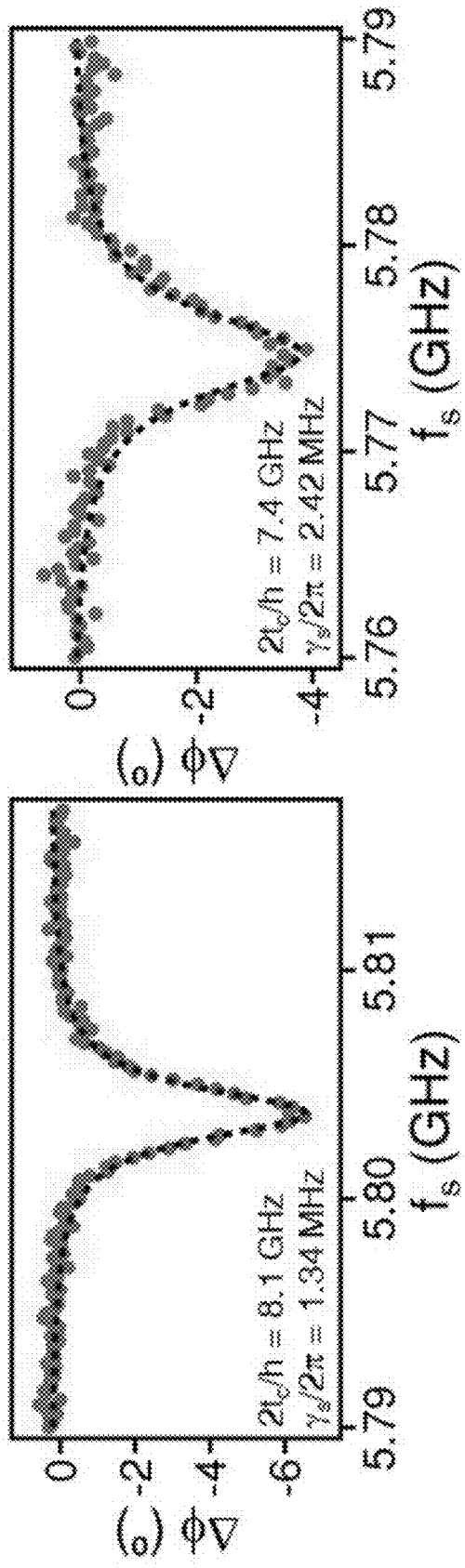
FIG. 9A
FIG. 9B

SPIN TO PHOTON TRANSDUCER

CROSS-REFERENCE TO RELATED APPLICATIONS

The present application is a divisional application of U.S. application Ser. No. 16/534,431, "Spin To Photon Transducer," filed on Aug. 7, 2019, which claims the benefit of and is a non-provisional of U.S. Application No. 62/715,533, "Spin To Photon Transducer," filed on Aug. 7, 2018, each of which is incorporated herein by reference in its entirety for any and all purposes.

GOVERNMENT RIGHTS

This invention was made with government support under Grant No. W911NF-15-1-0149 awarded by the U.S. Army/Army Research Office and Grant No. H98230-15-R-0453 awarded by the U.S. Department of Defense. The government has certain rights in the invention.

BACKGROUND

Electron spins in silicon quantum dots are attractive systems for quantum computing owing to their long coherence times and the promise of rapid scaling of the number of dots in a system using semiconductor fabrication techniques. Nearest-neighbor exchange coupling of two spins has been demonstrated but has great limitations due to the inherent limitations in scale. Spin-photon coupling has been studied but is challenging because of the small magnetic-dipole moment of a single spin, which limits magnetic-dipole coupling rates to less than 1 kilohertz. Thus, there is a need for more sophisticated techniques for establishing quantum information systems.

SUMMARY

The present disclosure describes methods, systems, and devices for storing and transferring quantum information. An example device may comprise at least one semiconducting layer, one or more conducting layers configured to define at least two quantum states in the at least one semiconducting layer and confine an electron in or more of the at least two quantum states, and a magnetic field source configured to generate an inhomogeneous magnetic field. The inhomogeneous magnetic field may cause a first coupling of an electric charge state of the electron and a spin state of the electron. The device may comprise a resonator configured to confine a photon. An electric-dipole interaction may cause a second coupling of an electric charge state of the electron to an electric field of the photon.

An example system may comprise a first structure configured to define at least two first quantum states in a first semiconducting layer and confine a first electron in or more of the at least two first quantum states. The first structure may comprise at least one magnetic field source configured to supply an inhomogeneous magnetic field to the first electron. The system may comprise a second structure configured to define at least two second quantum states in a second semiconducting layer and confine a second electron in or more of the at least two second quantum states. The system may comprise a resonator disposed adjacent the first structure and the second structure. Tuning of an external magnetic field may allow for (e.g., may configure) a photon in the resonator to mediate coupling of a first spin state of the first electron to a second spin state of the second electron.

An example method may comprise confining a first electron with a first structure. The first structure may define two quantum states in at least one semiconducting layer using one or more conducting layers. The method may comprise causing, based on an inhomogeneous magnetic field source, a first coupling of an electric charge state of the first electron and a first spin state of the first electron. The method may comprise causing, based on an electric-dipole interaction, a second coupling of an electric field of a photon in a resonator to an orbital state of the first electron. The method may comprise causing, based on the first coupling and the second coupling, a coupling of the photon and the first spin state of the first electron.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

BRIEF DESCRIPTION OF THE DRAWINGS

The file of this patent or application contains at least one drawing/photograph executed in color. Copies of this patent or patent application publication with color drawing(s)/photograph(s) will be provided by the Office upon request and payment of the necessary fee.

The accompanying drawings, which are incorporated in and constitute a part of this specification, illustrate embodiments and together with the description, serve to explain the principles of the methods and systems.

FIG. 9A shows an example spin decoherence rate.

FIG. 9B shows another example spin decoherence rate.

DETAILED DESCRIPTION OF ILLUSTRATIVE EMBODIMENTS

Figure 1A:
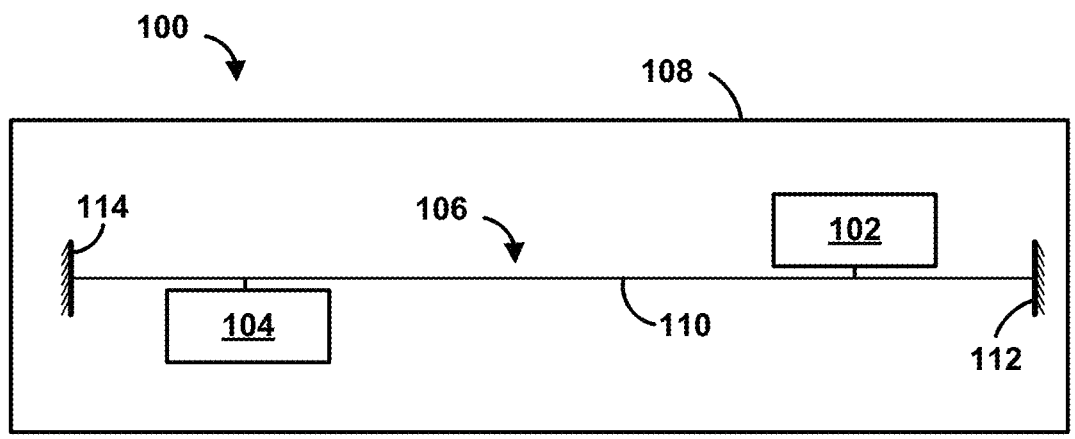
FIG. 1A shows a block diagram of an example system for transferring quantum state information.

The present disclosure relates to a quantum computing device, methods, an systems. An example device may comprise a spin to photon transducer. The device may be configured to transfer the spin quantum state of a solid-state electron to a microwave photon in a superconducting cavity.

The disclosed device may comprise a hybrid nano-electronic device configured to convert the quantum state of a spin electron into a photon in a superconducting cavity. The device may convert quantum information encoded in a single photon to spin state information. This conversion may comprise the following steps. The electric field of the cavity photon may be coupled to the orbital state of the electron through electric dipole interaction. The orbital state of the electron may be hybridized with its spin state through a micro-magnet placed over the double quantum dot in which the electron resides. A large spin-cavity coupling rate of 10 MHz may be achieved by the device, which satisfies the requirement for strong coupling and allows for scaling up individual spin qubits to form a full spin quantum processor via photonic links.

One application of the disclosed approach is to allow distant electron spins to interact through microwave photons. The disclosed approach may allow electron spins to be coupled at long distances using a single microwave frequency photon. The superconducting cavity used in the device is ~7 mm long whereas the electron is confined within a spatial extent of ~70 nm. By converting the electron spin into a microwave photon which is free to move within the cavity, the device enables distant spins to be coupled through the photonic link. This is an important for building a quantum computer using electron spins.

The disclosed approach is advantageous over previous devices which couple electron spins to microwave photons through magnetic dipole-dipole interactions. Due to the weak magnetic field of a single microwave photon, the dipole-dipole coupling strength is very weak (ranging from a few Hz to a few kHz), and limits the device operation speed. The disclosed device couples microwave photons to electron spins by hybridizing the electron spin with its orbital state, which responds to the electric field of a single photon. This indirect coupling scheme allows a large spin-cavity coupling strength of over 10 MHz to be achieved, which exceeds the threshold necessary for transferring the quantum state of the electron spin to that of a microwave photon.

The disclosed device may comprise a Si/SiGe semiconductor heterostructure which confines electrons in a 2-dimensional plane. Three overlapping layers of aluminum electrodes may be patterned. These electrodes may be biased to confine a single electron within a double quantum dot (DQD). A niobium superconducting cavity may be fabricated adjacent (e.g., next to, in contact with) to the DQD. The electric field of a cavity photon may be coupled to the orbital state of the electron through electric dipole interaction. A micro-magnet placed over the DQD may produce a strong local magnetic field gradient which hybridizes the orbital state of the electron with its spin state, thereby coupling the electric field of the cavity photon to the spin state of the electron.

The disclosed device successfully achieved the strong coupling regime between the electron spin and a cavity photon for the first time with gate-defined quantum dots. This strong coupling indicates that the disclosed device may be used for long-range entanglement of distant spins. Further improvement of the device includes suppression of charge noise, which may be the limiting factor of the coherence time of the electron spin.

The disclosed device has been made and tested experimentally. Vacuum Rabi splitting, which is a splitting of the cavity transmission into two well-separated peaks, is clearly observed when the transition frequency of the electron spin is tuned close to the cavity frequency. The observation of vacuum Rabi splitting is well-established evidence for strong coupling.

The disclosed approach may be used to rapidly read out spin qubits, which are a popular choice for building a solid-state quantum computer. The readout speed is only limited by the rate at which photons leave the cavity, which may be easily controlled. The cavity may also serve as a bus which interconnects distant spin qubits together, which may be important for scaling up spin qubits into a full-fledged quantum computer.

FIG. 1A shows a block diagram of an example system for transferring quantum state information. The system 100 may comprise a first structure 102 and/or a second structure 104. The first structure 102 may be coupled to the second structure 104 via a resonator 106 (e.g., or a path, waveguide, cavity, optical path). The first structure 102, the second structure 104, and/or the resonator 106 may be disposed on a chip 108 (e.g., monolithically integrated circuit, substrate). The chip 108 may comprise a first material stack comprising the first structure 102. The chip 108 may comprise a second material stack comprising the second structure 104. The second material stack may be separate from the first material stack. The first material stack and second material stack may be formed simultaneously using the same fabrication process or may be formed as two separate processes. In some implementations, the first structure 102 and the second structure 104 may be disposed on separate chips.

The first structure 102 may be configured to define at least two first quantum states. The at least two first quantum states may comprise, have, and/or be indicative of spin states (e.g., electron spin states). The first structure 102 may define the at least two first quantum states based on one or more potential wells (e.g., generated using gates to define electric fields). The at least two first quantum states may comprise a gate defined silicon double quantum dot.

The at least two first quantum states may be defined in a first semiconducting layer. The first structure 102 may be configured to confine a first electron in or more of the at least two first quantum states. The first structure 102 may comprise at least one first magnetic field source (e.g., the first magnetic field source 134 and the second magnetic field source 136 shown in FIG. 1B). The first magnetic field source may be configured to supply a first inhomogeneous magnetic field to the first electron.

The at least one first magnetic field source may comprise at least one micro-magnet disposed in a material stack comprising the first semiconducting layer. The at least one first magnetic field source may comprise a first micro-magnet and a second micro-magnet separated from the first micro-magnet. The at least one first magnetic field source may be tilted such that a long axis of the at least one first magnetic field source is angled relative to an axis between the at least two first quantum states of the first structure 102. The at least one first magnetic field source may comprise a current carrying wire configured to generate the first inhomogeneous magnetic field (e.g., to enable spin-photon coupling). The at least one first magnetic field source may comprise an electrically tunable material, a multiferroic material, an electrically tunable multiferroic material, a combination thereof, and/or the like.

The second structure 104 may be configured to define at least two second quantum states in a second semiconducting layer and confine a second electron in or more of the at least two second quantum states. The at least two second quantum states may comprise, have, and/or be indicative of spin states (e.g., electron spin states). The second structure 104 may define the at least two second quantum states based on one or more potential wells (e.g., generated using gates to define electric fields). The at least two second quantum states may comprise a gate defined silicon double quantum dot.

The at least two second quantum states may be defined in a second semiconducting layer. The second structure 104 may be configured to confine a second electron in or more of the at least two second quantum states. The second structure 104 may comprise at least one second magnetic field source. The at least one second magnetic field source may be configured to supply a second inhomogeneous magnetic field to the second electron. The second electron may be separated from the first electron by a distance in a range of one or more of: about 1 mm to about 5 mm, about 2 mm to about 4 mm, about 3 mm to about 4 mm, about 3 mm to about 4 mm, about 1 mm to about 10 mm, or about 3 mm to about 8 mm.

The at least one second magnetic field source may comprise at least one micro-magnet disposed in a material stack (e.g., the second material stack) comprising the second semiconducting layer. The at least one second magnetic field source may comprise a third micro-magnet and a fourth micro-magnet separated from the third micro-magnet. The at least one second magnetic field source may be tilted such that a long axis of the at least one second magnetic field source is angled relative to an axis between the at least two second quantum states of the second structure 104. The at least one second magnetic field source may comprise a current carrying wire configured to generate the second inhomogeneous magnetic field (e.g., to enable spin-photon coupling). The at least one second magnetic field source may comprise an electrically tunable material, a multiferroic material, an electrically tunable multiferroic material, a combination thereof, and/or the like.

The resonator 106 may be disposed adjacent the first structure 102 and/or the second structure 104. The resonator 106 may comprise one or more of a cavity, a superconductive cavity, or a microwave cavity. The resonator 108 may comprise a path 110 (e.g., optical path), a first mirror 112 disposed on the path 110, and/or a second mirror 114 disposed on the path 110 opposite the first mirror 112. The path may be defined by walls, a waveguide, a combination thereof, and/or the like.

The resonator 106 may comprise a center pin (e.g., or center wire) adjacent a vacuum gap. The center pin may be disposed along a center axis of the resonator 106. The center pin may have a thickness in a range of one or more of: about 50 nm to about 10 μm. or about 0.5 μm to about 1 μm. The vacuum gap may have a thickness in a range of one or more of: about 15 μm to about 25 μm or about 50 nm to about 30 μm. The resonator 106 may have an impedance in a range of one or more of: about 50Ω to about 200Ω, about 50Ω to about 300Ω, about 50Ω to about 3 kΩ, about 200Ω to about 300Ω, about 200Ω to about 2 kΩ, about 1 kΩ to about 2 kΩ, about 200Ω to about 3 kΩ or about 1 kΩ to about 3 kΩ. A length of the resonator 106 may be between about 10,000 and about 1,000,000 times a length in which the first electron is confined. The resonator 106 may have a center frequency in a range of one or more of: about 2 GHz to about 12 GHz or about 7 GHz and about 8 GHz.

The system 100 may be configured to enable spin-photon coupling between the first electron and a photon in the resonator 106. The spin-photon coupling may be based on an external magnetic field. The system 100 may be configured to enable spin-spin coupling between the first electron and the second electron. Tuning of the external magnetic field may allow for the photon in the resonator 106 to mediate coupling a first spin state of the first electron to a second spin state of the second electron.

The first inhomogeneous magnetic field may enable a first coupling of an electric charge state of the first electron and a first spin state of the first electron. The coupling may comprise hybridization of the electric charge state of the first electron and the first spin state of the first electron. An electric-dipole interaction may cause a second coupling of an electric charge state of the first electron to an electric field of the photon. The second coupling may comprise hybridization of the electric charge state of the first electron and the electric field of the photon.

The second inhomogeneous magnetic field may enable a third coupling of an electric charge state of the second electron and a second spin state of the second electron. The coupling may comprise hybridization of the electric charge state of the second electron and the second spin state of the second electron. An electric-dipole interaction may cause a fourth coupling of an electric charge state of the second electron to an electric field of the photon. The fourth coupling may comprise hybridization of the electric charge state of the second electron and the electric field of the photon.

The photon may be coupled to the first spin state of the first electron based on the first coupling and the second coupling. The photon may be coupled to the second spin state of the second electron based on the third coupling and the fourth coupling. Adjusting one or more of a field strength or an angle of an external magnetic field applied to one or more of the resonator 106 or the first structure 102 may cause coupling of the first spin state to the photon. Adjusting one or more of the field strength or the angle of an external magnetic field applied to one or more of the resonator 106 or the second structure 104 may cause coupling of the second spin state to the photon. Causing resonance of an energy of the first electron and an energy of the photon may cause coupling of the first spin state to the photon.

Causing resonance of an energy of the second electron and an energy of the photon may cause coupling of the second spin state to the photon. Adjusting one or more of an angle or an amplitude of the external magnetic field may allow for simultaneous tuning of the first spin state of the first electron and the second spin state of the second electron in resonance with one or more of the photon or the resonator 106. Adjusting one or more of an angle or an amplitude of the external magnetic field may allow for simultaneous tuning of the a plurality of spin states in resonance with one or more of the photon or the resonator 106. A spin-photon coupling between the photon and one or more of the first electron or the second electron may occur with a spin-photon coupling rate in a range of one or more of: about 10 Mhz to about 15 Mhz or about 5 MHz to about 150 MHz.

The system 100 may be configured to enable coupling of a plurality of quantum states to the resonator 106 to generate long range quantum gates between the plurality of quantum states. The plurality of quantum states may be coupled to and/or comprised in the resonator 106. A plurality of structures (e.g., in one or in separate material stacks) may each be configured to define one or more quantum states (e.g., potential well, energy states, spin states). The plurality of quantum states may each be tuned (e.g., simultaneously, in groups, individually) in and/or out of resonance with the resonator 106. The plurality of quantum states may each be tuned in and/or out of resonance with the resonator 106 using electrical control, electrical tuning, electrical detuning, tuning of a magnetic field (e.g., a local magnetic field associated with a specific structure and/or quantum state), a combination thereof, and/or the like. Current carrying wires, multiferroic materials, a combination thereof, and/or the like may be used to tune corresponding quantum states of the plurality of quantum states.

Figure 1B:
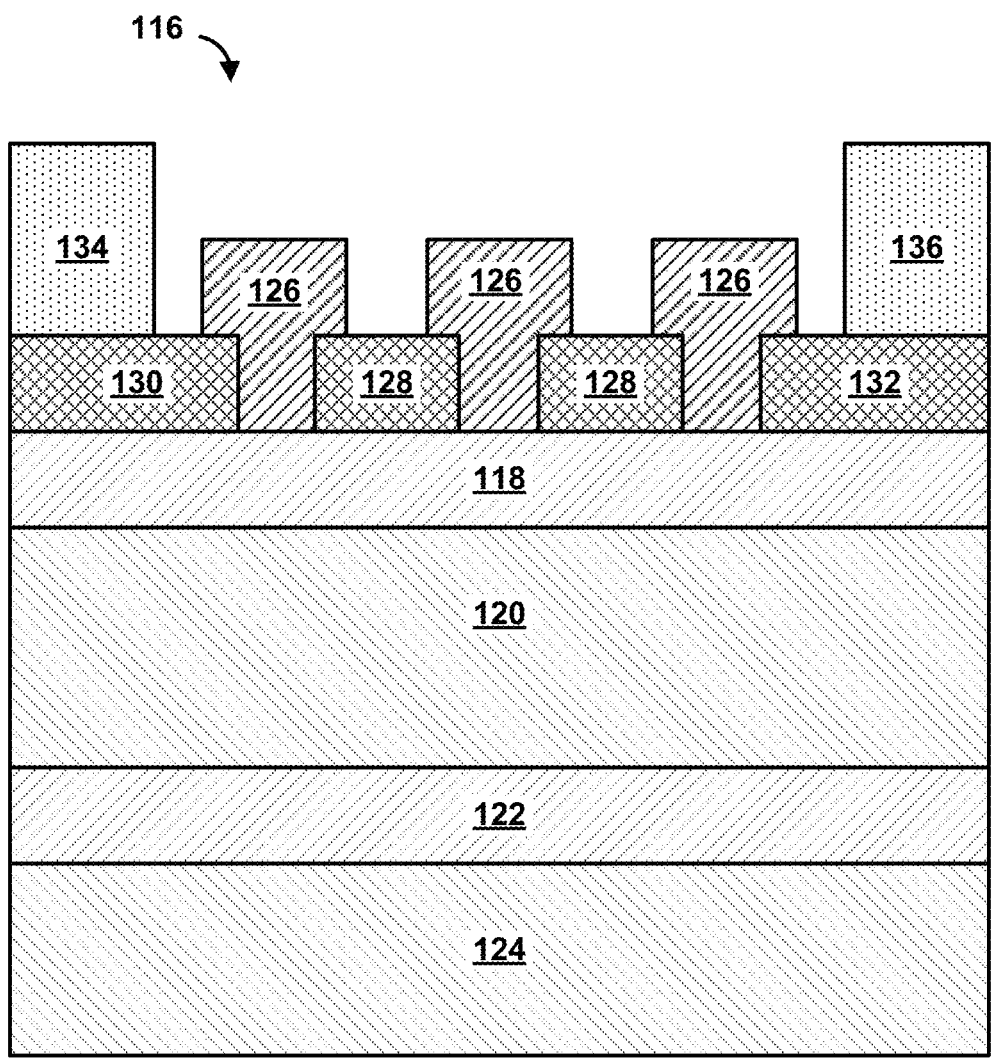
FIG. 1B shows a diagram of an example structure for transferring quantum state information.

FIG. 1B shows a diagram of an example structure 116 (e.g., or device), such as a quantum structure. The quantum structure may be configured to store quantum state information. The first structure 102 and/or the second structure 104 of FIG. 1A may be implemented as the example structure 116.

The structure 116 may comprise one or more semiconducting layers, such as first semiconducting layer 118, a second semiconducting layer 120, a third semiconducting layer 122, a fourth semiconducting layer 124, or a combination thereof. The one or more semiconducting layers may comprise one or more of silicon, germanium, or silicon germanium. The one or more semiconducting layers may comprise an isotopically enriched material. The isotopically enriched material may comprise isotopically enriched silicon. The isotopically enriched silicon may comprise nuclear spin zero silicon 28 isotope. The first semiconducting layer 118 and the third semiconducting layer 122 may comprise the same material, such as silicon or isotopically enriched silicon. The second semiconducting layer 120 and the fourth semiconducting layer 124 may comprise the same material, such as a silicon germanium.

The structure 116 may comprise one or more conducting layers. The one or more conducting layers may comprise a first conducting layer comprising one or more barrier gates 126. The one or more barrier gates 126 may be configured to define at least two quantum states. The one or more barrier gates may be configured to define one or more quantum potential wells, such as a double quantum dot (e.g., gate defined double quantum dot), triple quantum dot, and/or the like.

The one or more conducting layers may comprise a second conducting layer. The second conducting layer may comprise one or more plunger gates 128 configured to cause an electron to move between the at least two quantum states. The electron may be caused to move from one quantum state to another quantum state based on applying a positive voltage to one of the one or more plunger gates 128 and/or apply a negative voltage to another of the one or more plunger gates 128. The second conducting layer may comprise a source 130 and a drain 132. The source 130 and/or the drain 132 may be configured to provide the electron for isolation in the at least two quantum states.

The structure 116 may be coupled (e.g., electrically coupled) to a resonator, such as the resonator 106 of FIG. 1A. The one or more conducting layers comprises a layer electrically coupled to the resonator. The layer coupled to the resonator may comprise the second conducting layer. A plunger gate of the one or more plunger gates 128 may be coupled to the resonator. The plunger gate may be coupled to a pin (e.g., center pin, wire, center wire) of the resonator.

The layer electrically coupled to the resonator may comprise a third conducting layer. The third conducting layer may comprise split-gate layer (e.g., as shown in FIG. 22B). The third conducting layer (e.g., split gate layer) may comprise a first gate and a second gate separated from the first gate by a gap. One of more of the first gate or the second gate may be coupled to the resonator. One of more of the first gate or the second gate may be coupled to the resonator via a pin (e.g., center pin, wire, center wire) of the resonator. One or more of a size or a location of the gap may increase (e.g., maximize, optimize) and/or may be selected to increase an electric field in a region of the at least two first quantum states. One or more of a size or a location of the gap may increase (e.g., maximize, optimizes) and/or may be elected to increase coherent coupling between one or more of the at least two first quantum states and the photon. The gap may be below or above one or more of the one or more plunger gates or the one or more barrier gates.

The structure 116 may comprise at least magnetic field source, such as a first magnetic field source 134 and a second magnetic field source 136. The at least magnetic field source may comprise one or more magnetic and/or one or more current carrying wires. An example magnetic material may comprise cobalt, iron, nickel, alloys thereof, a multiferroic material, or a combination thereof. Any other magnetic material may be used. The at least magnetic field source may provide an inhomogeneous magnetic field (e.g., a magnetic field gradient), and/or the like.

The system 100 of FIG. 1A and the structure 116 of FIG. 1B may be manufactured using a variety of techniques described further herein. In some implementations, the one or more conducting layers (e.g., or gates thereof, such as the one or more barrier gates 126, the one or more plunger gates 128) may be shorted together (e.g., temporarily) during fabrication. The one or more conducting layers may be shorted together using shorting straps. In a later stage of fabrication (e.g., or after completion of fabrication), the shorting straps and/or shorting may be removed and/or otherwise separated prevent later shorting between the one or more conducting layers.

Further description and examples of the disclosed techniques are described in detail below in the following sections. It should be understood that any of the features of one section may be combined with any of the features of another section as an implementation of the disclosure.

First Section: A Coherent Spin-Photon Interface in Silicon

A strong coupling between a single spin in silicon and a single microwave-frequency photon is disclosed herein, with spin-photon coupling rates of more than 10 megahertz. The mechanism that enables the coherent spin-photon interactions may be based on spin-charge hybridization in the presence of a magnetic-field gradient. In addition to spin-photon coupling, coherent control and dispersive readout of a single spin is demonstrated. These results open up a direct path to entangling single spins using microwave-frequency photons.

Solid-state electron spins and nuclear spins are quantum mechanical systems that can be almost completely isolated from environmental noise. As a result, they have coherence times as long as hours and so are one of the most promising types of quantum bit (qubit) for constructing a quantum processor. On the other hand, this degree of isolation poses difficulties for the spin-spin interactions that are needed to implement two-qubit gates. So far, most approaches have focused on achieving spin-spin coupling through the exchange interaction or the much weaker dipole-dipole interaction. Among existing classes of spin qubits, electron spins in gate-defined silicon quantum dots have the advantages of scalability due to mature fabrication technologies and low dephasing rates due to isotopic purification. Currently, silicon quantum dots are capable of supporting fault-tolerant control fidelities for single-qubit gates and high-fidelity two-qubit gates based on exchange. Coupling of spins over long distances has been pursued through the physical displacement of electrons and through 'super-exchange' via an intermediate quantum dot. The recent demonstration of strong coupling between the charge state of a quantum-dot electron and a single photon has raised the prospect of strong spin-photon coupling, which could enable photon-mediated long-distance spin entanglement. Spin-photon coupling may be achieved by coherently hybridizing spin qubits with photons trapped inside microwave cavities, in a manner similar to cavity quantum electrodynamics with atomic systems and circuit quantum electrodynamics with solid-state qubits. Such an approach, however, is extremely challenging: the small magnetic moment of a single spin leads to magnetic-dipole coupling rates of 10-150 Hz, which are far too slow compared with electron-spin dephasing rates to enable a coherent spin-photon interface.

Here, this outstanding challenge is resolved by using spin-charge hybridization techniques disclosed herein to couple the electric field of a single photon to a single spin in silicon. Spin-photon coupling rates $g_s/(2\pi)$ of up to 11 MHz were measured, nearly five orders of magnitude higher than typical magnetic-dipole coupling rates. These values of $g_s/(2\pi)$ exceed both the photon decay rate $\kappa/(2\pi)$ and the spin decoherence rate $\gamma_s/(2\pi)$, firmly anchoring our spin-photon system in the strong-coupling regime.

The disclosed coupling scheme may comprise (e.g., or consist of) two stages of quantum-state hybridization. First, a single electron may be trapped within a gate-defined silicon double quantum dot (DQD) that has a large electric-dipole moment. A single photon confined within a microwave cavity may hybridize with the electron charge state through the electric-dipole interaction. Second, a micrometre-scale magnet (micromagnet) placed over (e.g., over in a material stack, or adjacent) the DQD may hybridize electron charge and spin by producing an inhomogeneous magnetic field. The combination of the electric-dipole interaction and spin-charge hybridization may give rise to a large effective spin-photon coupling rate. At the same time, the relatively low level of charge noise in the device may ensure that the effective spin decoherence rate γs remains below the coherent coupling rate gs—a criterion that has hampered previous efforts to achieve strong spin-photon coupling.

As well as demonstrating a coherent spin-photon interface, the disclosed device architecture may be configured single-spin control and readout. Single-spin rotations may be electrically driven. The resulting spin state may be detected through a dispersive phase shift in the cavity transmission, which reveals Rabi oscillations.

Figure 2A:
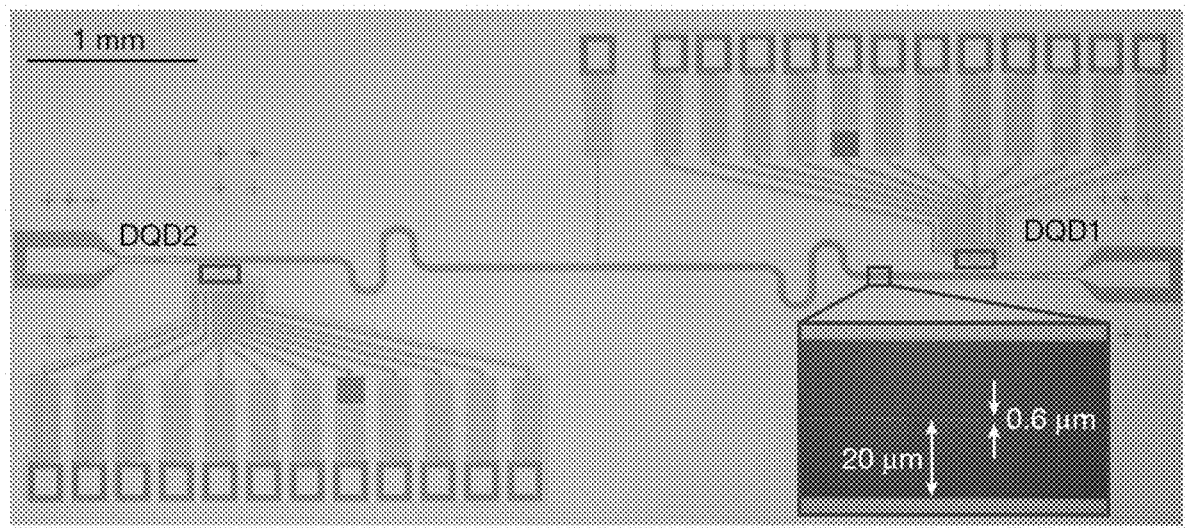
FIG. 2A shows an optical image of the superconducting microwave cavity.
Figure 2B:
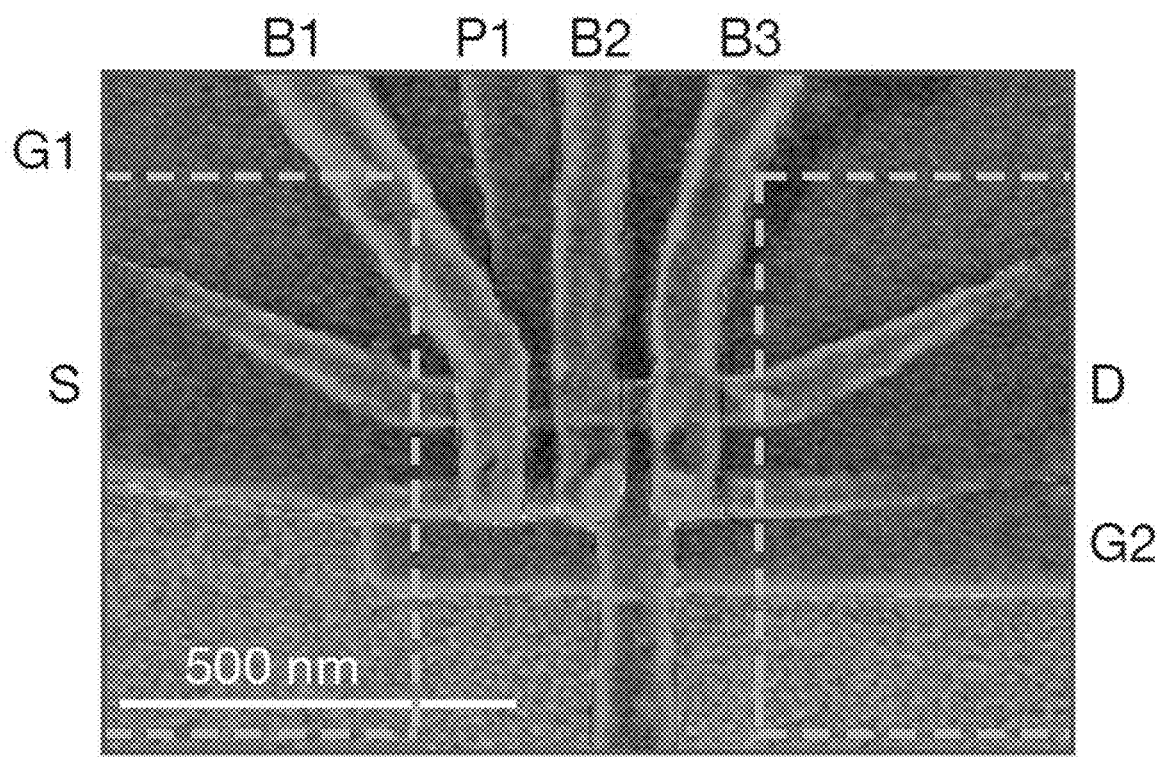
FIG. 2B shows a false-colour scanning electron micrograph (SEM) of a DQD.
Figure 2C:
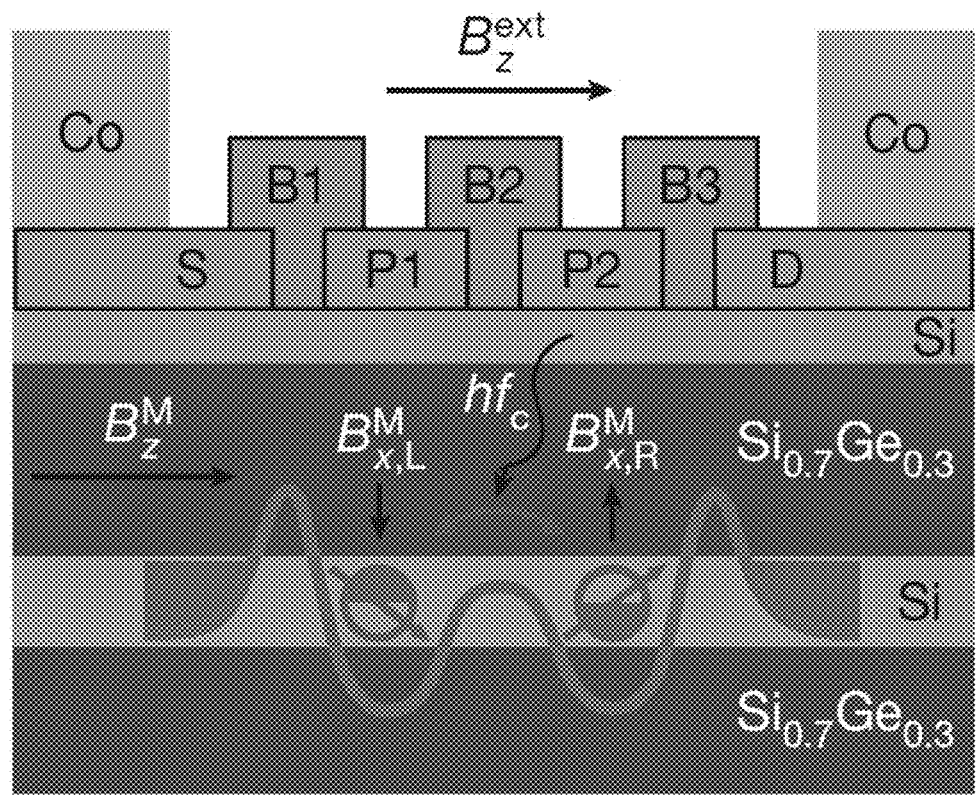
FIG. 2C shows a schematic cross-sectional view of the DQD device.
Figure 6:
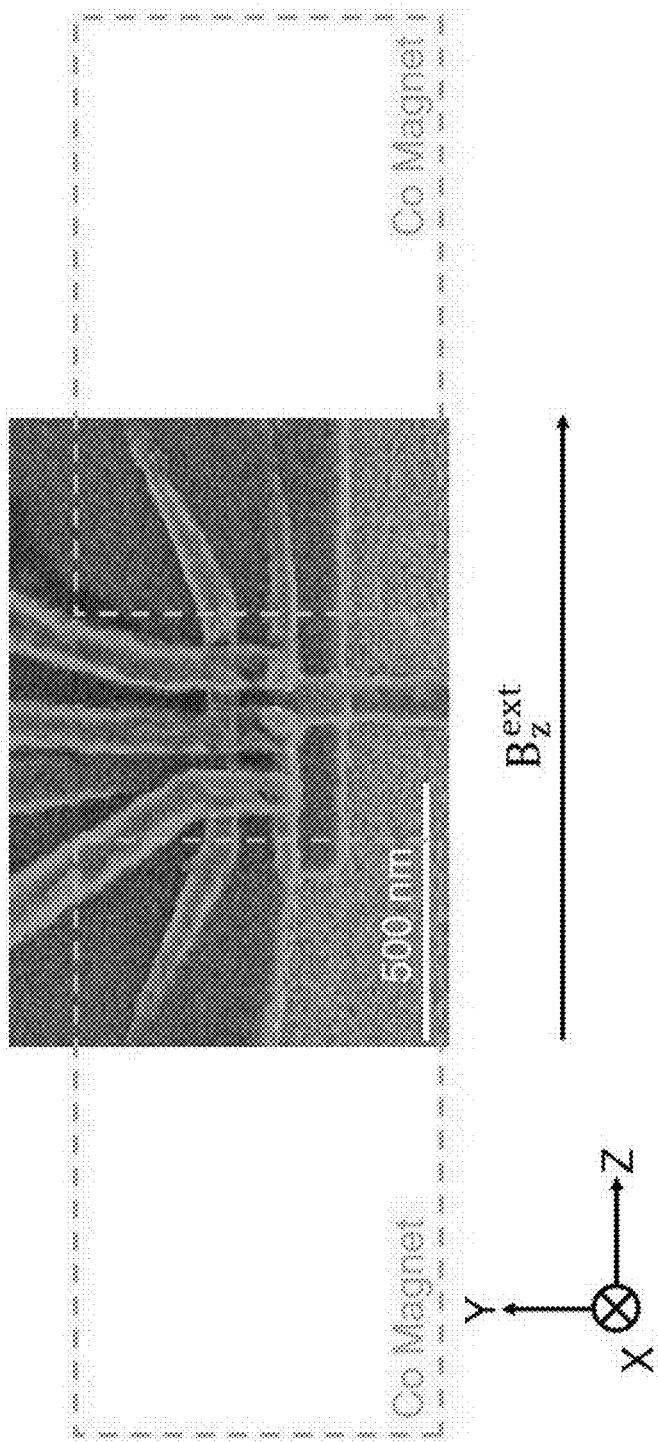
FIG. 6 shows micromagnet design.

Spin-photon interface. An example device according to the present disclosure that enables strong spin-photon coupling is shown in FIG. 2A. The device may comprise two gate-defined DQDs fabricated using an overlapping aluminium gate stack, as shown in FIG. 2B. The gates may be electrically biased to create a double-well potential that confines a single electron in the underlying natural-silicon quantum well, as illustrated in FIG. 2C. A plunger gate (P2) on each DQD may be connected to a centre pin of a half-wavelength niobium superconducting cavity with a centre frequency of $f_c$=5.846 GHz and quality factor of $Q_c$=4,700 ($\kappa/(2\pi)=f_c/Q_c$=1.3 MHz), which may hybridize the electron charge state with a single cavity photon through the electric-dipole interaction. Because the spin-photon coupling rate $g_s$ is directly proportional to the charge-photon coupling rate $g_c$ (refs 25, 31-34, 39-41), the cavity dimensions (FIG. 2A, inset) have been modified to achieve a high characteristic impedance Zr and therefore a high $g_c$($g_c \propto \sqrt{Z_r}$). To hybridize the charge state of the trapped electron with its spin state, a cobalt micromagnet may be fabricated near (e.g., adjacent, in the same material stack) the DQD, which may generate an inhomogeneous magnetic field. For our device geometry, the magnetic field due to the cobalt micromagnet has a component along the z axis $B_z^M$ that is approximately constant for the DQD and a component along the x axis that takes on an average value of $B_{x,L}^M$ ($B_{x,R}^M$) for the left (right) dot (e.g., as shown in FIG. 2C and FIG. 6). The relatively large field difference $B_{x,R}^M - B_{x,L}^M = 2B_x^M$ leads to spin-charge hybridization, which, when combined with charge-photon coupling, gives rise to spin-photon coupling.

Figure 2D:
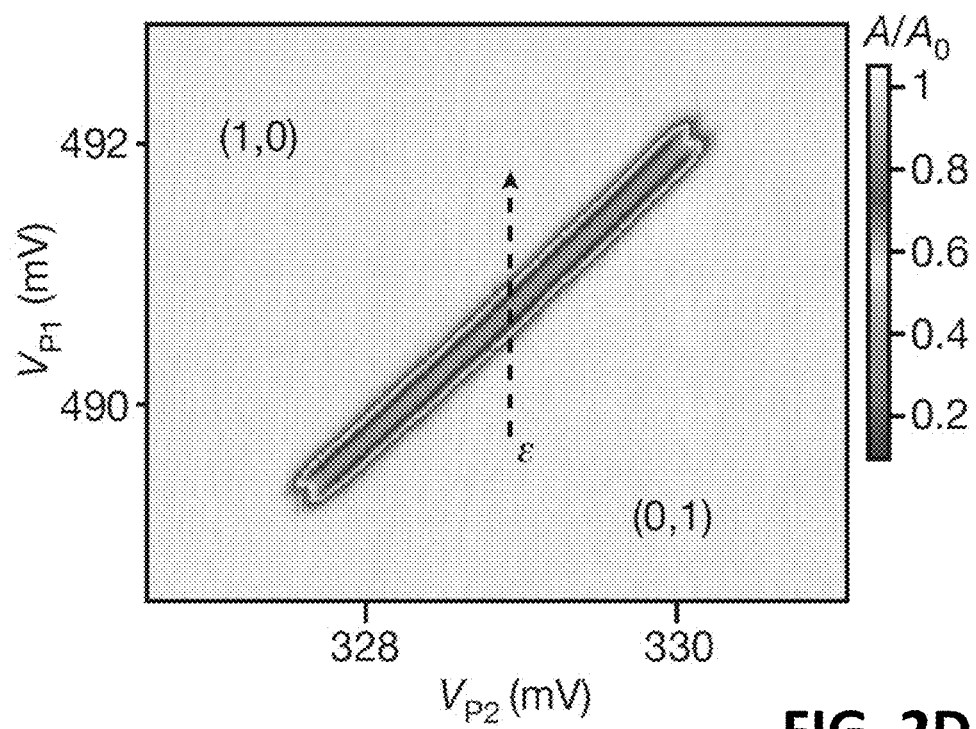
FIG. 2D shows cavity transmission amplitude $A/A_0$ at $f=f_c$.
Figure 2E:
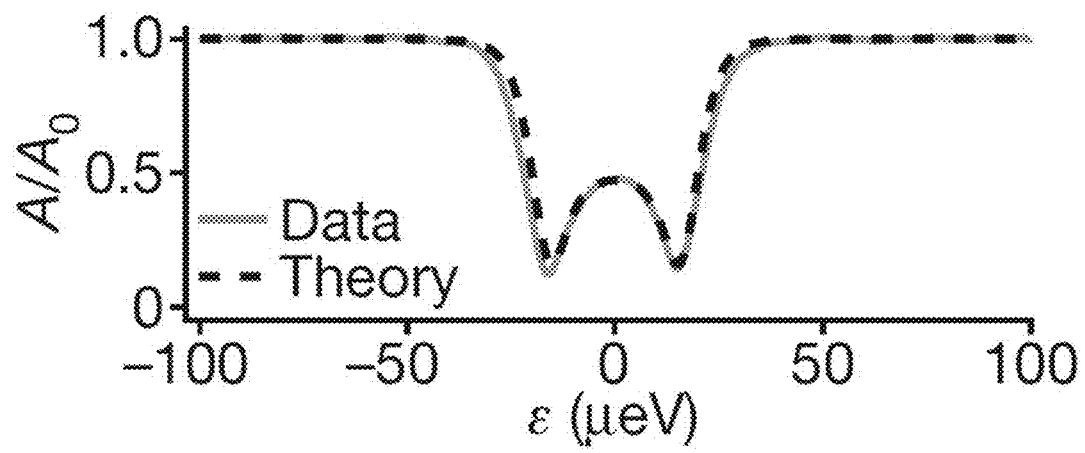
FIG. 2E shows $A/A_0$ as a function of $\varepsilon$ with $V_{B2}=710$ mV and a fit to cavity input-output theory (black dashed line), with $g_c/(2\pi)=40$ MHz.
Figure 2F:
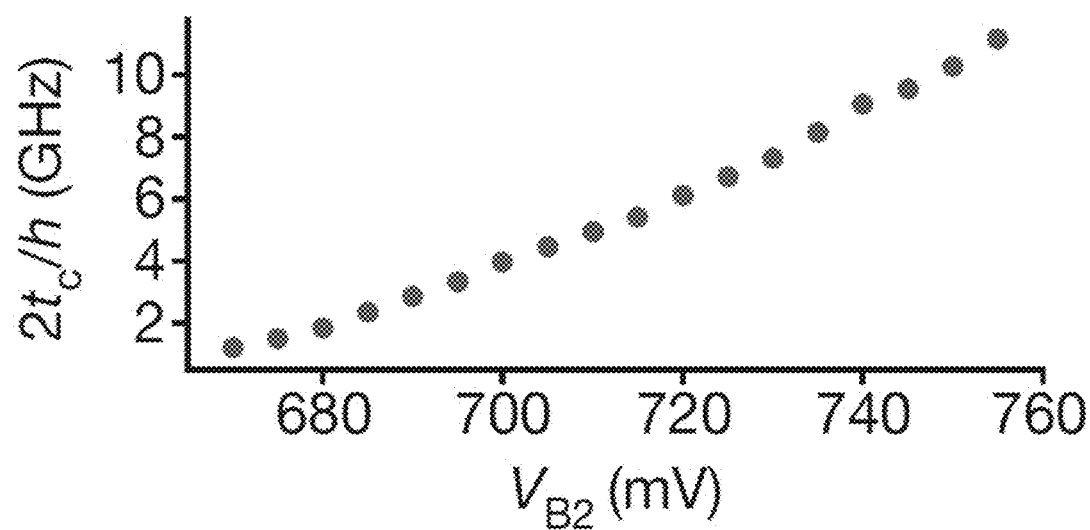
FIG. 2F shows $2t_c/h$ as a function of $V_{B2}$ for DQD1, obtained by measuring $A(\varepsilon)/A_0$ at different values of $V_{B2}$.

The strength of the charge-photon interaction may be characterized first, because this sets the scale of the spin-photon interaction rate. For simplicity, only one DQD is active at a time for all of the measurements presented here. The cavity is driven by a coherent microwave tone at frequency $f=f_r$ and power P≈−133 dBm (corresponding to approximately 0.6 photons in the cavity, determined on the basis of AC Stark shift measurements of the spin-qubit frequency in the dispersive regime; see e.g., FIG. 7). The normalized cavity transmission amplitude $A/A_0$ is displayed in FIG. 2D as a function of the voltages $V_{P1}$ and $V_{P2}$ on gates P1 and P2 of the first DQD (DQD1), which reveals the location of the (1, 0)↔(0, 1) inter-dot charge transition (e.g., FIGS. 8A-D show overall stability diagrams). Here (n, m) denotes a charge state, with the number of electrons in the left (P1) and right (P2) dot being n and m, respectively. The charge-photon coupling rate is estimated quantitatively by measuring $A/A_0$ as a function of the DQD level detuning ε (FIG. 2E). By fitting the data with the cavity input-output theory model using $\kappa/(2\pi)$=1.3 MHz, $g_c/(2\pi)$=40 MHz and $2t_c/h$=4.9 GHz are determined, where $t_c$ is the inter-dot tunnel coupling and h is the Planck constant. A charge decoherence rate of $\gamma_c/(2\pi)$=35 MHz is also estimated from the fit and confirmed independently using microwave spectroscopy with $2t_c/h$=5.4 GHz (refs 19, 20, 42). Fine control of the DQD tunnel coupling, which is important for achieving spin-charge hybridization, is shown in FIG. 2F, in which $2t_c/h$ is plotted as a function of the voltage $V_{B2}$ on the inter-dot barrier gate B2. A similar characterization of the second DQD (DQD2) yields $g_c/(2\pi)$=37 MHz and $\gamma_c/(2\pi)$=45 MHz at the (1, 0)↔(0, 1) inter-dot charge transition. Owing to the higher impedance of the resonator, the values of $g_c$ measured here are much larger than in previous silicon DQD devices, which is helpful for achieving strong spin-photon coupling. In general, there are device-to-device variations in $\gamma_c$ (refs 19, 43). It is unlikely the slightly higher charge decoherence rate is a result of our cavity design, because the Purcell decay rate is estimated to be $\Gamma_c/(2\pi) \approx 0.02$ MHz$\ll \gamma_c/(2\pi)$. Excited valley states are not visible in the cavity response of either DQD, suggesting that they have negligible population. Therefore valleys are excluded from the analysis below.

Figure 3A:
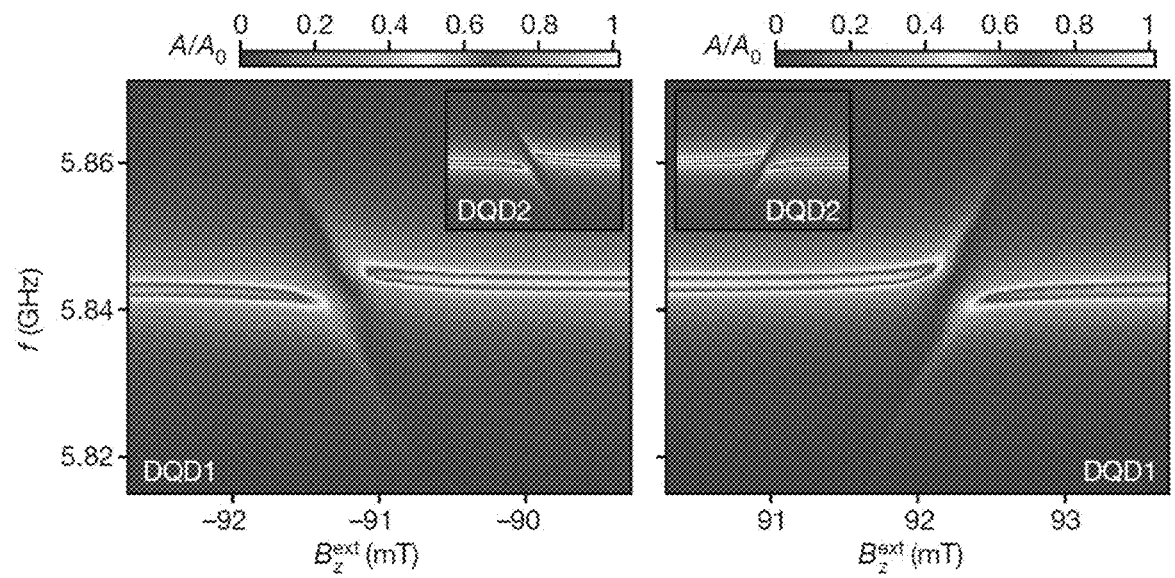
FIG. 3A shows $A/A_0$ as a function of the cavity drive frequency f and an externally applied magnetic field $B_z^{ext}$ for DQD1.

Strong single spin-photon coupling. Strong coupling is demonstrated between a single electron spin and a single photon, as evidenced by the observation of vacuum Rabi splitting. Vacuum Rabi splitting occurs when the transition frequency of a two-level atom $f_a$ is brought into resonance with a cavity photon of frequency $f_c$ (refs 21, 23). Light-matter hybridization leads to two vacuum-Rabi-split peaks in the cavity transmission. For our single-spin qubit, the transition frequency between two Zeeman-split spin states is $f_a \approx E_z/h$, where $E_z=g\mu_B B_{tot}$ is the Zeeman energy and the approximate sign is due to spin-charge hybridization, which shifts the qubit frequency slightly. Here g is the g-factor of the electron, $\mu_B$ is the Bohr magneton and $B_{tot}=\sqrt{[(B_{x,L}^M+B_{x,R}^M)/2]^2+(B_z^M+B_z^{ext})^2}$ is the total magnetic field. To bring $f_a$ into resonance with $f_c$, the external magnetic field $B_z^{ext}$ is varied along the z axis while measuring the cavity transmission spectrum $A/A_0$ as a function of the drive frequency f (FIG. 3A). Vacuum Rabi splittings are clearly observed at $B_z^{ext}$=−91.2 mT and $B_z^{ext}$=92.2 mT, indicating that $E_z/h=f_c$ at these field values and that the single spin is coherently hybridized with a single cavity photon. These measurements are performed on DQD1, with $2t_c/h$=7.4 GHz and ε=0. The dependence of $g_s$ on ε and $t_c$ is investigated below. Assuming g=2 for silicon, it is estimated that an intrinsic field of about 120 mT is added by the micromagnet, comparable to values found in a previous experiment using a similar cobalt micromagnet design.

Figure 3B:
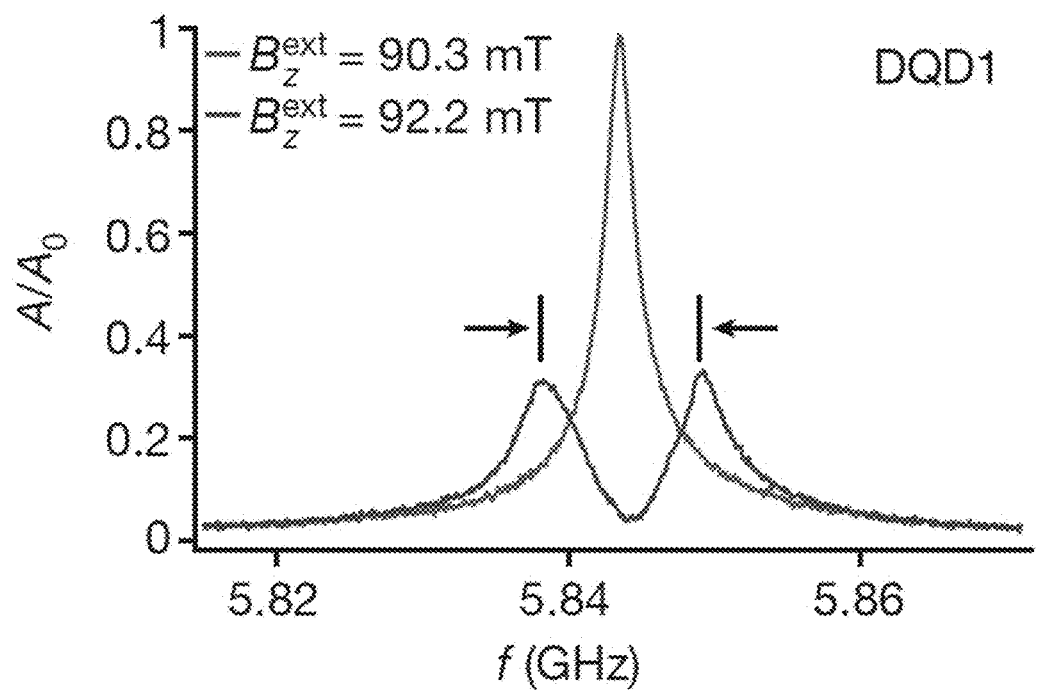
FIG. 3B shows $A/A_0$ as a function of $f$ for DQD1 at $B_z^{ext}=90.3$ mT and $B_z^{ext}=92.2$ mT.

To further verify the strong spin-photon coupling, cavity transmission spectrum at $B_z^{ext}$=92.2 mT is plotted, as shown in FIG. 3B. The two normal-mode peaks are separated by the vacuum Rabi frequency $2g_s/(2\pi)$=11.0 MHz, giving an effective spin-photon coupling rate of $g_s/(2\pi)$=5.5 MHz. The photon decay rate at finite magnetic field is extracted from the line width of $A/A_0$ at $B_z^{ext}$=90.3 mT, at which $E_z/h$ is largely detuned from $f_c$, yielding $\kappa/(2\pi)$=1.8 MHz. A spin decoherence rate of $\gamma s/(2\pi)$=2.4 MHz, with contributions from both charge decoherence and magnetic noise from the Si nuclei, is extracted from microwave spectroscopy in the dispersive regime with $2t_c/h$=7.4 GHz and ε=0 (FIGS. 9A-D), confirming that the strong-coupling regime $g_s > \gamma_s$, κ has been reached. The spin-photon coupling rate obtained here is more than four orders of magnitude larger than rates currently achievable using direct magnetic-dipole coupling to lumped-element superconducting resonators.

Figure 3C:
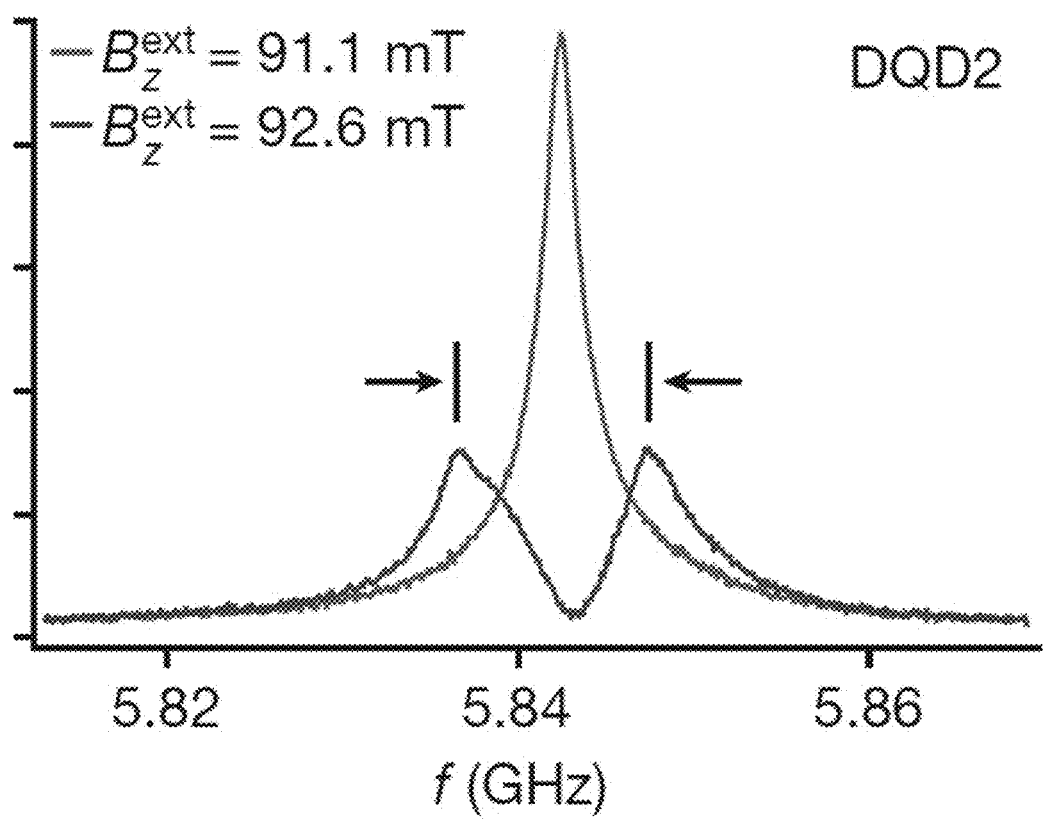
FIG. 3C shows $A/A_0$ as a function of $f$ for DQD2 at $B_z^{ext}=91.1$ mT and $B_z^{ext}=92.6$ mT.

The local magnetic field that is generated using cobalt micromagnets is very reproducible, as evidenced by examining the other DQD in the cavity. Measurements on DQD2 show vacuum Rabi splittings at $B_z^{ext}$=±92.6 mT (FIG. 3A, insets). The spin-photon coupling rate and spin decoherence rate are determined to be $g_s/(2\pi)$=5.3 MHz and $\gamma s/(2\pi)$=2.4 MHz, respectively as shown in FIG. 3C. These results are highly consistent with DQD1, and so henceforth this discussion will focus on DQD1.

Electrical control of spin-photon coupling. For quantum information applications it is desirable to turn qubit-cavity coupling rapidly on for quantum-state transfer and rapidly off for qubit-state preparation. Rapid control of the coupling rate is often accomplished by quickly modifying the qubit-cavity detuning $f_a$-$f_c$. Practically, such tuning can be achieved by varying the qubit transition frequency $f_a$ with voltage or flux pulses or by using a tunable cavity. These approaches are not directly applicable for control of the spin-photon coupling rate because $f_a$ depends primarily on magnetic fields that are difficult to vary on nanosecond timescales. In this section, it is shown that control of the spin-photon coupling rate can be achieved electrically by tuning ε and $t_c$ (refs 32, 40).

Figure 4A:
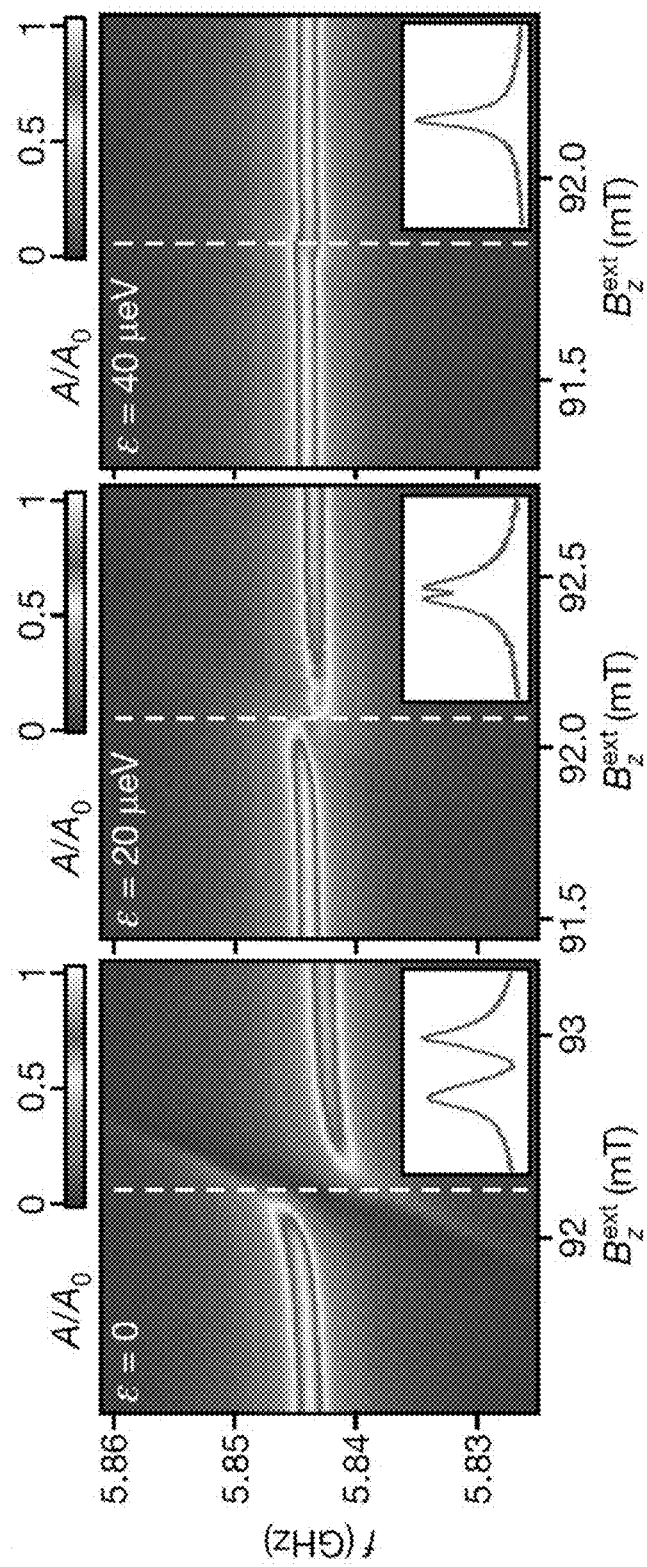
FIG. 4A shows $A/A_0$ as a function of $f$ and $B_z^{ext}$ at $\varepsilon=0$ (left), $\varepsilon=20$ µeV (about 4.8 GHz; middle) and $\varepsilon=40$ µeV (about 9.7 GHz; right), with $2t_c/h=7.4$ GHz.
Figure 4B:
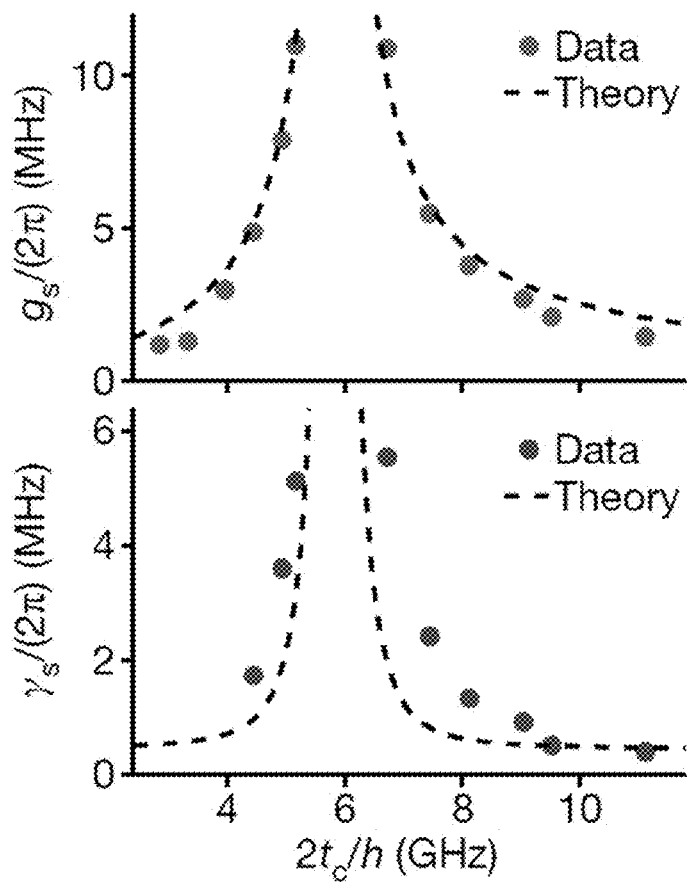
FIG. 4B shows spin-photon coupling rate $g_s/(2\pi)$ (top) and spin decoherence rate $\gamma_s/(2\pi)$ (bottom) as functions of $2t_c/h$, with $\varepsilon=0$ (data).
Figure 4C:
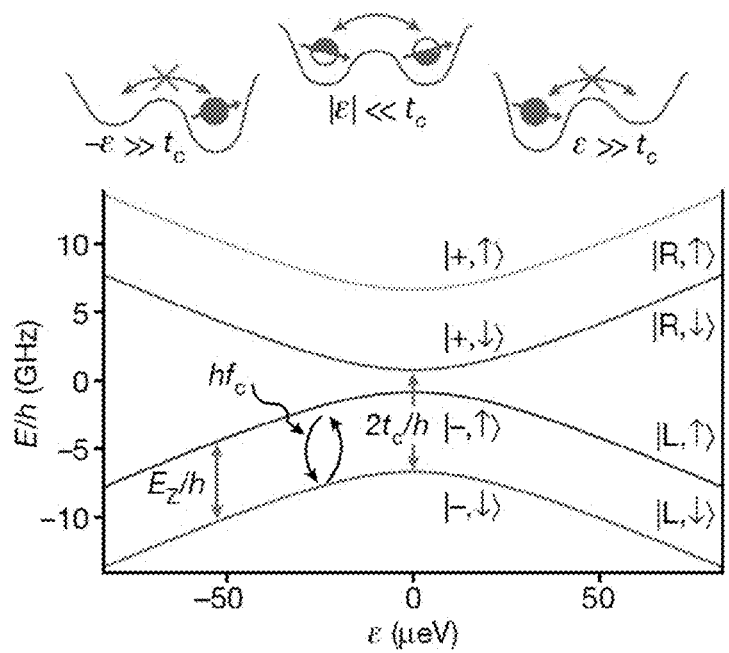
FIG. 4C shows DQD energy levels as a function of $\varepsilon$.

First the ε dependence of gs is investigated. In FIG. 4A measurements are shown of $A/A_0$ as a function of $B_z^{ext}$ and f for ε=0, ε=20 μeV and ε=40 μeV. At ε=20 μeV (about 4.8 GHz), vacuum Rabi splitting is observed at $B_z^{ext}$=92.1 mT with a spin-photon coupling rate of $g_s/(2\pi)$=1.0 MHz that is substantially lower than the value of $g_s/(2\pi)$=5.5 MHz obtained at ε=0. At ε=40 μeV (about 9.7 GHz), only a small dispersive shift is observed in the cavity transmission spectrum at $B_z^{ext}$=91.8 mT, suggesting a further decrease in gs. These observations are qualitatively understood by considering that at ε=0 the electron is delocalized across the DQD and forms molecular bonding (|−⟩) or anti-bonding (|+⟩) charge states (FIG. 4C). In this regime, the cavity electric field leads to a displacement of the electron wavefunction of the order of 1 nm (Methods). Consequently, the electron spin experiences a large oscillating magnetic field, resulting in a substantial spin-photon coupling rate. By contrast, with |ε|»$t_c$ the electron is localized within one dot and it is natural to work with a basis of localized electronic wavefunctions |L⟩ and |R⟩, where L and R correspond to the electron being in the left and right dot, respectively (e.g., as shown in FIG. 4C). In this effectively single-dot regime, the displacement of the electron wavefunction by the cavity electric field is estimated to be about 3 pm for a single-dot orbital energy of $E_{orb}$=2.5 meV, greatly suppressing the spin-photon coupling mechanism. The large difference in the effective displacement lengths between the single-dot and double-dot regimes also implies an improvement in the spin-photon coupling rate at ϵ=0 of approximately two orders of magnitude compared to |ε|»$t_c$. Alternatively, the reduction of $g_s$ may be interpreted as a result of suppressed hybridization between the |−, ↑⟩ and |+, ↓⟩ states due to their growing energy difference at larger |ε|, as evident from FIG. 4C (see discussion below). Here ↑ (↓) denotes an electron spin that is aligned (anti-aligned) with $B_z^{ext}$. These measurements highlight the important role of charge hybridization in the DQD.

Additional electric control of $g_s$ is enabled by voltage tuning $t_c$ (e.g., see FIG. 2F). FIG. 4B shows $g_s/(2\pi)$ and $\gamma_s/(2\pi)$ as functions of $2t_c/h$ at ε=0, as extracted from vacuum Rabi splitting measurements and microwave spectroscopy of the electron spin resonance (ESR) transition line width (e.g., see FIGS. 3B, 5B, 9A-C, 10A-B). Both rates increase rapidly as $2t_c/h$ approaches the Larmor precession frequency $E_z/h$≈5.8 GHz, and a spin-photon coupling rate as high as $g_s/(2\pi)$=11.0 MHz is found at $2t_c/h$=5.2 GHz. These trends are consistent with the DQD energy-level spectrum shown in FIG. 4C. With $2t_c/h$»$E_z/h$ and ε=0, the two lowest energy levels are |−, ↓⟩ and |−, ↑⟩ and the electric-dipole coupling to the cavity field is small. As $2t_c$ is reduced and made comparable to $E_z$, the ground state remains |−, ↓⟩ but the excited state becomes an admixture of |−, ↑⟩ and |+, ↓⟩ owing to the magnetic-field gradient $B_{x,R}^M$−$B_{x,L}^M$=$2B_x^M$ and the small energy difference between the states. The quantum transition that is close to resonance with $E_z$ is now partially composed of a change in charge state from − to +, which responds strongly to the cavity electric field and gives rise to larger values of $g_s$. For $2t_c/h$<$E_z/h$, a decrease in $t_c$ increases the energy difference between |−, ↑⟩ and |+, ↓⟩, which reduces their hybridization and results in a smaller $g_s$. It should be noted that hybridization with charge states increases the susceptibility of the spin to charge noise and relaxation, resulting in an effective spin decoherence rate $\gamma_s$ that is also strongly dependent on $t_c$ (e.g., see FIG. 4B). Theoretical predictions of $g_s$ and $\gamma_s$ as functions of $2t_c/h$, based on measured values of $g_c$ and $\gamma_c$ (e.g., see FIG. 2E) are in good agreement with the data (e.g., see FIG. 4B). The discrepancy in the fit of $\gamma_s$ is discussed in Methods. The electric control of spin-photon coupling demonstrated here allows the spin qubit to switch quickly between regimes with strong coupling to the cavity and idle regimes in which the spin-photon coupling rate and susceptibility to charge decoherence are small.

Dispersive readout of a single spin. The preceding measurements demonstrate the ability to couple a single electron spin to a single photon coherently, potentially enabling long range spin-spin couplings. For the device to serve as a building block for a quantum processor, it may also be necessary to prepare, control and read out the spin state of the trapped electron deterministically. First spin transitions are induced by driving gate P1 with a continuous microwave tone of frequency $f_s$ and power $P_s$=−106 dBm. When $f_s$≈$E_z/h$, the excited-state population of the spin qubit $P_\uparrow$ increases and the ground state-population $P_\downarrow$ decreases. In the dispersive regime, in which the qubit-cavity detuning $\Delta/(2\pi)$≈$E_z/h$−$f_c$ satisfies $\Delta/(2\pi)$»$g_s/(2\pi)$, the cavity transmission experiences a phase response $\Delta\phi$≈ $\tan^{-1}[2g_s^2/(\kappa\Delta)]$ for a fully saturated ($P_\uparrow$=0.5) qubit. It is therefore possible to measure the spin state of a single electron by probing the cavity transmission. As a demonstration, the ESR transition is spectroscopically probed by measuring $\Delta\phi$ as a function of $f_s$ and $B_z^{ext}$ (e.g., see FIG. 5A). These data are acquired with $2t_c/h$=9.5 GHz and ε=0. The ESR transition is clearly visible as a narrow feature with $\Delta\phi$≠0 that shifts to higher $f_s$ with increasing $B_z^{ext}$. $\Delta\phi$ also changes sign as $B_z^{ext}$ increases, consistent with the sign change of the qubit-cavity detuning Δ when the Larmor precession frequency $E_z/h$ exceeds $f_c$. The nonlinear response in the small region around $B_z^{ext}$=92 mT is due to the breakdown of the dispersive condition |$\Delta/(2\pi)$|»$g_s/(2\pi)$.

Figure 5A:
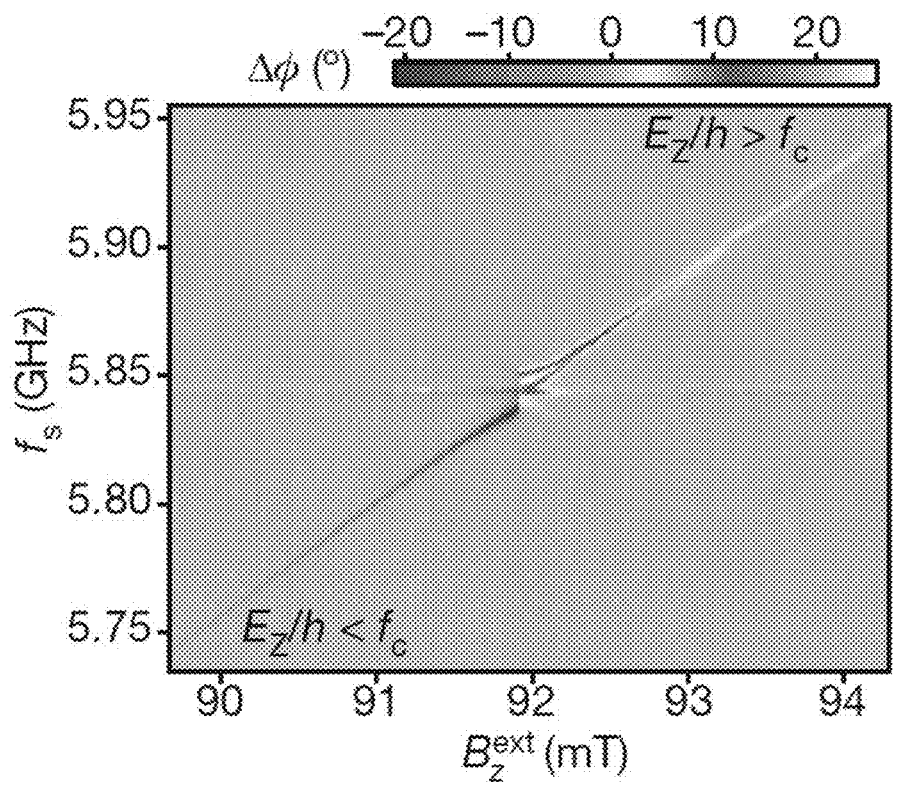
FIG. 5A shows cavity phase response $\Delta\phi$ at $f=f_c$.

Cohereing single-spin control and dispersive spin-state readout is demonstrated. For these measurements, ε=0 and $2t_c/h$=11.1 GHz were chosen to minimize the spin decoherence rate $\gamma_s$ (e.g., FIG. 4B). Here the spin-photon coupling rate $g_s/(2\pi)$=1.4 MHz (e.g., FIG. 4B). The external field is fixed at $B_z^{ext}$=92.18 mT, which ensures that the system is in the dispersive regime with $\Delta/(2\pi)$=14 MHz»$g_s/(2\pi)$. A measurement of $\Delta\phi(f_s)$ in the low-power limit (e.g., FIG. 5B) yields a Lorentzian line shape with a full-width at half-maximum of 0.81 MHz, which corresponds to a low spin decoherence rate of $\gamma_s/(2\pi)$=0.41 MHz (refs 19, 42). Qubit control and measurement are achieved using the pulse sequence illustrated in FIG. 5C. Starting with a spin-down state|↓⟩ at ε=0, the DQD is pulsed to a large detuning ε'=70 μeV (about 17 GHz), which decouples the spin from the cavity. A microwave burst with frequency $f_s$=5.874 GHz, power $P_s$=−76 dBm and duration $\tau_B$ is subsequently applied to P1 to drive a spin rotation. The DQD is then pulsed adiabatically back to ε=0 for a fixed measurement time $T_M$ for dispersive readout. To reinitialize the qubit, $T_M$=20 μs»$T_1$(ε=0) is chosen, where $T_1$(ε=0)=3.2 μe is the spin relaxation time measured at ε=0 (e.g., FIG. 11). FIG. 5D displays the time-averaged $\Delta\phi$ as a function of $\tau_R$, obtained with an integration time of 100 ms for each data point.

Coherent single-spin Rabioscillations were observed with a Rabi frequency of $f_R=6$ MHz. In contrast to readout approaches that rely on spin-dependent tunneling, the disclosed dispersive cavity-based readout corresponds in principle to quantum nondemolition readout. The readout scheme is also distinct from previous work that used a cavity-coupled InAs DQD, which detects the spin state through Pauli blockade rather than spin-photon coupling. In addition to enabling single spin-photon coupling, the disclosed device may be configured for preparing, controlling and dispersively reading out single spins.

A coherent spin-photon interface was realized at which a single spin in a silicon DQD is strongly coupled to a microwave-frequency photon through the combined effects of the electric-dipole interaction and spin-charge hybridization (e.g., see Methods for a discussion of the prospects of applying the spin-photon interface to realize cavity mediated spin-spin coupling). Spin-photon coupling rates of up to 11 MHz are measured in the device, exceeding magnetic-dipole coupling rates by nearly five orders of magnitude. The spin decoherence rate is strongly dependent on the inter-dot tunnel coupling $t_c$ and ranges from 0.4 MHz to 6 MHz, possibly limited by a combination of charge noise, charge relaxation and remnant nuclear field fluctuations. All-electric control of spin-photon coupling and coherent manipulation of the spin state are demonstrated, along with dispersive readout of the single spin, which lays the foundation for quantum non-demolition readout of spin qubits. These results could enable the construction of an ultra-coherent spin quantum computer with photonic interconnects and readout channels, with the capacity for surface codes, 'all-to-all' connectivity and easy integration with other solid-state quantum systems such as superconducting.

Methods:

Device fabrication and measurement. The Si/SiGe heterostructure comprises (e.g., or consists of) a 4-nm-thick Si cap, a 50-nm-thick $Si_{0.7}Ge_{0.3}$ spacer layer, a 8-nm-thick natural-Si quantum well and a 225-nm-thick $Si_{0.7}Ge_{0.3}$ layer on top of a linearly graded $Si_{1-x}Ge_x$ relaxed buffer substrate. Design and fabrication details for the superconducting cavity and DQDs are described elsewhere. The approximately 200-nm-thick Co micromagnet is defined using electron beam lithography and lift off. In contrast to earlier devices, the gate filter for P1 was changed to an $L_1$-C-$L_2$ filter, with $L_1$=4 nH, C=1 pF and $L_2$=12 nH. This three-segment filter allows microwave signals below 2.5 GHz to pass with less than 3 dB of attenuation.

All data are acquired in a dilution refrigerator with a base temperature of 10 mK and electron temperature of $T_e$=60 mK. The measurements of the transmission amplitude and phase response of the cavity (e.g., FIGS. 2A-F, 5A-D) are performed using a homodynedetection scheme. The measurements of the transmission spectra of the cavity (e.g., FIGS. 3A-C, 4A-C) are performed using a network analyser. The microwave drive applied to P1 (e.g., FIGS. 5A-D) is provided by a vector microwave source and the detuning pulses are generated by an arbitrary waveform generator, which also controls the timing of the microwave burst (e.g., FIG. 5D).

To maximize the magnetization of the Co micromagnet and minimize hysteresis, data at positive (negative) external applied magnetic fields (e.g., FIG. 3A) are collected after $B_z^{ext}$ is first ramped to a large value of +300 mT (−300 mT). A small degree of hysteresis still remains for the micromagnet of DQD1, as can be seen by the different magnitudes of $B_z^{ext}$ at which positive- and negative-field vacuum Rabisplittings are observed (e.g., FIG. 3A). In FIG. 5A, the slope of the ESR transition is $d(E_z/h)/dB_z^{ext}$=44 MHz $mT^{-1}$, which is higher than the value (28 MHz $mT^{-1}$) expected for a fully saturated micromagnet. The slope of the transition suggests that the micromagnet is not fully magnetized and has a magnetic susceptibility of $dB_z^M/dB_z^{ext} \approx 0.6$ around $B_z^{ext}$=92 mT.

Estimate of displacement length. The displacement length of the electron wavefunction by the cavity electric field may be estimated by considering the spin-photon coupling strength. For $g_s/(2\pi)$=10 MHz, the effective AC magnetic field $B_{ac}^{ESR}$ that drives ESR is $B_{ac}^{ESR}=[g_s/(2\pi)][h/(g\mu_B)] \approx 0.4$ mT. The field gradient for our DQD is $2B_x^M/l \approx 0.3$ mT $nm^{-1}$, where l=100 nm is the inter-dot distance. Therefore, the effective displacement of the electron wavefunction is estimated to be about 1 nm in the DQD regime. For a single dot, the spin-photon coupling strength is expected to be $g_s/(2\pi) \approx (g\mu_B B_x^M/E_{orb})(g_c/2\pi) \approx 30$ kHz (refs 31, 33) for an orbital energy of $E_{orb}$=2.5 meV. The equivalent AC magnetic field that is induced by the cavity is therefore $B_{ac}^{ESR} \approx 1$ μT, corresponding to a displacement length of only about 3 pm.

Figure 11:
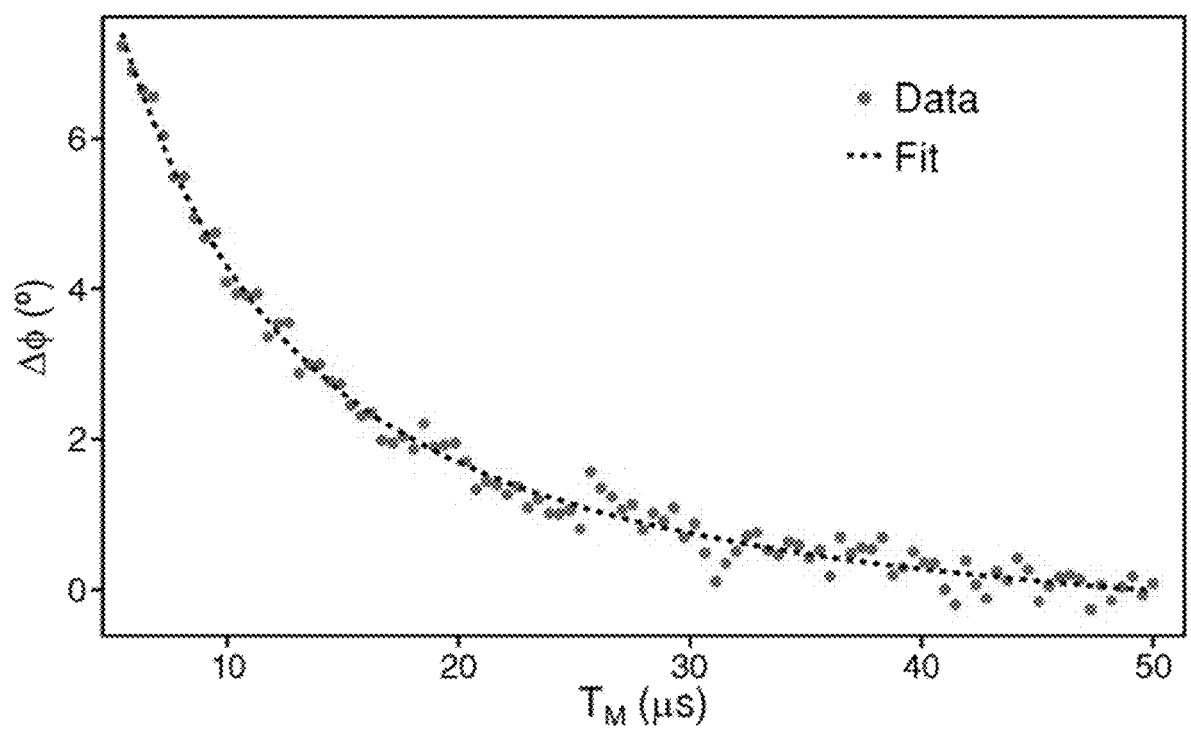
FIG. 11 shows spin relaxation at $\epsilon=0$.

Conversion of cavity phase response to spin population. For the dispersive readout of the Rabi oscillations (e.g., FIG. 5D), the theoretically expected cavity phase response is $\phi_\uparrow = \tan^{-1}[2g_s^2/(\kappa\Delta)]=9.6°$ when the spin qubit is in the excited state, and $\phi_\uparrow = \tan^{-1}[2g_s^2/(\kappa\Delta)]=-9.6°$ when the spin qubit is in the ground state. Because our measurement is averaged over $T_M \gg T_1$, spin relaxation during readout will reduce the phase contrast observed in the experiment. To enable a conversion between the phase response of the cavity $\Delta\phi$ and the excited-state population of the spin qubit $P_\uparrow$, the spin relaxation time $T_1$ is measured by fixing the microwave burst time at $\tau_B$=80 ns, which corresponds to a π pulse on the spin qubit. The phase response of the cavity $\Delta\phi$ is then measured as a function of $T_M$ for $T_M$>5 μs>$T_1$ (FIG. 11). The result is fitted to a function of the form $\Delta\phi=\phi_0+\phi_1(T_1/T_M)[1-\exp(-T_M/T_1)]$ to extract $T_1$=3.4 μs, where $\phi_0$ and $\phi_1$ are additional fitting parameters. The effects of the cavity ringdown time $1/\kappa \approx 90$ ns and the π-pulse time of 80 ns are ignored in the fit, because both of these times are much shorter than the measurement time $T_M$. The phase contrast that results from the fit, $\phi_1 \approx 17.7°$, is close to the maximum contrast expected at this spin-photon detuning, $\phi_\uparrow - v_\downarrow$=19.2°. On the basis of this value of $T_1$, the measured phase response is converted into the excited-state population via $P_\uparrow = (1+\Delta\phi\phi_{\uparrow,r})/2$, where $\phi_{\uparrow,r}=\phi_\uparrow(T_1/T_M)[1-\exp(-T_M/T_1)]=1.5°$ is the reduced phase response due to spin relaxation during the readout time $T_M$=20 μs. The converted spin population $P_\uparrow$ shown in FIG. 5D has a visibility of about 70%, which could be improved by performing single-shot measurements.

Input-output theory for cavity transmission. Here is briefly summarized the theoretical methods used to calculate the cavity transmission $A/A_0$ shown in FIG. 2E and FIG. 12A-B. Starting from the Hamiltonian that describes the DQD $$H_0 = \tfrac{1}{2}(\varepsilon\tau_z + 2t_c\tau_x + B_z\sigma + B_x^M\sigma_x\tau_z)$$

where $\tau_x$ and $\tau_z$ are Pauli operators that act on the orbital charge states of the DQD electron, $\sigma_x$ and $\sigma_z$ are Pauli operators that act on the spin states of the electron, $B_z = B_z^{ext} = B_z^M$ denotes the total magnetic field along the z axis and $B_x^M = (B_{x,R}^M - B_{x,L}^M)/2$ is half the magnetic field difference of the DQD in the x direction. In the theoretical model, the assumption is made that the average magnetic field in the x direction satisfies $B_x^M = (B_{x,R}^M + B_{x,L}^M)/2 = 0$, which is a good approximation given the geometry of the micromagnet and its alignment with the DQD. The electric-dipole coupling is added to the cavity with the Hamiltonian $$H_1 = g_c(a+a^\dagger)\tau_z$$

where a and $a^\dagger$ are the photon operators for the cavity. The electric-dipole operator can be expressed in the eigenbasis $\{|n\rangle\}$ of $H_0$ as $$\tau_z = \sum_{n,m=0}^{3} d_{nm}|n\rangle\langle m|$$

The quantum Langevin equations for the operators a and $\sigma_{nm}=|n\rangle\langle m|$:

$$\dot{a} = i\Delta_0 a - \frac{k}{2}a + \sqrt{k_1}\,a_{in,1} = \sqrt{k_2}\,a_{in,2} - ig_c e^{i\omega_R t}\sum_{n,m=0}^{3}d_{nm}\sigma_{nm}$$

$$\dot{\sigma}_{nm} = -i(E_m - E_n)\sigma_{nm} - \sum_{n'm'}\gamma_{nm,n'm'}\sigma_{n'm'} + \sqrt{2\gamma}\,F - ig_c(ae^{-i\omega_R t} + a^\dagger e^{i\omega_R t})d_{mn}P_{nm}$$

where $\Delta_0 = \omega_R - \omega_c$ is the detuning of the driving field frequency ($\omega_R = 2\pi f$) relative to the cavity frequency ($\omega_c = 2\pi f_c$) and $P_{nm} = P_n - P_m$ is the population difference between levels n and m ($P_n$ can, for example, be assumed to be a Boltzmann distribution in thermal equilibrium). This description is equivalent to a more general master-equation approach in the weak-driving regime in which population changes in the DQD can be neglected. Furthermore, $\kappa_1$ and $\kappa_2$ are the photon decay rates at ports 1 and 2 of the cavity and $\alpha_{in,1}$ is the input field of the cavity, which is assumed to couple through port 1 only ($a_{in,2}=0$). The quantum noise of the DQD F is neglected in what follows. The super-operator $\gamma$ with matrix elements $\gamma_{nm,n'm'}$ represents decoherence processes, including charge relaxation and dephasing due to charge noise (these processes also imply some degree of spin relaxation and dephasing due to spin-charge hybridization via $B_x^M$). The goal is to relate the incoming parts $a_{in,j}$ of the external field at the ports to the outgoing fields $a_{out,i} = \sqrt{\kappa_i}\bar{a} - a_{in,i}$. The transmission $A = \bar{a}_{out,2}/\bar{a}^*_{in,1}$ (where the overbars denote time-averaged expectation values) through the microwave cavity is then computed using a rotating-wave approximation to eliminate the explicit time dependence in last equation above, by solving the equations for the expected value of these operators in the stationary limit ($\bar{a}$ and $\bar{\sigma}_{n,m}$):

$$A = -\frac{i\sqrt{\kappa_1\kappa_2}}{-\Delta_0 - i\kappa/2 + g_c\sum_{n=0}^{2}\sum_{j=1}^{3-n}d_{n,n+j}\chi_{n,n+j}}$$

where $\chi_{n,n+j} = \bar{\sigma}_{n,n+j}/\bar{a}$ are the single-electron partial susceptibilities and $d_{ij}$ are the dipole-transition matrix elements between DQD states.

Theoretical models for spin-photon coupling and spin decoherence. Here is presented a brief derivation of the analytical expressions for the spin-photon coupling rate $g_s$ and the spin decoherence rate $\gamma_s$. The focus is on the $\varepsilon=0$ regime used in FIG. 4B. Accounting for spin-charge hybridization due to the field gradient $B_x^M$, the relevant eigenstates of the DQD Hamiltonian in the equation above are $|0\rangle \approx |-, \uparrow\rangle$, $|1\rangle = \cos(\phi/2)|-, \uparrow\rangle + \sin(\phi/2)|+, \downarrow\rangle = \sin(\phi/2)|-, \uparrow\rangle - \cos(\phi/2)|+, \downarrow\rangle$ and $|3\rangle \approx |+, \uparrow\rangle$. Here is introduced a mixing angle $\phi = \tan^{-1}[g\mu_B B_x^M/(2t_c - g\mu_B B_z)]$. The dipole-transition matrix element for the primarily spin-like transition between $|0\rangle$ and $|1\rangle$ is $d_{01} \approx \sin(\phi/2)$ and the dipole-transition matrix element for the primarily charge-like transition between $|0\rangle$ and $|2\rangle$ is $d_{02} \approx \cos(\phi/2)$. The transition between $|0\rangle$ and $|3\rangle$ is too high in energy (off-resonance) and is therefore excluded from our model. The spin-photon coupling rate is $g_s = g_c|d_{01}| = g_c|\sin(\phi/2)|$, in agreement with previous theoretical results.

To calculate the effective spin decoherence rate $\gamma_s^c$ that arises from charge decoherence, first constructed are the operators $\tau_{01} = |0\rangle\langle 1| \approx \cos(\phi/2)\sigma_s + \sin(\phi/2)\sigma_r$ and $\sigma_{02} = |0\rangle\langle 1| \approx \sin(\phi/2)\sigma_s - (\phi/2)\sigma_s - \cos(\phi/2)\sigma_r$. Here $\sigma_s = |-, \downarrow\rangle\langle -, \uparrow|$ and $\sigma_r = |-, \downarrow\rangle\langle +, \downarrow|$ are lowering operators for the electron spin and charge, respectively. Assuming that the electron charge states have a constant decoherence rate $\gamma_c = \gamma_1/2 + \gamma_\phi$, where $\gamma_1$ is the charge relaxation rate and $\gamma_\phi$ is a dephasing rate due to charge noise, the equations of motion for these operators are $$\dot{\sigma}_{01} = \gamma_c\left[-\sin^2\left(\frac{\Phi}{2}\right)\sigma_{01} + \frac{\sin(\Phi)}{2}\sigma_{02}\right]$$

$$\dot{\sigma}_{02} = \gamma_c\left[\frac{\sin(\Phi)}{2}\sigma_{01} - \cos^2\left(\frac{\Phi}{2}\right)\sigma_{02}\right]$$

Combined with charge-photon coupling, the overall equations of motion in a rotating frame with a drive frequency $f \approx f_c$ assume the form $$\dot{a} = i\Delta_0 a - \frac{K}{2}a + \sqrt{\kappa_1}\,a_{in,1} - ig_c(d_{01}\sigma_{01} + d_{02}\sigma_{02})$$

$$\dot{\sigma}_{01} = -i\delta_1\sigma_{01} - \gamma_c\sin^2\left(\frac{\Phi}{2}\right)\sigma_{01} = \gamma_c\frac{\sin(\Phi)}{2}\sigma_{02} - ig_c a d_{10}$$

$$\dot{\sigma}_{02} = -i\delta_2\sigma_{02} - \gamma_c\cos^2\left(\frac{\Phi}{2}\right)\sigma_{02} + \gamma_c\frac{\sin(\Phi)}{2}\sigma_{01} - ig_c a d_{20}$$

The $\delta_1$ and $\delta_2$ terms are defined as $\delta_1/(2\pi) = (E_1 - E_0)/h - f$ and $\delta_2/(2\pi) = (E_2 - E_0)/h - f$, where $E_{0,1,2}$ correspond to the energy of the $|0\rangle$, $|1\rangle$ and $|2\rangle$ state, respectively. Steady-state solutions to the above equations give the electric susceptibility of the spin qubit transition $X_{0,1} = \sigma_{01}/a = g_s/(\delta_1 - i\gamma_s^{(c)})$, where a charge-induced spin decoherence rate is identified as $\gamma_s^{(c)} = \gamma_c[\delta_2 \sin^2(\phi/2) + \delta_1 \cos^2(\phi/2)]/\delta_2$. To account for spin dephasing due to fluctuations of the Si nuclear spin bath, the total spin decoherence rate is expressed assuming a Voigt profile:

$$\gamma_s = \frac{\gamma_s^{(c)}}{2} + \sqrt{\left(\frac{\gamma_s^{(c)}}{2}\right)^2 + 8\ln 2\left(\frac{1}{T_{2,nuclear}^*}\right)^2}$$

where $T_{2,nuclear}^* \approx 1$ μs is the electron-spin dephasing time due to nuclear field fluctuations.

When fitting the data in FIG. 4B, the experimentally determined values were used of $g_c/(2\pi) = 40$ MHz and $\gamma_c/(2\pi) = 35$ MHz, along with the best-fitting field gradient $B_x^M = 15$ mT. For every $t_c$, the fitted value for $B_z$ is adjusted so that the spin-qubit frequency $(E_1 - E_0)/h$ matches the cavity frequency $f_c$ exactly. The slight discrepancy between theory and experiment for $\gamma_s$ could be due to the frequency dependence of $\gamma_c$, changes in $\gamma_c$ with $B_z^{ext}$ ext or other decoherence mechanisms that are not captured by this simple model. To resolve such a discrepancy, a complete measurement of $\gamma_c$ as a function of $2t_c/h$ and the external field $B_z^{ext}$ is needed.

The complete theory also allows $g_s/(2\pi)$ to be calculated for non-zero values of $\varepsilon$. Using $2t_c/h=7.4$ GHz, it was estimated that $g_s/h=2.3$ MHz at $\varepsilon=20$ μeV (about 4.8 GHz), close to the value of $g_s/h=1.0$ MHz measured at this DQD detuning (FIG. 4A).

In this theoretical model, Purcell decay of the spin qubit through the cavity has been ignored. This is justified because $\gamma_s$ at every value of $t_c$ is measured with a large spin-cavity detuning $\Delta \approx 10\, g_s$. The expected Purcell decay rate of the spin qubit is $\Gamma_p/(2\pi)=[kg_s^2/(k^2/4+\Delta^2)]/(2\pi) \approx 0.02$ MHz, well below the measured values of $\gamma_s/(2\pi)$. It is also noted that, at least in the $2t_c \gg E_Z$ limit, spin decoherence at $\varepsilon=0$ is dominated by noise-induced dephasing rather than by energy relaxation. This is because at $2t_c/h=11.1$ GHz the spin decoherence rate $\gamma_s/(2\pi)=0.41$ MHz corresponds to a coherence time of $T_2=0.4$ μs $\ll 2T_1=6.4$ μs.

Line shapes of vacuum Rabi splittings. In contrast to charge-photon systems, the two resonance modes in the vacuum Rabi splittings (e.g., FIGS. 3B-C) show slightly unequal widths. This effect can be seen by comparing the observed spectrum of DQD1 with the expected behaviour of an equivalent two-level charge qubit that is coupled strongly to a cavity, calculated using a master-equation simulation with thermal photon number $n_{th}=0.02$ (black dashed line in FIG. 12A). The unequal widths are unlikely to be a result of a large thermal photon number in the cavity, because the transmission spectrum calculated with $n_{th}=0.05$ (orange dashed line) clearly does not fit the experimental data.

Instead, the observed asymmetry probably arises from the dispersive interaction between the cavity and the primarily charge-like transition between $|0\rangle$ and $|2\rangle$, which results in three-level dynamics that is more complicated than the two-level dynamics that characterizes charge-photon systems. Here is compared the experimental observation with theory by calculating $A(f)/A_0$ using $g_c/(2\pi)=40$ MHz (DQD1) or $g_c/(2\pi)=37$ MHz (DQD2), $\gamma_c/(2\pi)=105$ MHz (DQD1) or $\gamma_c/(2\pi)=130$ MHz (DQD2), $k/(2\pi)=1.8$ MHz, tunnel couplings $2t_c/h=7.4$ GHz, $B_x^M=15$ mT and $B_z=209.6$ mT. The results are shown as black solid lines alongside experimental data in FIG. 12A-Bs. The agreement between experiment and theory is very good for both devices. In particular, the asymmetry between the vacuum Rabi modes is also seen in the theoretical calculations. The larger values of $\gamma_c$ used in the theoretical calculations may again be due to the frequency dependence of $\gamma_c$ or to changes in $\gamma_c$ with $B_z^{ext}$.

Long-range spin-spin coupling. The coherent spin-photon interface may be readily applied to enable spin-spin coupling across the cavity bus. Here are evaluated two possible schemes for implementing such a coupling, both of which have been demonstrated with superconducting qubits. The first approach uses direct photon exchange to perform quantum-state transfer between two qubits. The transfer protocol starts by tuning qubit 1 into resonance with the unpopulated cavity for a time $1/(4g_s)$, at the end of which the state of qubit 1 is transferred completely to the cavity. Qubit 1 is then detuned rapidly from the cavity and qubit 2 is brought into resonance with the cavity for a time $1/(4g_s)$, at the end of which the state of qubit 1 is transferred completely to qubit 2. Therefore, the time required for quantum-state transfer across the cavity is $1/(2g_s)$. Because the decay of vacuum Rabi oscillations occurs at a rate $k/2+\gamma_s$, the threshold for coherent-state transfer between two spin qubits is $2g_s/(k/2+\gamma_s) > 1$. The ratio $2g_s/(k/2+\gamma_s)$ is plotted as a function of $2t_c/h$ in Extended Data FIG. 8a. It can be seen that $2g_s/(k/2+\gamma_s) > 1$ for all values of $2t_c/h$, indicating that spin-spin coupling via real photon exchange is achievable and may be implemented at any value of $t_c$. For our device parameters, the regime $2t_c/h \approx 6$ GHz, in which spin-charge hybridization is large and the ratio $2g_s/(k/2+\gamma_s)$ reaches a maximum of 3.5, seems most advantageous for such a coupling scheme.

The second approach to spin-spin coupling uses virtual photon exchange. In this scheme, both spin qubits would operate in the dispersive regime, with an effective coupling rate of $J=g_s^2(1/\Delta_1+1/\Delta_2)/2$, where $\Delta_1$ and $\Delta_2$ are the qubit-cavity detunings for qubits 1 and 2, respectively. Assuming that both qubits operate with an equal detuning $\Delta_{1,2}=10 g_s$, to minimize Purcell decay, $J=g_s/10$. For coherent spin-spin interaction, $J > \gamma_s$ needs to be satisfied, leading to the condition $g_s/\gamma_s > 10$. FIG. 13B is a plot of the ratio $g_s/\gamma_s$ as a function of $2t_c/h$, observing a maximum of $g_s/\gamma_s \approx 4$ at $2t_c/h \approx 10$ GHz. Because the dominant spin mechanism is probably hyperfine-induced dephasing by the Si nuclei in this regime (the decoherence rate $\gamma_s/(2\pi) \approx 0.4$ is close to the decoherence rates commonly found with single-spin qubits in natural Si), transitioning to isotopically purified Si host materials is likely to lead to an order-of-magnitude reduction in $\gamma_s/(2\pi)$, as demonstrated recently. Such an improvement will allow virtual-photon-mediated spin-spin coupling to be implemented in our device architecture as well.

Both coupling approaches will benefit substantially from larger values of the charge-photon coupling rate $g_c$, which is achievable through the development of higher-impedance cavities. The superconducting cavity used here is estimated to have an impedance between 200Ω and 300Ω. Increasing this value to about 2 kΩ, which is possible by using NbTiN as the superconducting material, will lead to another factor-of-three increase in $g_c$ and therefore $g_s$. This could enable the $g_s/\gamma_s > 100$ regime to be accessed, where high-fidelity two-qubit gates can be implemented between distant spins. Improvements in the fidelity of cavity-mediated two-qubit gates, particularly in the case of real photon exchange, can also be sought by improving the quality factor of the cavity (and thereby reducing k). This is achievable by implementing stronger gate line filters and removing lossy dielectrics such as the atomic-layer-deposited $Al_2O_3$ underneath the cavity.

The following provides additional information regarding the figures described above. FIGS. 2A-E show an example spin-photon interface. FIG. 2A shows optical image of the superconducting microwave cavity. The inset shows an optical image of the centre pin (0.6 μm) and vacuum gap (20 μm) of the cavity. FIG. 2B shows a false-colour scanning electron micrograph (SEM) of a DQD. Gate electrodes are labelled as G1, G2, S, D, B1, P1, B2, P2 and B3, where G1 and G2 are screening gates, S and D are used for accumulating electrons in the source and drain reservoirs, and B1 and B3 control the tunnel barrier of each dot to its adjacent reservoir. The locations of the cobalt micromagnets are indicated by the orange dashed lines. FIG. 2C shows a schematic cross-sectional view of the DQD device. The blue line indicates the electrostatic confinement potential which delocalizes a single electron between the two dots (indicated as half-filled circles). The quantization axis of the electron spin (red arrow) changes between the dots. FIG. 2D shows cavity transmission amplitude $A/A_0$ at $f=f_c$, where $f_c$ is the centre frequency of the cavity, near the $(1, 0) \leftrightarrow (0, 1)$ inter-dot transition for DQD1, plotted as a function of the voltages on gates P1 and P2, $V_{P1}$ and $V_{P2}$, with $B_z^{ext}=0$ and $V_{B2}=710$ mV. The dashed arrow denotes the DQD detuning parameter $\varepsilon$, which is equal to the difference in the chemical potentials of the two dots and points along the vertical direction because in this work $V_{P1}$ is changed to vary ε. $V_{B2}$ denotes the voltage on gate B2, which controls the inter-dot tunnel coupling tc. FIG. 2E shows $A/A_0$ as a function of ε with $V_{B2}$=710 mV (red line) and a fit to cavity input-output theory (black dashed line), with $g_c/(2\pi)$=40 MHz. FIG. 2F shows $2t_c/h$ as a function of $V_{B2}$ for DQD1, obtained by measuring $A(\varepsilon)/\Delta_0$ at different values of $V_{B2}$.

FIGS. 3A-C show strong single spin-photon coupling. FIG. 3A shows $A/A_0$ as a function of the cavity drive frequency f and an externally applied magnetic field $B_z^{ext}$ for DQD1. Insets show data from DQD2 at the same values of tc and E and plotted over the same range of f. $B_z^{ext}$ ranges from −94 mT to −91.1 mT (91.1 mT to 94 mT) for the left (right) inset. FIG. 3B shows $A/A_0$ as a function of $f$ for DQD1 at $B_z^{ext}$=90.3 mT (red) and $B_z^{ext}$=92.2 mT (blue) FIG. 3C shows $A/A_0$ as a function of $f$ for DQD2 at $B_z^{ext}$=91.1 mT (red) and $B_z^{ext}$=92.6 mT (blue). In FIG. 3B and FIG. 3C, the frequency difference between the two transmission peaks, indicated by the black arrows, is 11.0 MHz (FIG. 3B) and 10.6 MHz (FIG. 3C). The spin-photon coupling rate gs/(2π) corresponds to half the frequency separation and so is 5.5 MHz for DQD1 and 5.3 MHz for DQD2.

FIGS. 4A-B show Electrical control of spin-photon coupling. FIG. 4A shows $A/A_0$ as a function of f and $B_z^{ext}$ at ε=0 (left), ε=20 μeV (about 4.8 GHz; middle) and ε=40 μeV (about 9.7 GHz; right), with $2t_c/h$=7.4 GHz. Insets show $A/A_0$ as a function of $f$ at the values of $B_z^{ext}$ indicated by the white dashed lines in the main panels. FIG. 4B shows spin-photon coupling rate $g_s/(2\pi)$ (top) and spin decoherence rate $\gamma_s/(2\pi)$ (bottom) as functions of $2t_c/h$, with ε=0 (data). The dashed lines show theoretical predictions. A potential uncertainty of 0.01-0.1 MHz exists for each value of $g_s/(2\pi)$ and $\gamma_s/(2\pi)$ owing to uncertainties in the locations of the transmission peaks used to determine $g_s/(2\pi)$ (e.g., FIG. 10A-B) and the widths of the Lorentzian fits used to determine $\gamma_s/(2\pi)$ (e.g., FIGS. 9A-D). FIG. 4C shows DQD energy levels as a function of ε, calculated with $B_z^{ext}$+$B_z^M$=209 mT, $B_x^M$=15 mT and $2t_c/h$=7.4 GHz. Here $B_z^M$ denotes the magnetic field produced by the cobalt micromagnet parallel to $B_z^{ext}$, and $B_x^M$ is related to the strength of the inhomogeneous magnetic field perpendicular to $B_z^{ext}$. The symbols ↑ (↓), L (R) and −(+) denote the quantum states of the electron that correspond to up (down) spin states, left-dot (right-dot) orbital states and molecular bonding (anti-bonding) states, respectively. The schematics at the top illustrate the distribution of the wavefunction of the electron in different regimes of ε. For ε»$t_c$ and −ε»$t_c$, the electron is localized within one dot and tunnelling between the dots is largely forbidden, resulting in a small gs due to a small effective oscillating magnetic field. For |ε|«tc, the electron may tunnel between the two dots and experience a large oscillating magnetic field due to the spatial field gradient, resulting in a large $g_s$.

Figure 5B:
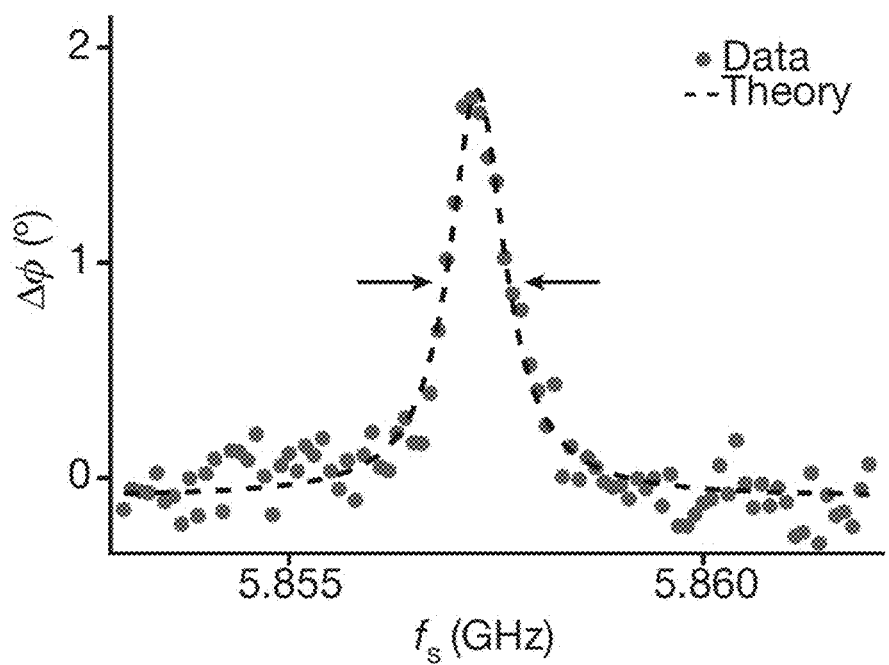
FIG. 5B shows electron spin resonance (ESR).
Figure 5C:
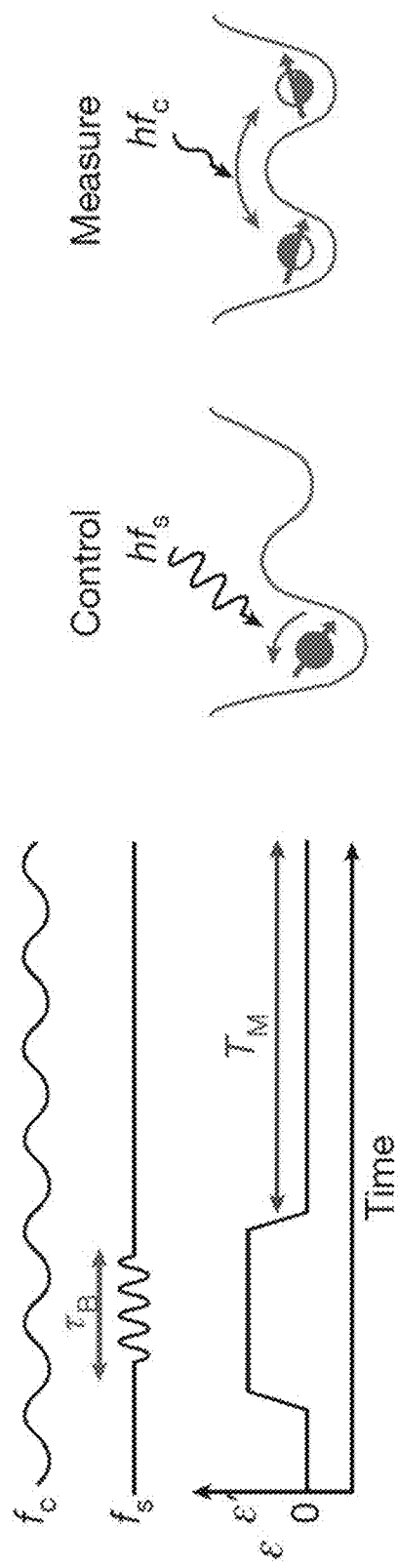
FIG. 5C shows schematic showing the experimental sequence for coherent spin control and measurement.
Figure 5D:
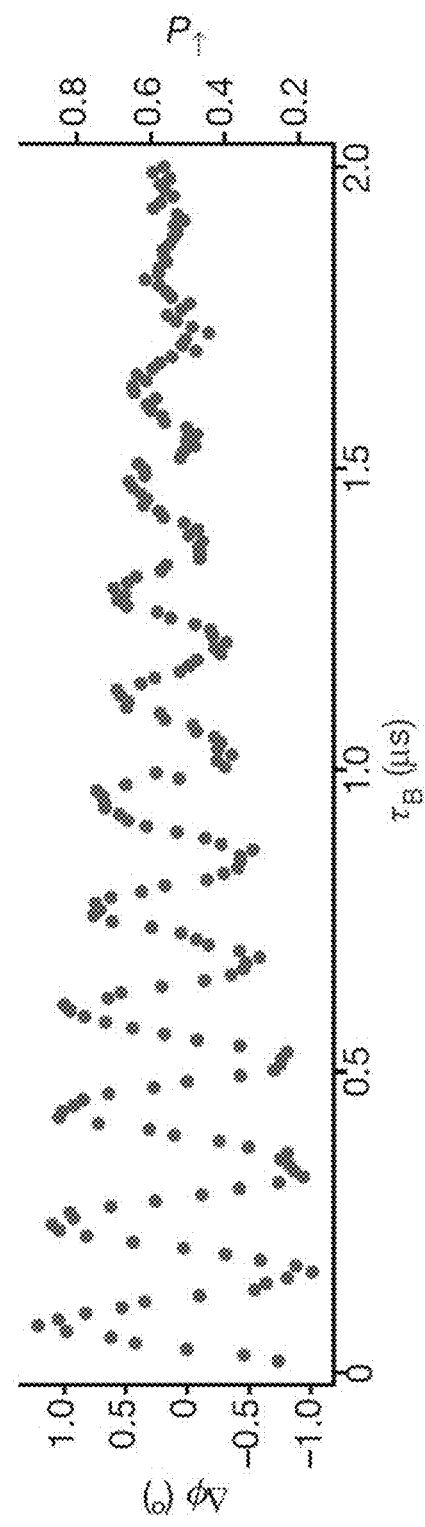
FIG. 5D shows $\Delta\phi$ as a function of $\tau_B$, with $2t_c/h=11.1$ GHz and $\epsilon'=70$ µeV, showing single-spin Rabi oscillations.

FIGS. 5A-D shows quantum control and dispersive readout of a single spin. FIG. 5A shows cavity phase response Δφ at f=$f_c$ when gate P1 is driven continuously at a variable frequency $f_s$ and power $P_s$=−106 dBm, with $2t_c/h$=9.5 GHz and ε=0. A background phase response, obtained by measuring $\Delta\phi(B_z^{ext})$ in the absence of a microwave drive on P1, is subtracted from each column of the data to correct for slow drifts in the microwave phase. FIG. 5B shows electron spin resonance (ESR) line as measured in $\Delta\phi(f_s)$ at $2t_c/h$=11.1 GHz, ε=0, $B_z^{ext}$=92.18 mT and $P_s$=−123 dBm (data). The dashed line shows a fit to a Lorentzian with a full-width at half-maximum of $\gamma_s/\pi$=0.81±0.04 MHz (indicated by the arrows). FIG. 5C shows schematic showing the experimental sequence for coherent spin control and measurement. Spin control is performed using a high-power microwave burst when the electron is largely localized within one dot (|ε|»$t_c$) and spin-photon coupling is turned off. Spinstate readout is achieved using the dispersive response of a cavity photon at ε=0 and when spin-photon coupling is turned on. FIG. 5D shows Δφ as a function of $\tau_B$, with $2t_c/h$=11.1 GHz and ε'=70 μeV, showing single-spin Rabi oscillations. The excited-state population of the spin qubit $P_\uparrow$ is indicated on the right y axis (see Methods).

FIG. 6 shows micromagnet design. To-scale drawing of the micromagnet design, superimposed on top of the SEM image of the DQD. The coordinate axes and the direction of the externally applied magnetic field $B_z^{ext}$ are indicated at the bottom. In this geometry, the DQD electron experiences a homogeneous z field $B_z \approx B_z^{ext}+B_z^M$. The total x field $B_x$ that is experienced by the electron is spatially dependent, being approximately $B_{x,L}^M$ ($B_{x,R}^M$) when the electron is in the L (R) dot (ε»$t_c$) and ($B_{x,L}^M+B_{x,R}^M$)/2 when the electron is delocalized between the DQDs (ε=0). The y field $B_y$ for the DQD electron is expected to be small compared to the other field components for this magnet design.

Figure 7:
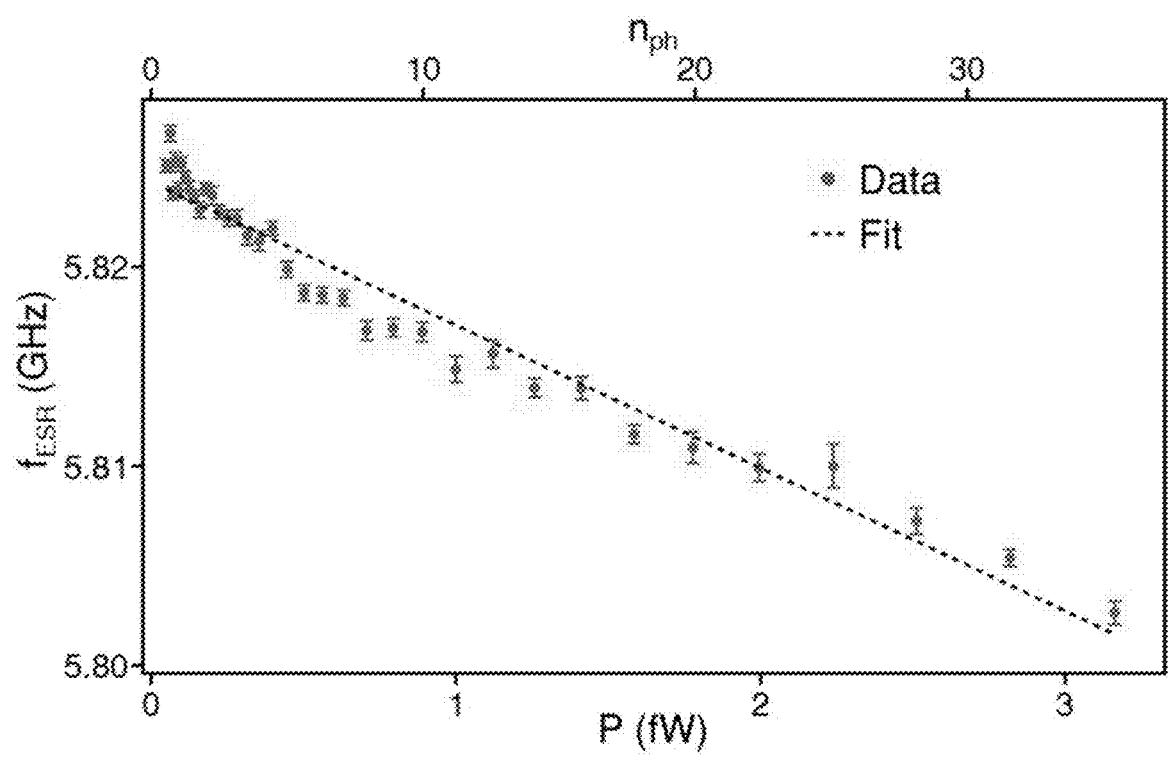
FIG. 7 shows photon number calibration.
Figure 8A:
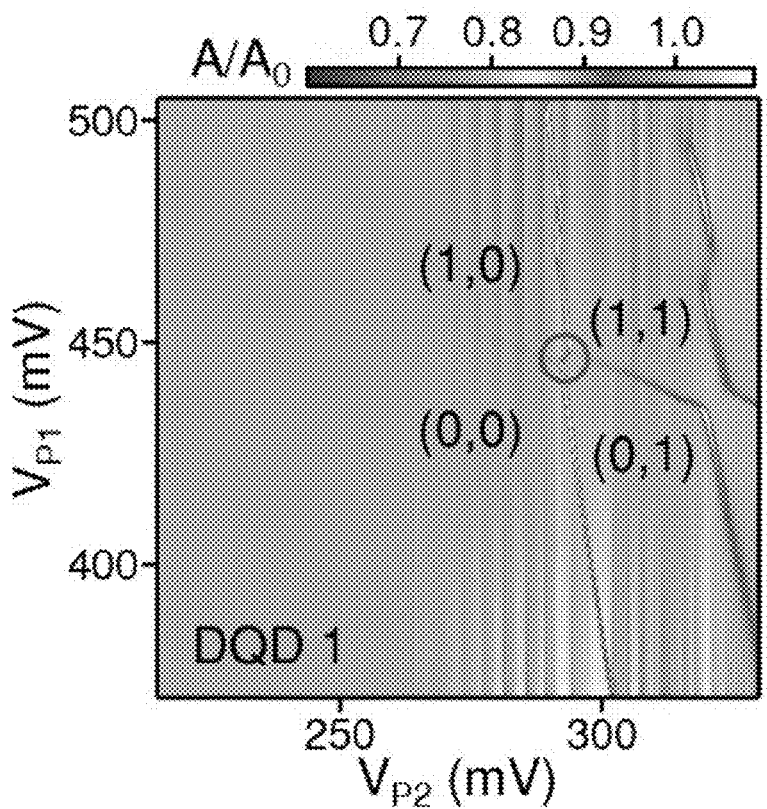
FIG. 8A shows a DQD stability diagram.
Figure 8B:
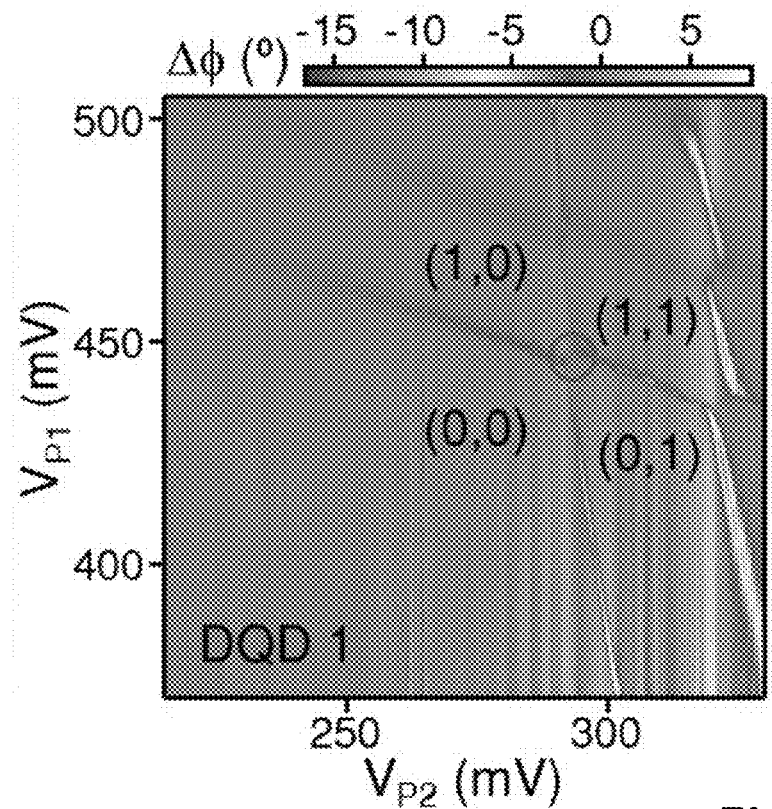
FIG. 8B shows another DQD stability diagram.
Figure 8C:
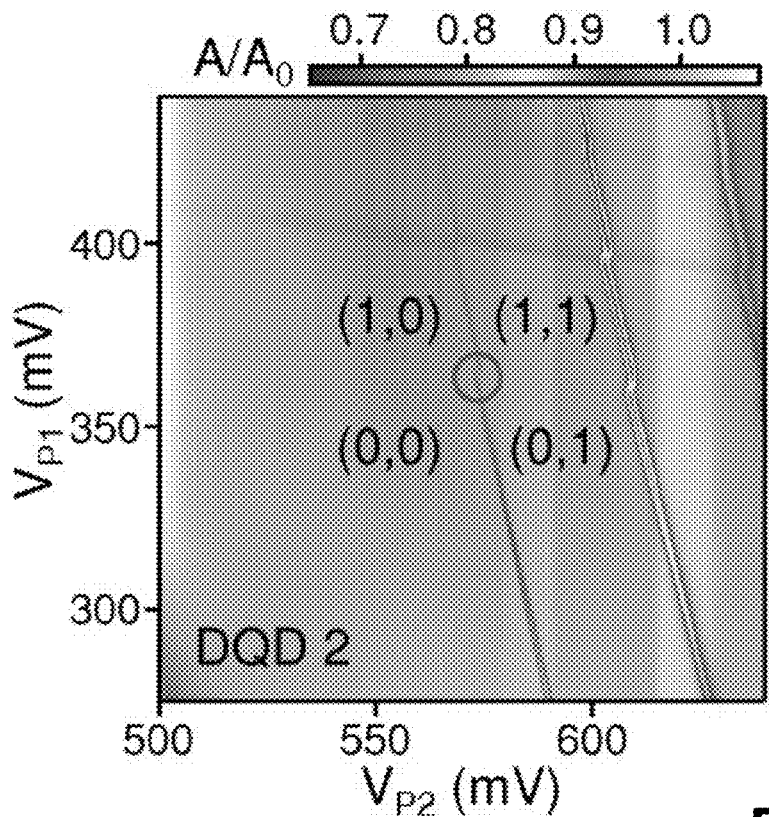
FIG. 8C show another DQD stability diagram.
Figure 8D:
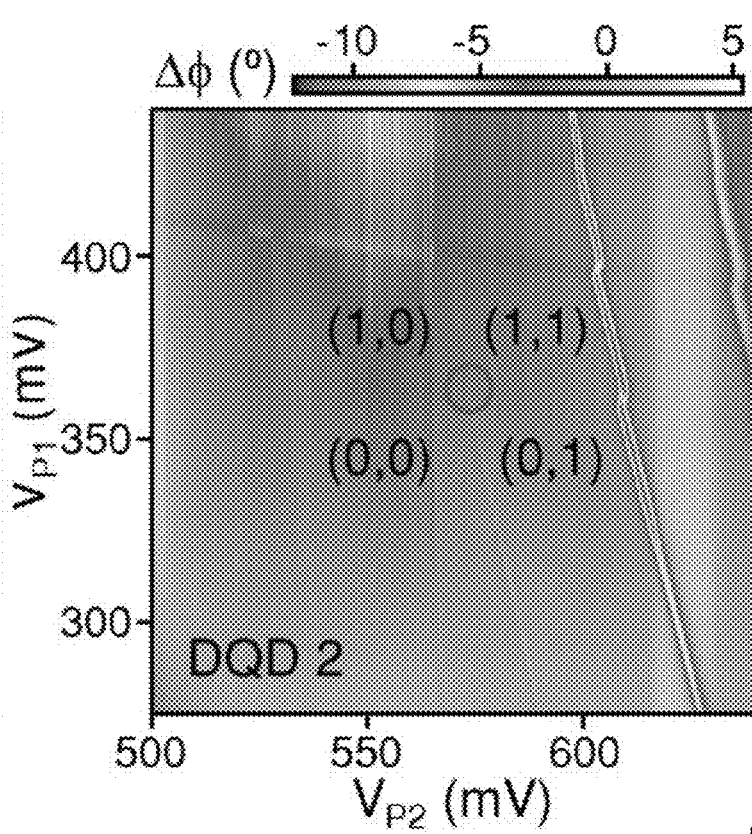
FIG. 8D show another DQD stability diagram.
Figure 9C:
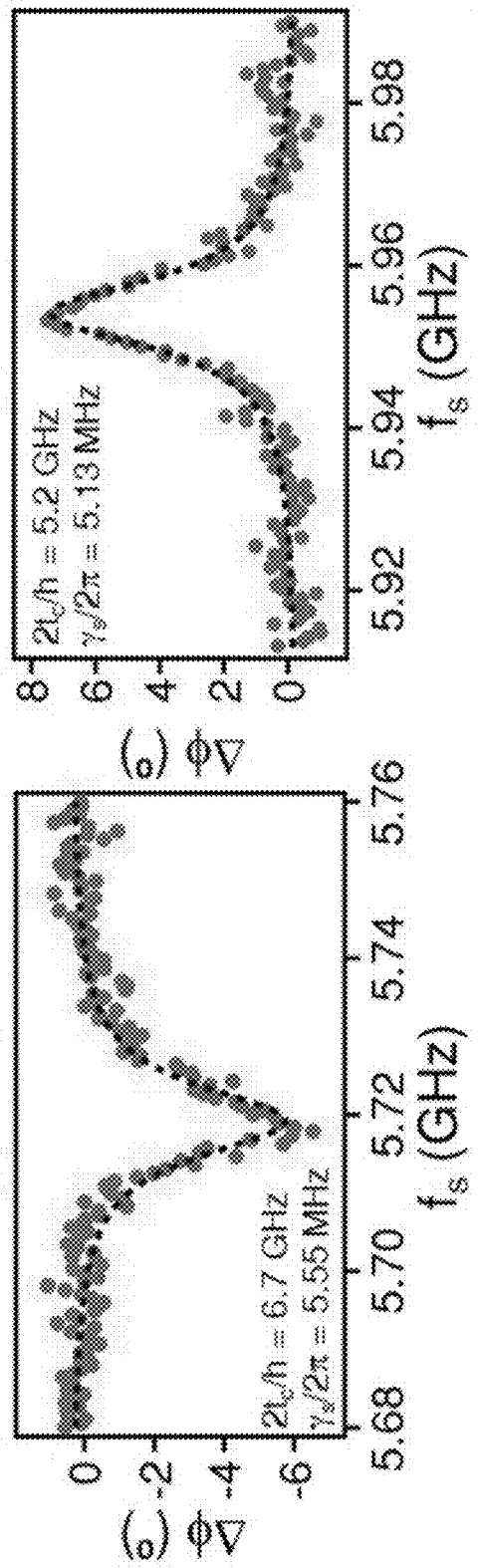
FIG. 9C shows another example spin decoherence rate.
Figure 9D:
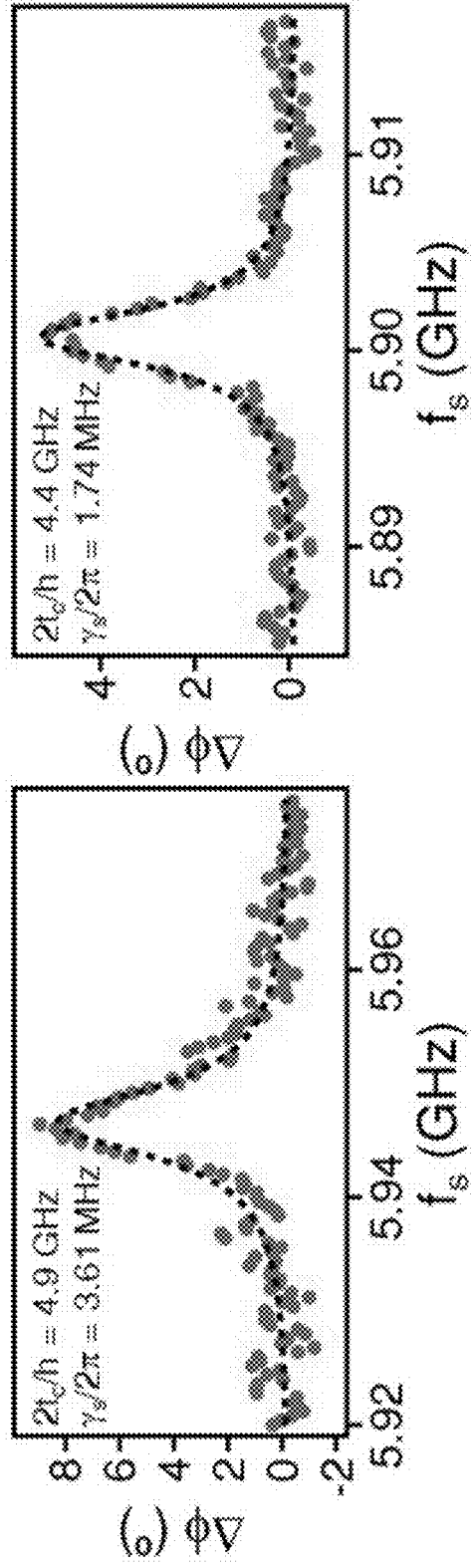
FIG. 9D shows another example spin decoherence rate.

FIG. 7 shows photon number calibration. The ESR resonance frequency $f_{ESR}$, measured using the phase response of the cavity Δφ in the dispersive regime (e.g., FIG. 5B), is plotted as a function of the estimated power at the input port of the cavity P (data). The device is configured with $g_s/(2\pi)$=2.4 MHz and spin-photon detuning Δ/2π≈−18 MHz≈The dashed line shows a fit to $f_{ESR}=f_{ESR}(P=0)+(2n_{ph}g_s^2/(\Delta)/(2\pi))$, where $n_{ph}$ is the average number of photons in the cavity, plotted as the top x axis. The experiments are conducted with P≈−133 dBm (0.05 fW), which corresponds to $n_{ph}$≈0.6. The error bars indicate the uncertainties in the centre frequency of the ESR transition.

FIGS. 8A-D show DQD stability diagrams. The cavity transmission amplitude $A/A_0$ (FIGS. 8A, 8C) and phase response Δφ (FIGS. 8B, 8D) are plotted as functions of $V_{P1}$ and $V_{P2}$ for DQD1 (FIGS. 8A, 8B) and DQD2 (FIGS. 8C, 8D), obtained with f=$f_c$. The (1, 0)↔(0, 1) transitions are clearly identified on the basis of these measurements and subsequently tuned close to resonance with the cavity for the experiments described in the main text. The red circles indicate the locations of the (1, 0)↔(0, 1) transitions of the two DQDs.

FIGS. 9A-D show spin decoherence rates at different DQD tunnel couplings. ESR line, as measured in the cavity phase response Δφ($f_s$), is shown for different values of $2t_c/h$ in the low-power limit (data). ε=0 for every dataset. Dashed lines are fits with Lorentzian functions and $\gamma_s/(2\pi)$ is determined as the half-width at half-maximum of each Lorentzian. The spin-photon detuning |Δzz|≈$g_s$ for each dataset, to ensure that the system is in the dispersive regime.

Figure 10A:
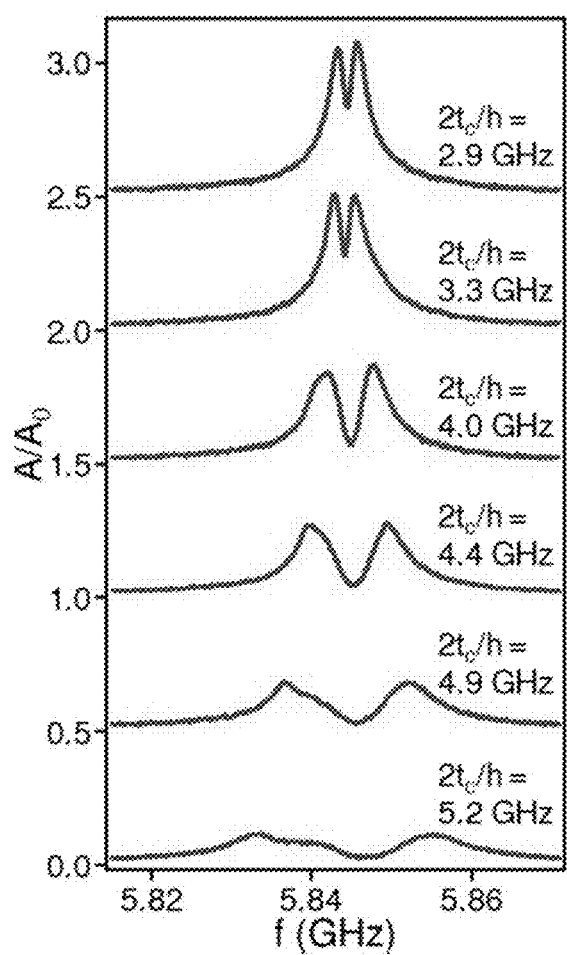
FIG. 10A shows vacuum Rabi splittings for $2t_c/h<f_c$.
Figure 10B:
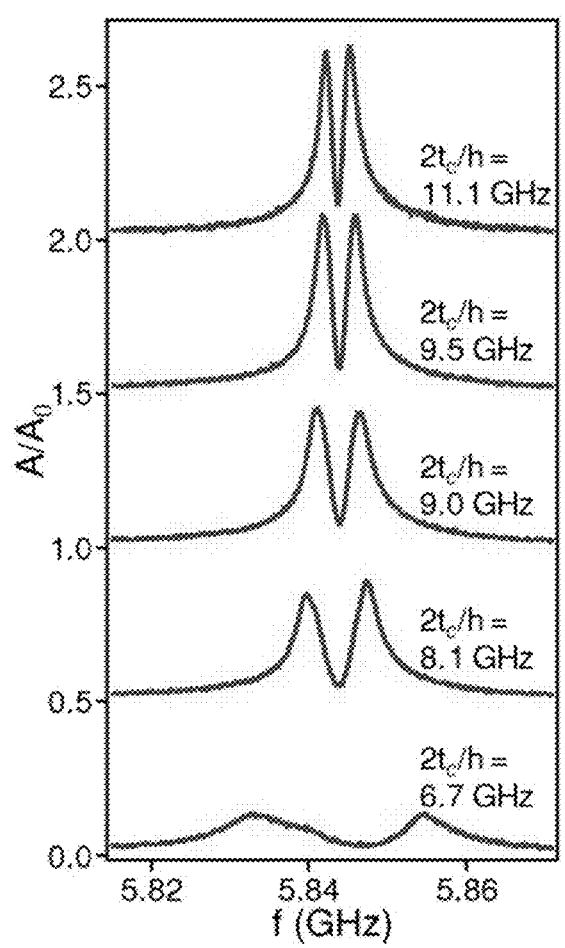
FIG. 10B shows vacuum Rabi splittings for $2t_c/h>f_c$.

FIGS. 10A-B show spin-photon coupling strengths at different DQD tunnel couplings. FIG. 10A shows vacuum Rabi splittings for $2t_c/h<f_c$ and FIG. 10B shows vacuum Rabi splittings for $2t_c/h>f_c$, obtained by varying $B_z^{ext}$ until a pair of resonance peaks with approximately equal heights emerges in the cavity transmission spectrum $A/A_0$. $g_s/(2\pi)$ is then estimated as half the frequency difference between the two peaks. ε=0 for every dataset. $g_s$ is difficult to measure for 5.2 GHz<$2t_c/h$<6.7 GHz owing to the small values of $A/A_0$ that arise from the large spin decoherence rates $\gamma_s$ in this regime.

FIG. 11 shows spin relaxation at ε=0. The time-averaged phase response of the cavity Δφ is shown as a function of wait time $T_M$ (data), measured using the pulse sequence illustrated in FIG. 5C. The microwave burst time is fixed at $\tau_B$=80 ns. The dashed line shows a fit using the function $\phi_0+\phi_1(T_1/T_M)[1-\exp(-T_M/T_1)]$, which yields a spin relaxation time of $T_1\approx3.2$ μs. The experimental conditions are the same as for FIG. 5D.

Figure 12A:
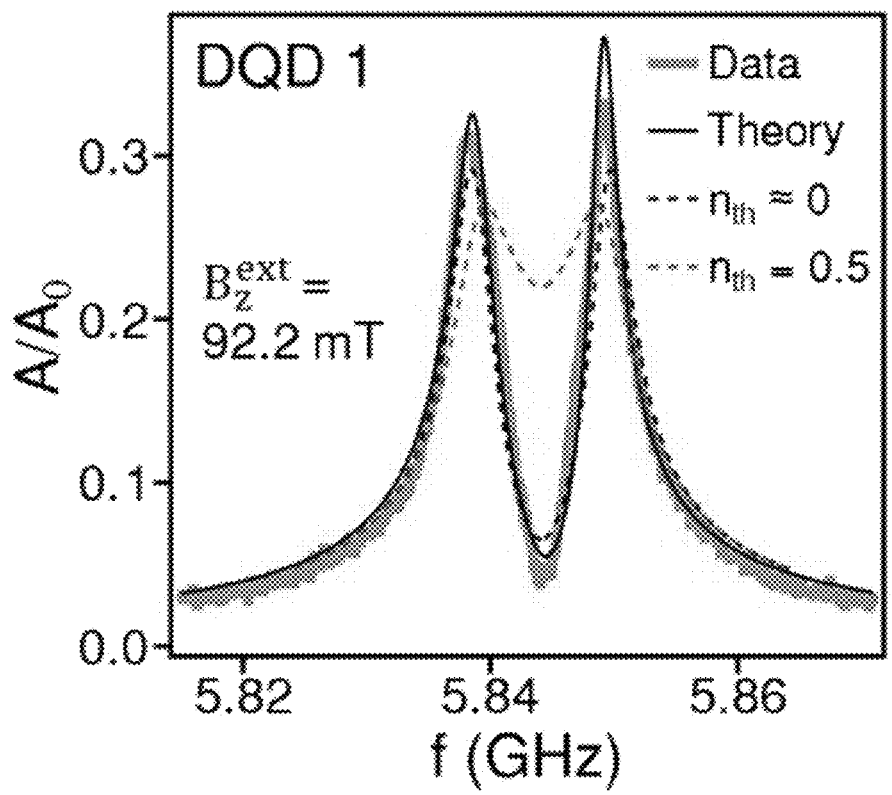
FIG. 12A show theoretical fits to vacuum Rabi splittings.
Figure 12B:
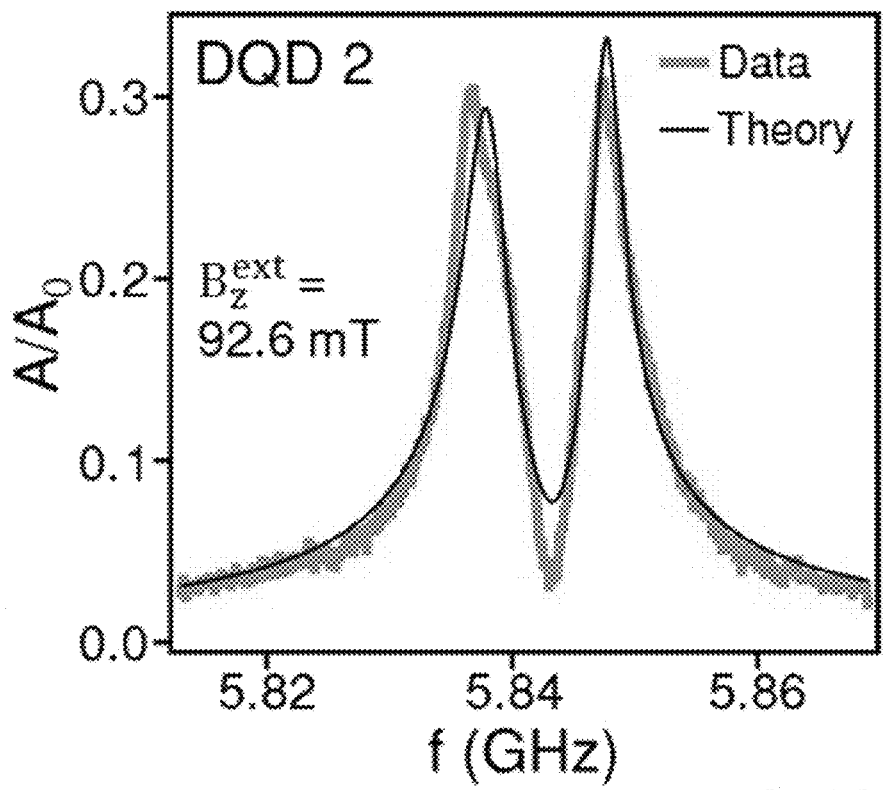
FIG. 12B show theoretical fits to vacuum Rabi splittings.

FIGS. 12A-B show theoretical fits to vacuum Rabi splittings. The calculated cavity transmission spectra (black solid lines) are superimposed on the experimentally measured vacuum Rabi splittings shown in FIG. 3B-C (data). The calculations are produced with $g_c/(2\pi)$=40 MHz ($g_c/(2\pi)$=37 MHz), $\kappa/(2\pi)$=1.8 MHz, $\gamma_c/(2\pi)$=105 MHz ($\gamma_c/(2\pi)$=120 MHz), $B_z=B_z^{ext}+B_z^M$=209 mT, $B_x^M=(B_{x,R}^M-B_{x,L}^M)/2$=15 mT and $2t_c/h$=7.4 GHz for DQD1 (DQD2). For comparison, $A(f)/A_0$, simulated for a two-level charge qubit with a decoherence rate of $\gamma_c/(2\pi)$=2.4 MHz coupled to a cavity with $\kappa/(2\pi)$=1.8 MHz at a rate $g_c/(2\pi)$=5.5 MHz, is shown in a for thermal photon numbers of $n_{th}$=0.02 (black dashed line) and $n_{th}$=0.5 (red dashed line).

Figure 13A:
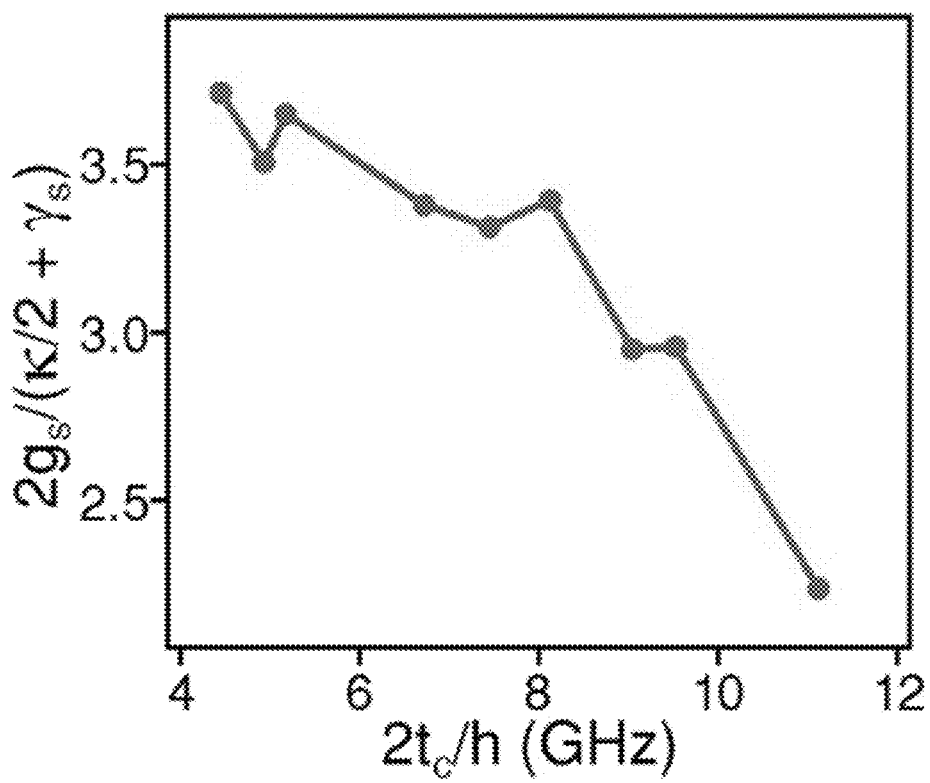
FIG. 13A shows the ratio $2g_s/(\kappa/2+\gamma_s)$ as a function of $2t_c/h$.
Figure 13B:
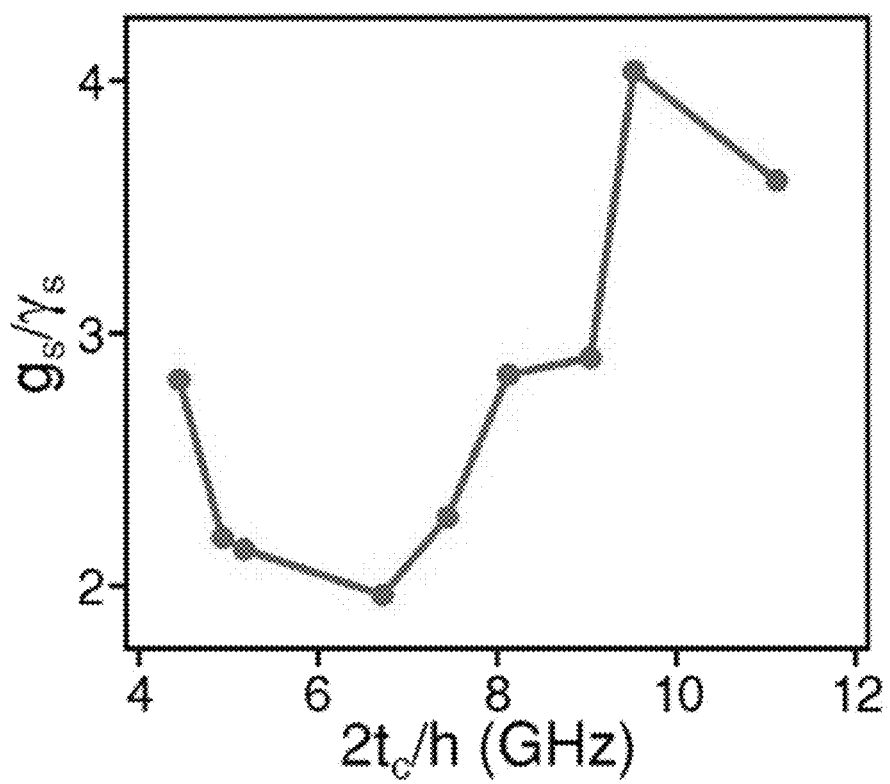
FIG. 13B shows the ratio $g_s/\gamma_s$ as a function of $2t_c/h$.

FIGS. 13A-B shows prospects for long-range spin-spin coupling. FIG. 13A shows the ratio $2g_s/(\kappa/2+\gamma_s)$ as a function of $2t_c/h$, calculated using the data in FIG. 4B and $\kappa/(2\pi)$=1.8 MHz. FIG. 13B shows the ratio $g_s/\gamma_s$ as a function of $2t_c/h$, also calculated using the data in FIG. 4B.

Second Section: Input-Output Theory for Spin-Photon Coupling in Si Double Quantum Dots The interaction of qubits via microwave frequency photons enables long-distance qubit-qubit coupling and facilitates the realization of a large-scale quantum processor. However, qubits based on electron spins in semiconductor quantum dots have proven challenging to couple to microwave photons. In this section is shown that a sizable coupling for a single electron spin is possible via spin-charge hybridization using a magnetic field gradient in a silicon double quantum dot. Based on parameters already shown in recent experiments, optimal working points are predicted to achieve a coherent spin-photon coupling, an essential ingredient for the generation of long-range entanglement. Furthermore, input-output theory is employed to identify observable signatures of spin-photon coupling in the cavity output field, which may provide guidance to the experimental search for strong coupling in such spin-photon systems and opens the way to cavity-based readout of the spin qubit.

Building a practical solid state quantum processor may rely on a flexible scheme of coupling individual qubits such that a 2D array of qubits, or even a network with connectivity between arbitrary pairs of qubits ("all-to-all" connectivity), may be achieved. For superconducting qubits, entanglement of qubits separated by macroscopic distances has been demonstrated using the approach of circuit quantum electrodynamics (cQED), whereby photons confined inside microwave frequency cavities serve as mobile carriers of quantum information that mediate long-range qubit interactions. Compared to superconducting qubits, qubits based on spins of electrons in semiconductor quantum dots (QDs) have the virtue of long lifetimes ($T_1$) that can be on the order of seconds for Si. On the other hand, the coupling between electron spins is typically based on nearest neighbor exchange interactions; therefore the coupling of spin qubits has remained limited to typical distances <100 nm. The development of a spin-cQED architecture in which spin qubits are coherently coupled to microwave frequency photons is therefore an important goal which would enable a spin-based quantum processor with full connectivity.

To transfer quantum states between a spin qubit and a cavity photon with high fidelity, it is important to achieve the strong-coupling regime in which the spin-photon coupling $g_s$ exceeds both the cavity decay rate $\kappa$ and the spin decoherence rate $\gamma_s$. While demonstrations of strong coupling have already been made with superconducting qubits and semiconductor charge qubits, such a task has proven challenging for a single spin due to its small magnetic dipole, which results in coupling rates that are less than 1 kHz and too slow compared to typical spin dephasing rates. An alternative route toward strong spin-photon coupling involves hybridizing the spin and charge states of QD electrons. The relatively large electric susceptibilities of the electron charge states lead to an effective spin-photon coupling rate $g_s$ on the order of MHz, as recently demonstrated by a carbon nanotube double quantum dot (DQD) device. However, spin-charge hybridization also renders spin qubits susceptible to charge noise, which has up to now prevented the strong coupling regime from being reached with a single spin. Only recently, the achievement of strong coupling between single spins and microwave photons has been reported. Coupling of three-electron spin states to photons has also been reported.

Here is provided an analysis of a scheme for strong spin-photon coupling using a semiconductor DQD placed in the inhomogeneous magnetic field of a micromagnet. This disclosure further predicts a complete map of the effective spin-photon coupling rate $g_s$ and spin decoherence rate $\gamma_s$. This allows for finding optimal working points for coherent spin-photon coupling. Further presented are detailed calculations of the cavity transmission and identify experimentally observable signatures of spin-photon coupling. It is predicted that the strong-coupling regime between a single spin and a single photon is achievable in Si using values of the charge-cavity vacuum Rabi frequency $g_c$ and charge decoherence rate $\gamma_c$ from recent experiments.

Figure 14:
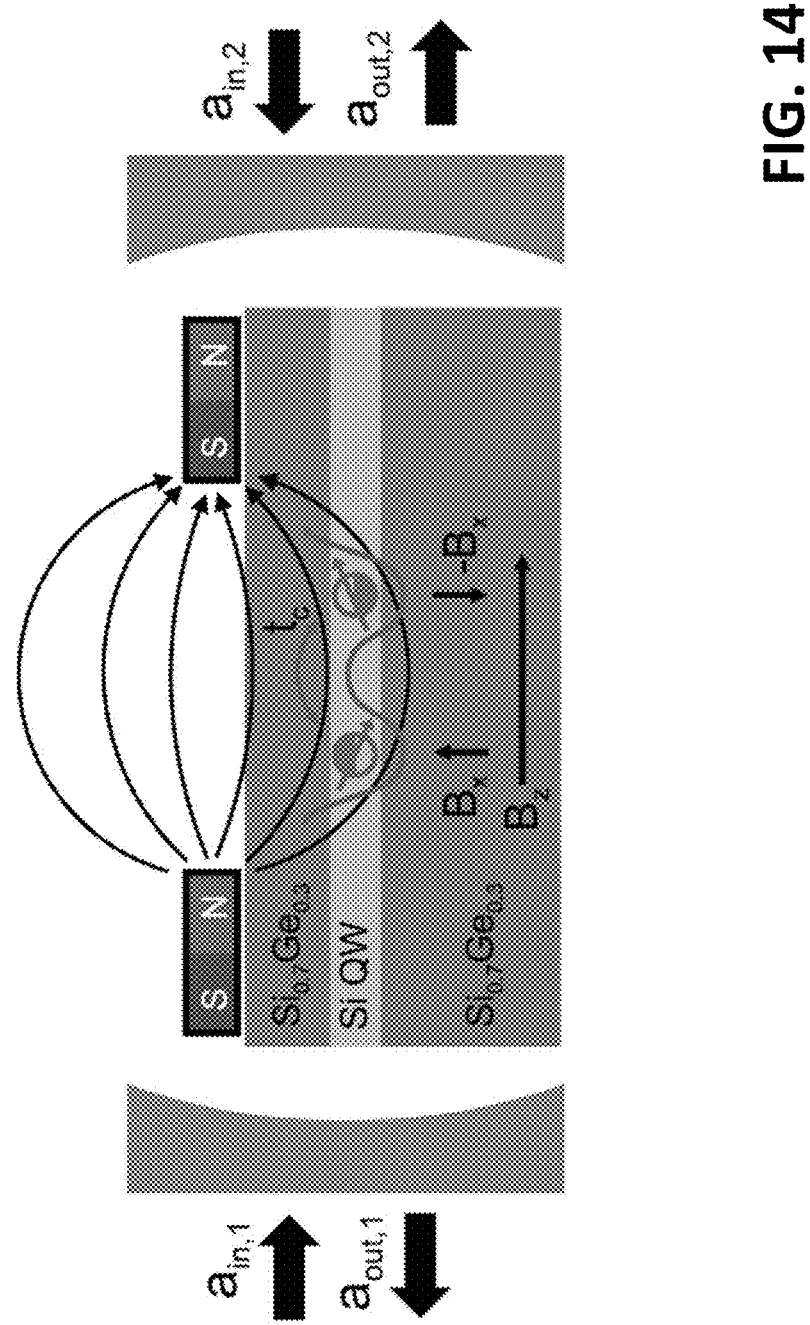
FIG. 14 shows a schematic illustration of the Si gate-defined DQD influenced by an homogeneous external magnetic field.

The physical system consists of a gate-defined Si DQD that is embedded in a superconducting cavity; see FIG. 14. The electric-dipole interaction couples the electronic charge states in the DQD to the cavity electric field. The introduction of an inhomogeneous magnetic field, as sketched in FIG. 14, hybridizes the charge states of a DQD electron with its spin states, indirectly coupling the cavity electric field to the electron spin.

Figure 15A:
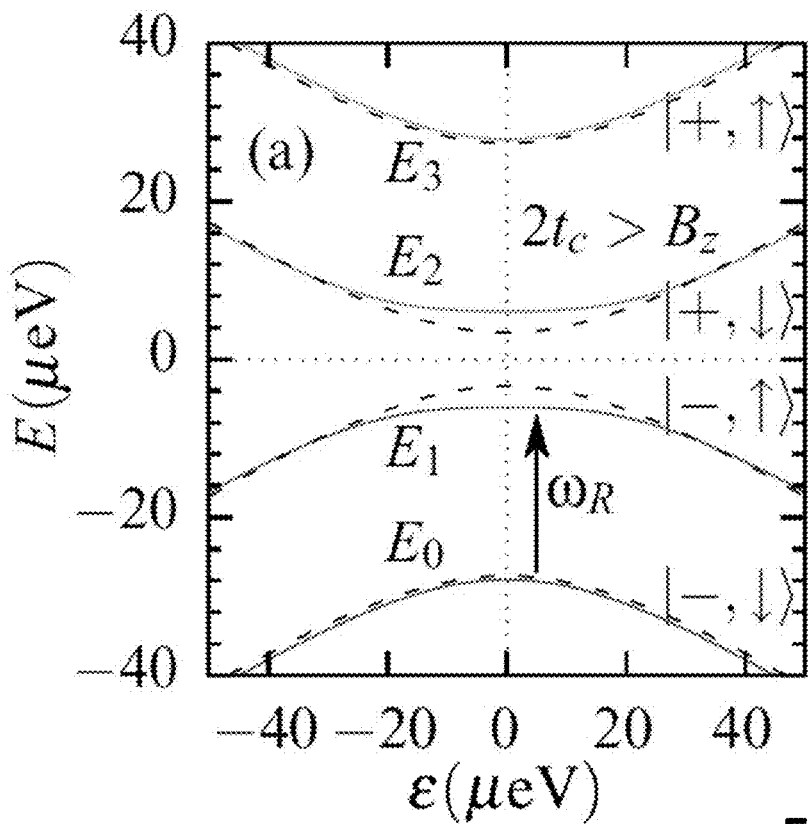
FIG. 15A shows energy levels as a function of the DQD detuning parameter.
Figure 15B:
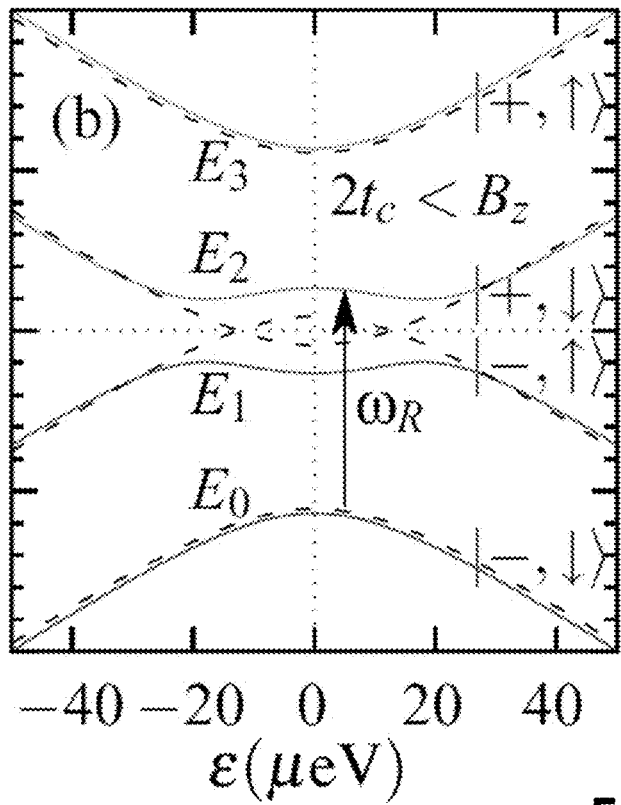
FIG. 15B shows energy levels as a function of the DQD detuning parameter.

Model. It is assumed that the DQD is filled with a single electron and has two charge configurations, with the electron located either on the left (L) or right (R) dot, with on-site energy difference (detuning) $\epsilon$ and tunnel coupling $t_c$. If a homogeneous magnetic field $B_z$ and a perpendicular spatial gradient field $B_x$ are applied one can model the single electron DQD with the Hamiltonian $$H_0=\tfrac{1}{2}(\epsilon\tau_z+2t_c\tau_x+B_z\sigma_z+B_x\sigma_x\tau_z), \quad (1)$$

where $\tau_\alpha$ and $\sigma_\alpha$ are the Pauli operators in position (L,R) and spin space, respectively. Here, $B_{z(x)}$ are the magnetic fields in energy units and $\hbar$=1. The valley degree of freedom present in this type of DQDs has not been considered in this model. Low-lying valley states are expected to lead to additional resonances and be detected in the cavity transmission. For the purposes concerning this work, spin-photon coupling via spin-charge hybridization, the ideal situation is to have quantum dots with a sufficiently large valley splitting, ≳40 μeV. There is therefore a four-level Hamiltonian with eigenenergies $E_n$ and eigenstates $|n\rangle$ for n=0, ..., 3. The eigenenergies in the regime $2t_c>B_z(2t_c<B_z)$ are shown in FIG. 15A. As shown in FIG. 15B, the magnetic field gradient generates spin-charge hybridization, coupling the original ($B_x$=0) energy levels (dashed lines) and inducing anticrossings at $\epsilon=\pm\sqrt{B_z^2-4t_c^2}$ if $2t_c<B_z$.

In the dipole approximation, the coupling of the DQD to the electric field of a microwave cavity can be described as $$H_1=g_c(a+a^\dagger)\tau_z, \quad (2)$$

where a and $a^\dagger$ are the bosonic cavity photon creation and annihilation operators. The Hamiltonian for the relevant cavity mode, with frequency $\omega_c$, is $H_c=\omega_c a_\dagger a$. In the eigenbasis of $H_0$, the interaction acquires nondiagonal elements, $$H_I = g_c(a + a^\dagger) \sum_{n,m=0}^{3} d_{nm}|n\rangle\langle m|. \quad (3)$$

As shown below, the essential dynamics of this system can also be described in terms of a so-called Λ system, with two weakly coupled excited states and a ground state; see FIGS. 15C-D.

FIG. 14 shows a schematic illustration of the Si gate-defined DQD influenced by an homogeneous external magnetic field, $B_z$, and the inhomogeneous perpendicular magnetic field created by a micromagnet, with opposite direction at the positions of the two QDs, $\pm B_x$. The DQD is electric-dipole-coupled to the microwave cavity represented in blue. The cavity field is excited at the left and right ports via $a_{in,1}$ and $a_{in,2}$, and the output can be measured either at the left ($a_{out,1}$) or right port ($a_{out,2}$).

Input-output Theory. To treat the DQD and the cavity as an open system, the Heisenberg picture is considered using the quantum Langevin equations (QLEs) for the system operators, including the photon operators $a, a^\dagger$ and $\sigma nm=|n\rangle\langle m|$. This treatment enables the calculation of the outgoing fields, $a_{out,1}$ and $a_{out,2}$, at the two cavity ports given the incoming weak fields, ain,1 and $a_{in,2}$.

FIGS. 15A-B show energy levels En(n=0, . . . , 3) as a function of the DQD detuning parameter ϵ. The dashed lines are the energy levels without a magnetic field gradient ($B_x=0$). They correspond to the bonding (−) and antibonding (+) orbitals with spin in the z direction, denoted by $|\pm, \uparrow(\downarrow)\rangle$. The arrow represents the transition driven by the probe field, at frequency ωR. Here, the parameters $B_z=24$ μeV and Bx=10 μeV are chosen. For the tunnel coupling: FIG. 15A shows $t_c=15.4$ μeV>$B_z/2$ and FIG. 15B $t_c=10.2$ μeV>$B_z/2$.

Figure 15C:
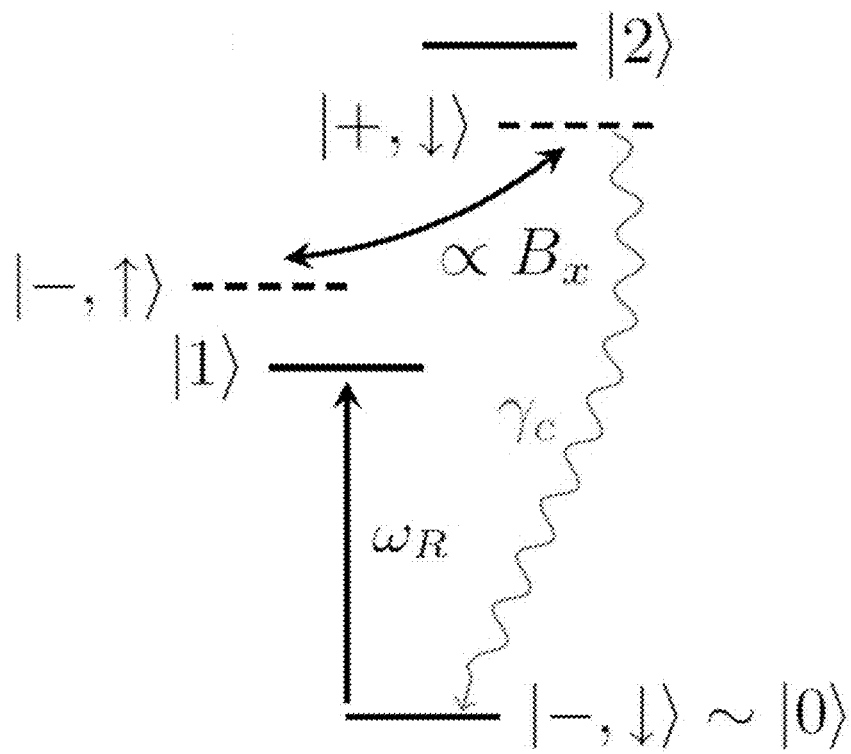
FIG. 15C shows a schematic representation of the $\wedge$ system that captures the essential dynamics in FIG. 15A.
Figure 15D:
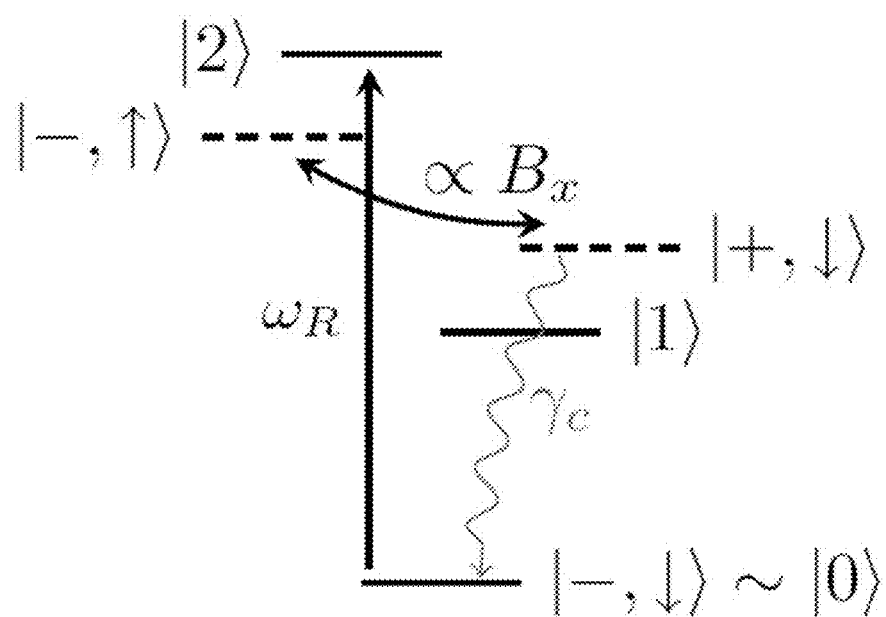
FIG. 15D shows a schematic representation of the $\wedge$ system that captures the essential dynamics in FIG. 15B.

FIGS. 15C-D show schematic representation of the Λ system that captures the essential dynamics in FIG. 15A-B, respectively (near ϵ=0). If the orbital energy, $\Omega=\sqrt{\epsilon^2+4t_c^2}$, is near $B_z$, the levels $|-, \uparrow\rangle$ and $|+, \downarrow\rangle$ hybridize into the states $|1\rangle$ and $|2\rangle$ due to the magnetic field gradient, while the ground state is approximately unperturbed $|0\rangle \sim |-, \downarrow\rangle$. The wavy lines represent charge decoherence with rate $\gamma_c$.

If the average population of the energy levels, $p_n \equiv \langle \sigma_{nn}\rangle$, follows a thermal distribution, the linear response to a probe field is reflected in the dynamics of the nondiagonal operators $\sigma_{nm}$. If the cavity is driven with a microwave field with a near-resonant frequency $\omega_R$, the QLEs in a frame rotating with the driving frequency read $$\dot{a} = i\Delta_0 a - \frac{\kappa}{a}a + \sqrt{\kappa_1}\,a_{in,1} + \sqrt{\kappa_2}\,a_{in,2} - ig_c e^{i\omega_R t}\sum_{n,m=0}^{3} d_{nm}\sigma_{nm}, \quad (4)$$

$$\dot{\sigma}_{nm} = -i(E_m - E_n)\sigma_{nm} - \sum_{n'm'}\gamma_{nm,n'm'}\sigma_{n'm'} + \quad (5)$$
$$\sqrt{2\gamma}\,F - ig_c(ae^{-i\omega_R t} + a^\dagger e^{i\omega_R t})d_{mn}(p_n - p_m),$$

where $\Delta_0=\omega_R-\omega_c$ is the detuning of the driving field relative to the cavity frequency and κ is the total cavity decay rate, with $\kappa_{1,2}$ the decay rates through the input and output ports. $\mathcal{F}$ is the quantum noise of the DQD and $a_{in,i}$ denote the incoming parts of the external field at the ports. The outgoing fields can be calculated as $a_{out,i}=\sqrt{\kappa_i}a-a_{in,i}$. The superoperator γ, with matrix elements $\gamma_{nm,n'm'}$, represents the decoherence processes which, in general, can couple the equations for the operators $\sigma_{nm}$. In this work, the decoherence superoperator γ will capture charge relaxation and dephasing due to charge noise (e.g., see "DECOHERENCE MODEL" section below), since these are the most relevant sources of decoherence.

This formalism allows computation of the transmission through the microwave cavity. Within a rotating-wave approximation (RWA) (e.g., see "MULTILEVEL RWA" section below) the explicit time dependence in Eqs. (4) and (5) can be eliminated to solve the equations for the expected value of these operators in the stationary limit ($\bar{a},\bar{\sigma}_{n,m}$) to obtain the susceptibilities, $$\bar{\sigma}_{n,n+j}=\chi_{n,n+j}\bar{a}\quad (j=1,\ldots,3-n), \quad (6)$$

and the transmission $A=\bar{a}_{out,2}/\bar{a}_{in,1}$, $$A = \frac{-i\sqrt{\kappa_1\kappa_2}}{-\Delta_0 - i\kappa/2 + g_c\sum_{n=0}^{2}\sum_{j=1}^{3-n}d_{n,n+j}\chi_{n,n+j}}, \quad (7)$$

which is in general a complex quantity. Considered here are $\langle a_{in,2}\rangle=0$ and $\langle \mathcal{F}\rangle=0$ Orbital Basis. In the product basis of antibonding and bonding orbitals +, − with spin $\uparrow\downarrow$ in the z direction, $\{|+,\uparrow\rangle, |-,\uparrow\rangle, |+,\downarrow\rangle, |-,\downarrow\rangle\}$, the Hamiltonian in Eq. (1) reads $$H_0^{orb} = \frac{1}{2}\begin{pmatrix} \Omega+B_z & 0 & B_x\sin\theta & -B_x\cos\theta \\ 0 & -\Omega+B_z & -B_x\cos\theta & -B_x\sin\theta \\ B_x\sin\theta & -B_x\cos\theta & \Omega-B_z & 0 \\ -B_x\cos\theta & -B_x\sin\theta & 0 & -\Omega-B_z \end{pmatrix}, \quad (8)$$

where $\Omega=\sqrt{\epsilon^2+4t_c^2}$ is the orbital energy and $$\theta = \arctan\frac{\epsilon}{2t_c}$$

is introduced as the "orbital angle." In this basis the dipole operator takes the form $$d^{orb} = \begin{pmatrix} \sin\theta & -\cos\theta & 0 & 0 \\ -\cos\theta & -\sin\theta & 0 & 0 \\ 0 & 0 & \sin\theta & -\cos\theta \\ 0 & 0 & -\cos\theta & -\sin\theta \end{pmatrix}. \quad (9)$$

In the simplest case, ϵ=0, the orbital angle θ is zero, and one can rewrite the Hamiltonian as $$H_0^{orb}(\epsilon=0) = \frac{r}{2}\begin{pmatrix} \frac{2t_c+B_z}{r} & 0 & 0 & -\sin\Phi \\ 0 & -\cos\Phi & -\sin\Phi & 0 \\ 0 & -\sin\Phi & \cos\Phi & 0 \\ -\sin\Phi & 0 & 0 & \frac{-2t_c-B_z}{r} \end{pmatrix}, \quad (10)$$

with $r=\sqrt{(2t_c-B_z)^2+B_x^2}$ and the spin-orbit mixing angle $$\Phi = \arctan\frac{B_x}{2t_c - B_z}\,[\Phi \in (0, \pi)].$$

As the dipole operator couples the states $|-, \downarrow\rangle$ and $|+, \downarrow\rangle$ and the field gradient couples $|+, \downarrow\rangle$ to $|-, \uparrow\rangle$, the combination of these two effects leads to a coupling between the two different spin states $|-, \downarrow\rangle$ and $|-, \uparrow\rangle$. It is this coupling that can be harnessed to coherently hybridize a single electron spin with a single photon and achieve the strong-coupling regime.

Results.

A. Effective coupling at zero detuning. The spin-charge hybridization created by the inhomogeneous magnetic field allows for the coupling of the spin to the cavity. This is visible in the form of the operator d in the eigenbasis; see Eq. (3). In the simple case of zero DQD detuning, $\epsilon=0$, the ordered energy levels are $$E_{3,0} = \pm \tfrac{1}{2}\sqrt{(2t_c+B_z)^2 + B_x^2}, \qquad (11)$$

$$E_{2,1} = \pm \tfrac{1}{2}\sqrt{(2t_c+B_z)^2 + B_x^2}. \qquad (12)$$

Using the spin-orbit mixing angle $\Phi$ the eigenstates $|1\rangle$ and $|2\rangle$ can be expressed as $$|1\rangle = \cos\tfrac{\Phi}{2}|-,\uparrow\rangle + \sin\tfrac{\Phi}{2}|+,\downarrow\rangle, \qquad (13)$$

$$|2\rangle = \cos\tfrac{\Phi}{2}|-,\uparrow\rangle - \cos\tfrac{\Phi}{2}|+,\downarrow\rangle, \qquad (14)$$

while the other two can be approximated by $$|0\rangle \simeq |-,\downarrow\rangle \qquad (15)$$

$$|3\rangle \simeq |+,\uparrow\rangle, \qquad (16)$$

if $r \ll (2t_c + B_z)$, i.e., for small $|2t_c - B_z|$. In this limit, the dipole matrix elements, $$d = \begin{pmatrix} 0 & d_{01} & d_{02} & 0 \\ d_{01} & 0 & 0 & d_{13} \\ d_{02} & 0 & 0 & d_{23} \\ 0 & d_{13} & d_{23} & 0 \end{pmatrix}, \qquad (17)$$

simplify to $$d_{01} = d_{23} \simeq -\sin\tfrac{\Phi}{2}, \qquad (18)$$

$$d_{02} = -d_{13} \simeq \cos\tfrac{\Phi}{2}, \qquad (19)$$

This means that the hybridization due to the weak magnetic field gradient generates an effective coupling between the levels $|-,\downarrow\rangle$ and $|-,\uparrow\rangle$, with opposite spin. The spin nature of the transitions $0 \leftrightarrow 1$ and $0 \leftrightarrow 2$ depends on the spin-orbit mixing angle $\Phi$; see Eqs. (13) to (15). Assuming that the cavity frequency is tuned to the predominantly spinlike transition, which is $0 \leftrightarrow 1$ ($0 \leftrightarrow 2$) for cos $\Phi > 0$ (cos<0), as indicated in the level structure of FIGS. 15C-D, the effective spin-cavity coupling strength will be given by $g_s = g_c |d_{01(2)}|$.

B. Effective coupling at $\epsilon \neq 0$. For $\epsilon \neq 0$ the energy levels are $$E_{3,0} = \pm\tfrac{1}{2}[(\Omega + \sqrt{B_z^2 + B_x^2\sin^2\theta})^2 + B_x^2\cos^2\theta]^{1/2}, \qquad (20)$$

$$E_{2,1} = \pm\tfrac{1}{2}[(\Omega - \sqrt{B_z^2 + B_x^2\sin^2\theta})^2 + B_x^2\cos^2\theta]^{1/2}. \qquad (21)$$

Analogous to the previous section, if $\sqrt{(\Omega-B_z)^2+B_x^2} \ll (\Omega+B_z)$ one can approximate the eigenstates by Eqs. (13) to (16) where the spin-orbit mixing angle is now $$\Phi = \arctan\frac{B_x\cos\theta}{\Omega - B_z} [\Phi \in (0,\pi)].$$

Within this approximation, $$d_{01} = d_{23} \simeq -\cos\theta\sin\tfrac{\Phi}{2}, \qquad (22)$$

$$d_{02} = -d_{13} \simeq \cos\theta\cos\tfrac{\Phi}{2}. \qquad (23)$$

C. Effective coupling map. Before calculating the effect of the Si DQD on the cavity transmission A, one can estimate the magnitude of the coupling $g_s$. For $\Omega > B_z$ ($\Omega < B_z$), $0 \leftrightarrow 1$ ($0 \leftrightarrow 2$) is predominantly a spin transition; therefore, one can obtain a map for the effective coupling by using $g_s = g_c |d_{01(2)}|$; see FIG. 16A. As the value of $\Omega$ approaches $B_z$, $\Phi$ tends to $\pi/2$ and the coupling is maximized. However, in this regime, due to strong spin-charge hybridization, the charge nature of the transition increases (e.g., see Eqs. (13) and (14)) and with it the decoherence rate increases, preventing the system from reaching strong coupling. In the following it is shown that the ratio of the coupling rate to the total decoherence rate can be optimized by working away from maximal coupling. In particular the strong-coupling regime for the spin can be achieved.

As described further in the "GENERAL MAGNETIC FIELD GRADIENT DIRECTION" section below, the model is generalized to a less symmetric situation, where the gradient of the magnetic field between the quantum dot positions is not perpendicular to the homogeneous magnetic field. This effect is not critical and it is expected that the strong-coupling regime to be accessible as well. For simplicity, the symmetric case is considered in the following.

D. Cavity transmission. In the following, the DQD is considered to be in its ground state, such that $p_n = \delta_{n,0}$ in Eq. (5). If the cavity frequency is close to the Zeeman energy, $\omega_c \approx B_z$, the transition $0 \leftrightarrow 3$ is off resonant and the relevant dynamics is contained in the level structure of FIGS. 15C and 2(d). Moreover, this transition is not coupled to the others since $d_{03} = 0$ and $\gamma_{03,nm} \sim \delta_{n0}\delta_{m3}$ (e.g., see "DECOHERENCE MODEL" section below)). To calculate the cavity response, it is sufficient to solve the QLEs for $\langle a \rangle$, $\langle \sigma_{01} \rangle$, and $\langle \sigma_{02} \rangle$ (in the following the brackets are omitted) within the RWA (e.g., see "MULTILEVEL RWA" section below).

As explained above, the decoherence processes accounted for in Eq. (5) can result in a different decay rate for every transition and can also couple different transitions. As shown in the section entitled "DECOHERENCE MODEL" below, the decoherence superoperator in the basis $\{\sigma_{01}, \sigma_{02}\}$ reads $$\gamma = \gamma_c \begin{pmatrix} \sin^2\tfrac{\Phi}{2} & -\tfrac{\sin\Phi}{2} \\ -\tfrac{\sin\Phi}{2} & \cos^2\tfrac{\Phi}{2} \end{pmatrix}, \qquad (24)$$

where $\gamma_c$ is the total charge dephasing rate, which accounts for charge relaxation and dephasing due to charge noise. With this, the QLEs read $$\dot{a} = i\Delta_0 a - \tfrac{\kappa}{2}a + \sqrt{\kappa_1}\, a_{in,1} - ig_c(d_{01}\sigma_{01} + d_{02}\sigma_{02}), \qquad (25)$$

-continued $$\dot{\sigma}_{01} = -i\delta_1\sigma_{01} - \gamma_c\sin^2\frac{\Phi}{2}\sigma_{01} + \frac{\gamma_c}{2}\sin\Phi\sigma_{02} - ig_c a d_{10}, \quad (26)$$

$$\dot{\sigma}_{02} = -i\delta_2\sigma_{02} - \gamma_c\cos^2\frac{\Phi}{2}\sigma_{02} + \frac{\gamma_c}{2}\sin\Phi\sigma_{01} - ig_c a d_{20}, \quad (27)$$

with the detunings $\delta_n \equiv E_n - E_0 - E_0 - \omega_R$ (n=1,2). The solution of these equations in the stationary limit allows us to compute the susceptibilities $$\chi_{01} = \frac{\overline{\sigma}_{01}}{\overline{a}} = \frac{g_c\cos\theta\,\sin(\Phi/2)}{\delta_1 - i\gamma_{\text{eff}}^{(2)}}, \quad (28)$$

$$\chi_{02} = \frac{\overline{\sigma}_{02}}{\overline{a}} = \frac{-g_c\cos\theta\,\cos(\Phi/2)}{\delta_2 - i\gamma_{\text{eff}}^{(1)}}, \quad (29)$$

where $\gamma_{\text{eff}}^{(n)} \equiv \gamma_c[\delta_2\sin^2(\Phi/2) + \delta_1\cos^2(\Phi/2)]/\delta_n$ and the transmission through the cavity $$A = \frac{-i\sqrt{\kappa_1\kappa_2}}{-\Delta_0 - i\frac{\kappa}{2} + g_c(\chi_{01}d_{01} + \chi_{02}d_{02})}, \quad (30)$$

with $d_{01}$ and $d_{02}$ defined in Eqs. (22) and (23). If $0 \leftrightarrow 1$ ($0 \leftrightarrow 2$) is predominantly a spin transition and the corresponding transition energy is in resonance with the cavity frequency, it is expected to have an effective spin decoherence rate $\gamma_s = \gamma_{\text{eff}}^{(2)}$ ($\gamma_s = \gamma_{\text{eff}}^{(y)}$). In FIG. 16B is shown the ratio $\gamma_s/\gamma_c$, together with $g_s/g_c$, as a function of the tunnel coupling for $\epsilon=0$. Here, the external magnetic field is set to the resonant value $B_z^{res}$ such that $E_{1(2)} - E_0 = \omega_c$. This is $$B_z^{res} = \omega_c\sqrt{1 - \frac{B_x^2}{\omega_c^2 - 4t_c^2}}, \quad (31)$$

for $\epsilon=0$. In a small region around $2t_c \approx \omega_c[\sqrt{\omega_c(\omega_c - B_x)} < 2t_c < \sqrt{\omega_c(\omega_c + B_x)}]$, indicated with the vertical lines in FIG. 16B, it is not possible to achieve the desired resonance by tuning $B_z$. It is observed that in the wings of the peak $g_s/g_c \gg \gamma_s/\gamma_c$, which may lead the spin-cavity system to be in the strong-coupling regime even when the charge-cavity system is not ($g_c < \gamma_K$). This is visible in the inset, where it is shown that the ratio $g_s/\sqrt{[\gamma_s^2 + (\kappa/2)^2]/2}$ exceeds one, signifying the strong-coupling regime (e.g., see "CHARACTERIZATION OF THE SPIN-PHOTON COUPLING" section). For this calculation, and in the remainder of the text, it is assumed that a gradient of the magnetic field between the two dots of $B_x \approx 15$ mT, one order of magnitude smaller than the external magnetic field, a charge-cavity coupling $g_c/2\pi=40$ MHz, a cavity decay rate on the order of MHz, and a much larger charge dephasing rate on the order of 100 MHz.

Figure 16A:
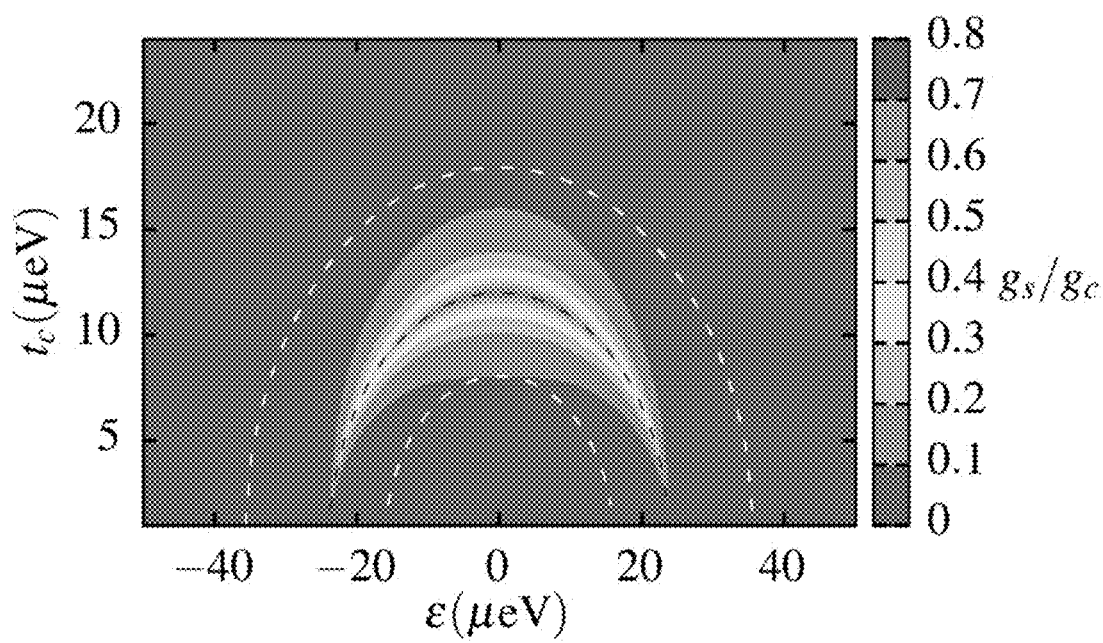
FIG. 16A shows expected effective coupling $g_s/g_c - |d_{01(2)}|$
Figure 16B:
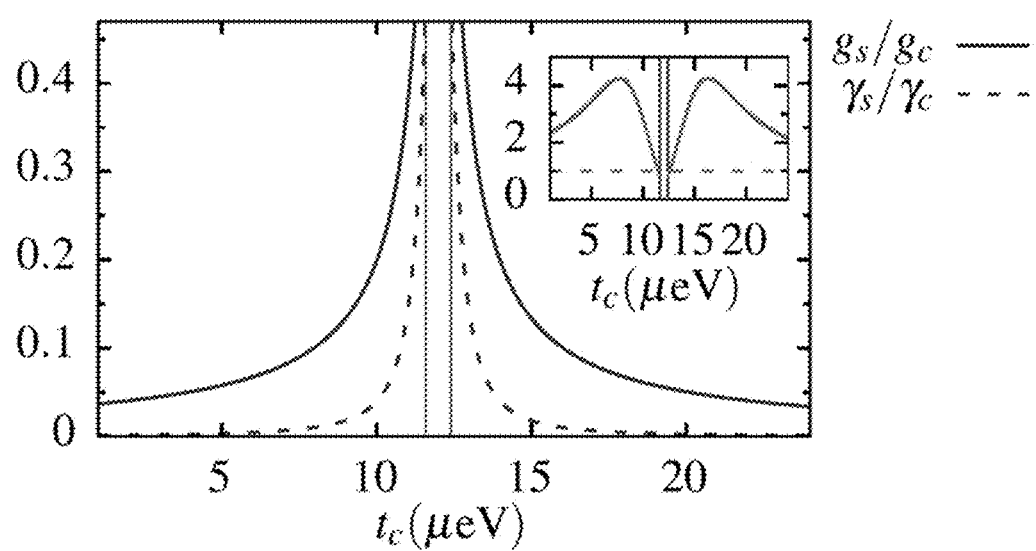
FIG. 16B shows spin-photon coupling strength $g_s/g_c$ and spin decoherence rate $\gamma_s/\gamma_c$ as a function of $t_c$ for $\epsilon=0$, $B_z=B_z^{res}$, and $B_x=1.62$ µeV.

FIG. 16A shows expected effective coupling gs/gc=|d01(2)|, according to Eqs. (22) and (23) as a function of $t_c$ and $\epsilon$. The black dashed line corresponds to $\Omega = B_z$ and separates the region where gs/gc=|d0,(1)| (above) from the region where gs/gc=|d0,(2)| (below). The most interesting region lies in between the two white dashed lines, where the approximations are accurate $[\sqrt{(\Omega - B_z)^2 + B_x^2} \ll (\Omega + B_z)]$. Chosen values include $B_x=1.62$ μeV and $B_z=24$ μeV. FIG. 16B shows spin-photon coupling strength $g_s/g_c$ and spin deco-herence rate $\gamma_s/\gamma_c$ as a function of $t_c$ for $\epsilon=0$, $B_z=B_z^{res}$, and $B_x=1.62$ μeV. Between the two blue vertical lines, the resonance cannot be achieved by tuning $B_z$. Inset: ratio $g_s/\sqrt{[\gamma_s^2 + (\kappa/2)^2]/2}$ in the same range. The coupling is strong when this quantity is larger than one (dashed line). The values chosen include $\gamma_c/2\pi=100$ MHz, $g_c/2\pi=40$ MHz, and $\kappa/2\pi=1.77$ MHz.

Figure 17:
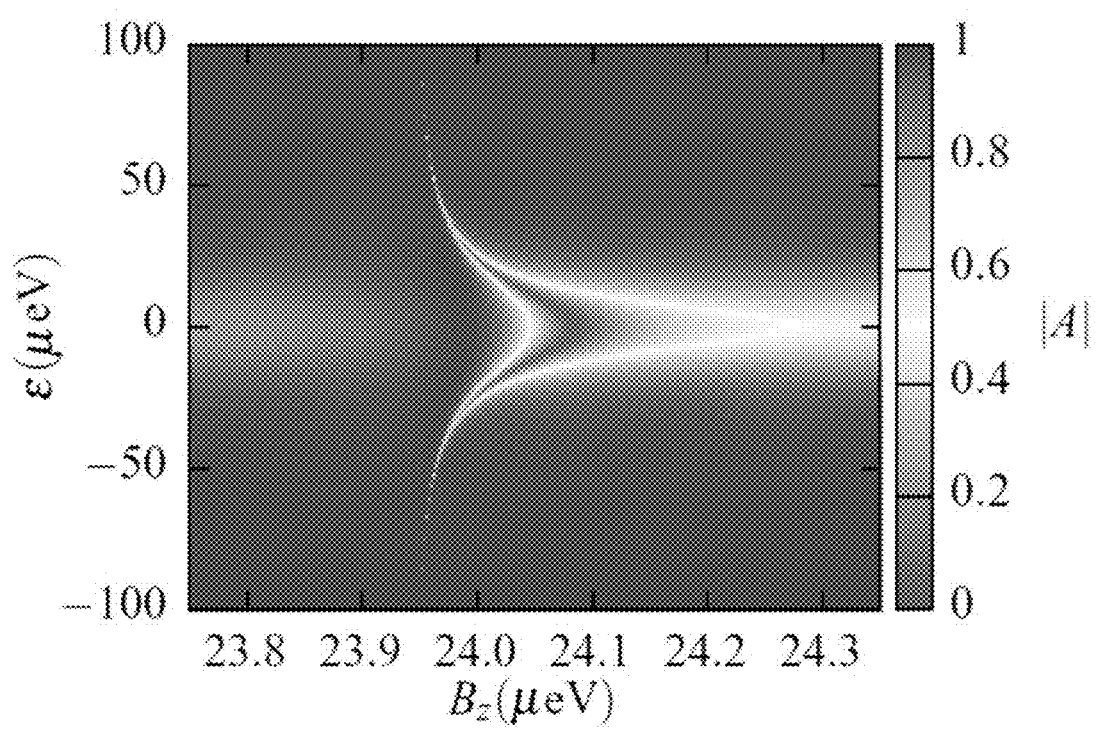
FIG. 17 shows cavity transmission spectrum, $|A|$, as a function of $B_z$ and $\epsilon$ at zero driving frequency detuning $\Delta_0=0$.

According to the level structure, it is expected to observe a signature of spin-photon coupling by driving the cavity near resonance ($\Delta_0 \approx 0$) and sweeping the external magnetic field through the cavity frequency. FIG. 17 shows cavity transmission spectrum, |A|, as a function of $B_z$ and $\epsilon$ at zero driving frequency detuning $\Delta_0=0$. The other parameters are $t_c=15.4$ μeV, $B_x=1.62$ μeV, $\gamma_c/2\pi=(100+150|\sin\theta|)$ MHz, $g_c/2\pi=40$ MHz, $\kappa/2\pi=1.77$ MHz, and $\omega_c/2\pi=5.85$ GHz 24 μeV. In FIG. 17 is shown the calculated transmission through the cavity as a function of the external magnetic field $B_z$ and the DQD detuning $\epsilon$ when the driving frequency matches the cavity frequency. Chosen values include $\kappa_1=\kappa_2=\kappa/2$. When the cavity frequency is close to the transition energy $0 \leftrightarrow 1$, the interaction between the electron and the cavity field results in a significantly reduced cavity transmission. Interestingly, close to $B_z \approx \omega_c$ the transmission approaches one due to an interference between the two energy levels. At this point, $\chi_{01}d_{01} + \chi_{02}d_{02} \simeq 0$.

Figure 18A:
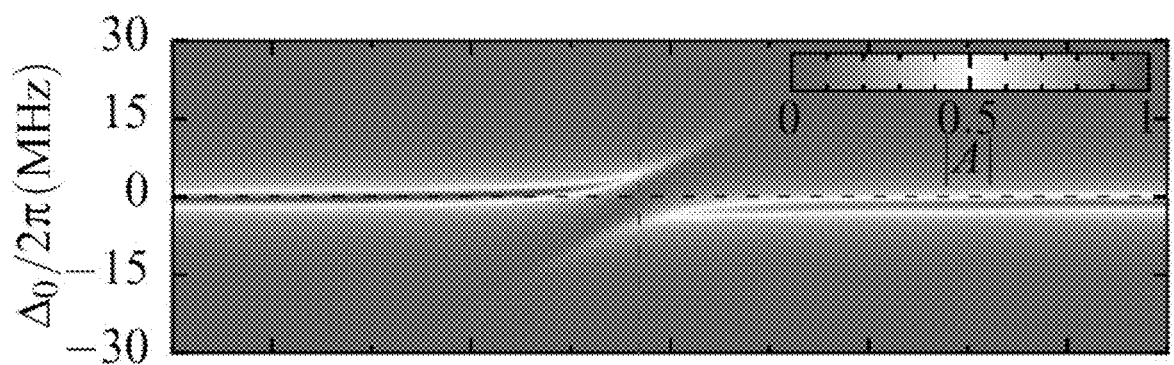
FIG. 18A shows cavity transmission spectrum $|A|$ as a function of $B_z$ and $\Delta_0$.
Figure 18B:
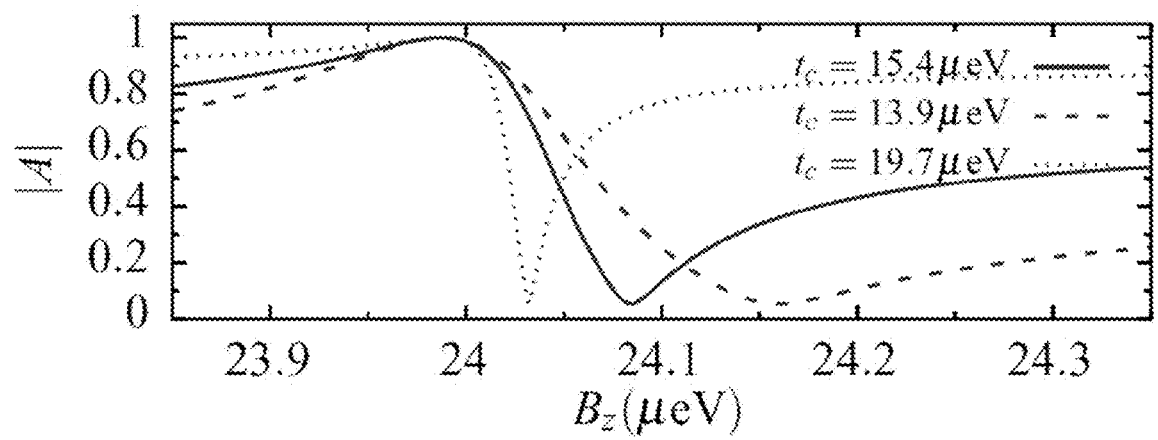
FIG. 18B shows $|A|$ as a function of $B_z$ ($\Delta_0$) for the value of $\Delta_0$ ($B_z$) indicated by the dashed line.
Figure 18C:
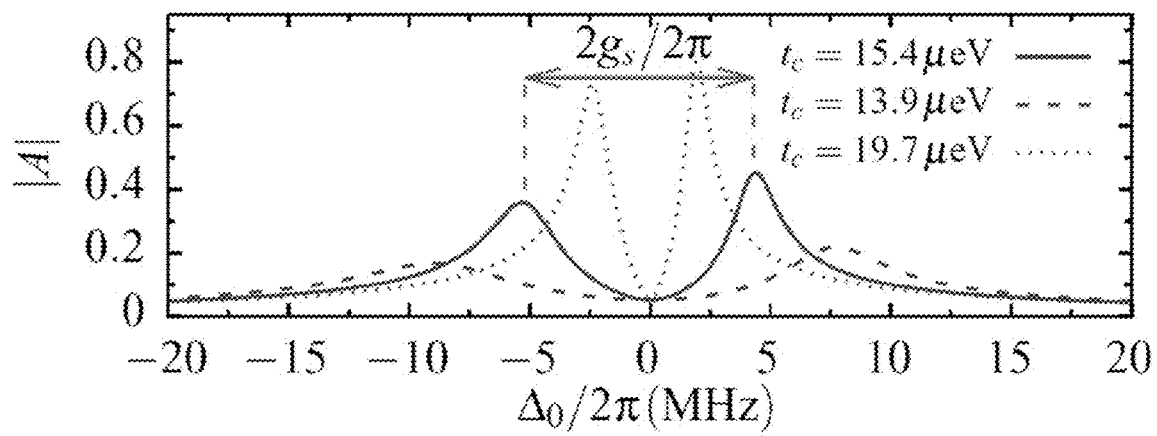
FIG. 18C shows $|A|$ as a function of $B_z$ ($\Delta_0$) for the value of $\Delta_0$ ($B_z$) indicated by the dashed line.

FIG. 18A shows cavity transmission spectrum |A| as a function of $B_z$ and $\Delta_0$. FIG. 18 B-C shows |A| as a function of $B_z$ ($\Delta_0$) for the value of $\Delta_0$ ($B_z$) indicated by the black (blue) dashed line. In (a) $t_c=15.4$ μeV. In FIGS. 18B-C are shown the result for this value (solid line) and for $t_c=13.9$ μeV (dashed line) and $t_c=19.7$ μeV (dotted line). The other parameters are $\epsilon=0$, $B_x=1.62$ μeV, $\gamma_c/2\pi=100$ MHz, $g_c/27\pi=40$ MHz, $\kappa/2\pi=1.77$ MHz, and $\omega_c/2\pi=5.85$ GHz≈24 μeV.

In the usual scenario of a two-level system coupled to a photonic cavity, strong coupling results in light-matter hybridization, as evidenced in the observation of vacuum Rabi splitting in the cavity transmission spectrum when the qubit transition frequency matches the cavity frequency. The two vacuum Rabi normal modes are separated by a frequency corresponding to the characteristic rate of the light-matter interaction, and the linewidth of each mode reflects the average decoherence rate of light and matter. In FIG. 18A, the absolute value of the transmission, |A|, is shown as a function of the magnetic field $B_z$ and the driving frequency relative to $\omega_c$, $\Delta_0$, at $\epsilon=0$. The phase gives similar information (not shown). When the driving frequency is near the cavity frequency, $\Delta_0 \approx 0$, two peaks emerge in the cavity transmission, signifying the strong-coupling regime. In FIGS. 18B-C are shown the horizontal and vertical cuts of this figure at $\Delta_0=0$ and $B_z=B_z^{res}$, respectively, where $B_z^{res}$, given by Eq. (31), ensures $E_1 - E_0 = \omega_c$. In FIG. 18B shows the same interference effect seen in FIG. 17. FIG. 18C shows the vacuum Rabi splitting. As indicated with a red arrow, the effective coupling, related to the separation between the two peaks, corresponds to $g_s/2\pi \approx 5$ MHz and the parameters under consideration can be readily achieved in Si DQD architectures.

Figure 19:
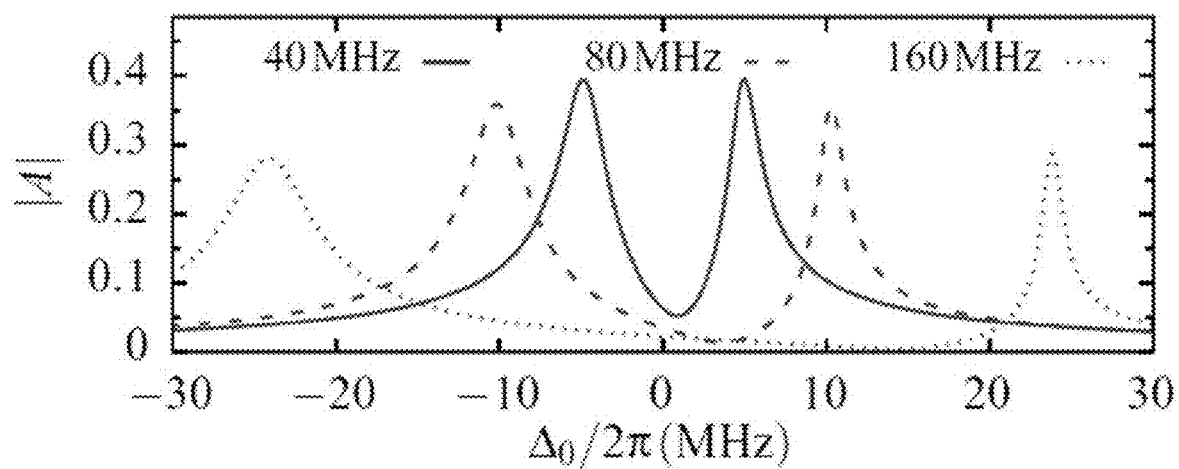
FIG. 19 shows cavity transmission $|A|$ as a function of $\Delta_0$ close to the resonant field for different values of the charge-cavity coupling $g_c/2\pi=\{40,80,160\}$ MHz.

FIG. 19 shows cavity transmission |A| as a function of $\Delta_0$ close to the resonant field for different values of the charge-cavity coupling $g_c/2\pi=\{40, 80, 160\}$ MHz. The magnetic field has been slightly detuned from the resonance condition to make the relative heights of the vacuum Rabi split modes the same. The rest of the parameters are $t_c=15.4$ μeV, $\epsilon=0$, $B_x=1.62$ μeV, $\gamma_c/2\pi=100$ MHz, $g_c/2\pi=40$ MHz, $\kappa/2\pi=1.77$ MHz, and $\omega_c/2\pi=5.85$ GHz≈24 μeV.

In the present discussion, a three-level system is at issue, where the spin-photon coupling is mediated by the spin-charge hybridization. The three-level system structure explains not only the interference but also why the width and position of the two resonance peaks in FIG. 18C is slightly asymmetric. As expected, this asymmetry is more apparent as $g_c$ increases, which is shown in FIG. 19. As described further herein, the problem can be reduced to an equivalent two-level system to be able to characterize the spin-photon coupling within the standard formalism utilized for the Jaynes-Cummings model.

The estimated value of the spin decoherence rate induced by the spin-charge hybridization is of the order $\gamma_s/2\pi \approx (1\text{-}10)$ MHz. Another source of decoherence in Si QDs is the effect of the Si nuclear spins which surround the electron spin. As their evolution is slow compared to the typical time scale of the electronic processes, the nuclear spins effectively produce a random magnetic field which slightly influences the total magnetic field on the DQD. This small perturbation of the magnetic field, $B_z^{tot}=B_z+B_z^{nuc}$, will modify the frequency $\omega_c+\Delta_0$ of the two vacuum Rabi normal modes, as can be extracted from FIG. 18A. The nuclear magnetic field follows a Gaussian distribution with average zero and standard deviation $\sigma^{nuc}$. In this way, a Gaussian profile is superimposed to the Lorentzian profile of the resonances and the final width also depends on $\sigma^{nuc}$. At the point with maximum spin-charge hybridization ($\Omega \approx B_z$), this effect is negligible because the decoherence is dominated by charge decoherence. Away from this point, the two broadening mechanisms have to be combined, resulting in a Voigt profile. The spin dephasing times in natural Si are $\approx 1$ μs, which corresponds approximately to a standard deviation of $\sigma^{nuc}/2\pi \approx 0.3$ MHz for the nuclear magnetic field distribution. According to Eq. (30), the positions of the two vacuum Rabi modes are given by the solutions of the equation $$-\Delta_0 + g_c \, \text{Re}(\chi_{01}d_{01}+\chi_{01}d_{02})=0, \tag{32}$$

where the susceptibilities are a function of $\Delta_0$ via the detunings $\delta_{1(2)}=E_{1(2)}-E_0-\omega_R$ and $\omega_R=\omega_c+\Delta_0$. As the magnetic field created by the nuclear spins is small, one can expand the solutions $\Delta_0^\pm$ to first order to obtain $$\Delta_0^\pm \simeq \Delta_0^\pm(B_z^{nuc}=0) + \frac{\partial \Delta_0^\pm}{\partial B_z}\bigg|_{B_z^{nuc}=0} B_z^{nuc}. \tag{33}$$

Therefore, the broadening of the vacuum Rabi modes due to the nuclear spins is given by $\sigma=|\partial \Delta_0^\pm/\partial B_z|\sigma^{nuc}$ and the total spin decoherence rate is $$\gamma_s^{tot}=\gamma_s/2+\sqrt{(\gamma_s/2)^2+8(\ln 2)\sigma^2}. \tag{34}$$

The long spin dephasing times in Si allow the strong-coupling regime to be reached approximately at the same working points. For instance, for a tunnel coupling $t_c \approx 15$ μeV, the estimated spin dephasing rate induced by charge hybridization is $\gamma_s/2\pi \approx 2$ MHz and the broadening due to the nuclear spins is given by $\sigma/2\pi \approx 0.14$ MHz; therefore, $\gamma_s^{tot}/2\pi \approx 2$ MHz.

F. Two-level equivalent system. To reduce the problem to a two-level system, it is more convenient to work in the orbital basis. Using the relations in Eqs. (A8) and (A9) the QLEs can be rewritten in terms of the operators a, $\sigma_\tau=|-,\downarrow\rangle\langle+,\uparrow|$ and $\sigma_s=|-,\downarrow\rangle\langle-,\uparrow|$. Neglecting input noise terms for the charge relaxation which will be irrelevant for our linear response theory, these equations read $$\dot{a} = i\Delta_0 a - \frac{\kappa}{2}a + \sqrt{\kappa_1}\, a_{in,1} + ig_c\cos\theta\sigma_\tau, \tag{35}$$

$$\dot{\sigma}_t = -i\Delta_\tau \sigma_\tau - \gamma_c \sigma_\tau + ig_c\cos\theta a$$

$$+i\frac{B_x\cos\theta}{2}\sigma_s, \tag{36}$$

$$\dot{\sigma}_x = -i\Delta_s \sigma_s + i\frac{B_x\cos\theta}{2}\sigma_\tau, \tag{37}$$

where $$\Delta_{\tau(s)} = \pm\frac{\Omega-B_z}{2}-E_0-\omega_R.$$

As evident from these equations, although the electric field of the cavity only couples to the charge excitation, the spin-charge hybridization generates an effective spin-photon coupling.

Solving Eq. (36) for the steady state one can obtain the bright (B) mode that mediates this coupling, $$\sigma_B = \frac{-2\cos\theta(\Delta_\tau - i\gamma_c)}{\sqrt{4g_c^2+B_x^2}}\overline{\sigma}_\tau = \sin\alpha\sigma_1 + \cos\alpha a, \tag{38}$$

where is introduced the angle $$\alpha = \arctan\frac{B_x}{2g_c}.$$

For the Eqs. (35) and (37), the reduced dynamics include $$\dot{a} = i(\Delta_0 + \Delta_\tau\eta\cos^2\alpha)a - \frac{\kappa'}{2}a + \sqrt{\kappa_1}\,a_{in,1} + i\sin\alpha\cos\alpha\eta(\Delta_\tau + i\gamma_c)\sigma_s, \tag{39}$$

$$\dot{\sigma}_s = -i(\Delta_s - \Delta_\tau\eta\sin^2\alpha)\sigma_s - \gamma_s\sigma_s + i\sin\alpha\cos\alpha\eta(\Delta_\tau + i\gamma_c)a, \tag{40}$$

with $$\eta = \frac{B_x^2/4 + g_c^2}{\Delta_\tau^2 + \gamma_c^2} + \cos^2\theta,$$

and effective decay rates $$\kappa' = \kappa + 2\gamma_c\eta\cos^2\alpha = \kappa + 2\gamma_c\frac{g_c^2\cos^2\theta}{\Delta_\tau^2+\gamma_c^2}, \tag{42}$$

$$\gamma_s = \gamma_c\eta\sin^2\alpha = \frac{\gamma_c}{4}\frac{B_x^2\cos^2\theta}{\Delta_\tau^2+\gamma_c^2}. \tag{43}$$

According to the derivation in the "CHARACTERIZATION OF THE SPIN-PHOTON COUPLING" section below, the resonance condition reads $$(\Delta_s + \Delta_0)^{res} = -\Delta_\tau\eta\frac{2\gamma_c\eta + \kappa\cos 2\alpha}{\kappa + 2\gamma_c\eta\cos 2\alpha}, \tag{44}$$

and strong coupling is achieved for $$g_s > \Gamma \equiv \frac{|\kappa + 2\gamma_c\eta\cos 2\alpha|}{2\sqrt{2}\sqrt{\frac{4\gamma_c^2\eta^2+4\gamma_c\eta\kappa\cos 2\alpha+\kappa^2}{4\gamma_c^2\eta^2+4\gamma_c\eta\kappa\cos^2\alpha+\kappa^2}}}, \tag{45}$$

where $g_s$ is defined as $$g_s = |\Delta_\tau|\eta\sin\alpha\cos\alpha = |\Delta_\tau|\frac{B_\chi g_c \cos^2\theta}{2(\Delta_\tau^2 + \gamma_c^2)}. \tag{46}$$

Figure 20:
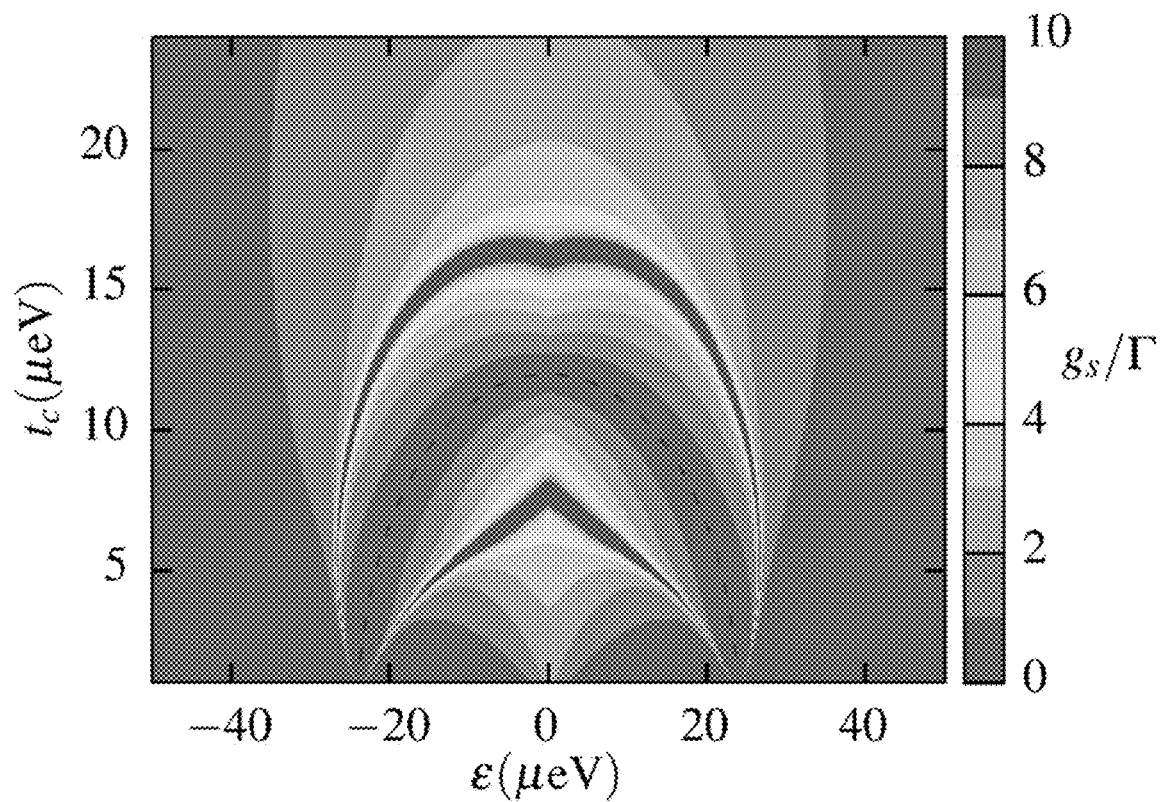
FIG. 20 shows strength of an example spin-cavity coupling.

FIG. 20 shows strength of the spin-cavity coupling $g_s/\Gamma$ according to Eq. (45) as a function of $t_c$ and $\epsilon$. $B_z$ has been adjusted to the resonance condition Eq. (44). Note that the strong-coupling regime ($g_s/\Gamma>1$) is achieved away from the black dashed line, $\Omega=\omega_c=24$ µeV, in agreement with FIG. 16B. The other parameters are $B_\chi=1.62$ µeV, $\gamma_c/2\pi=(100+150|\sin\theta|)$ MHz, $g_c/2\pi=40$ MHz, and $\kappa/2\pi=1.77$ MHz.

In FIG. 20, a map is shown of the coupling strength via the quantity $g_s/\Gamma$, with the magnetic field adjusted to the resonance condition. This map indicates the optimum working points that create a strong spin-photon interaction that overcomes the decoherence.

In conclusion, the conditions for achieving strong coupling between a single electron spin and a microwave cavity photon are shown, which allow long distance spin-spin coupling and long-range spin-qubit gates. Nonlocal quantum gates may also facilitate quantum error correction within a fault-tolerant architecture.

The analysis on the dynamics of the full hybrid silicon-cQED system confirms that, with the recent advances in Si DQDs fabrication and control, a spin-photon coupling of more than 10 MHz with a sufficiently low spin decoherence rate is achievable with this setup, potentially allowing the strong-coupling regime. In such a regime, the cavity not only can act as a mediator of spin-spin coupling but also enables cavity-based readout of the spin qubit state. Interestingly, the strong-coupling regime for the spin-cavity coupling may be attained even when the coupling strength of the charge-cavity coupling cannot overcome the charge decoherence rate.

Although here the discussion in this section has focused on the coupling of a single electron spin to a single photon, the implementation of proposals for other types of spin qubits with more than one electron is feasible with the present technology in Si QDs.

Decoherence Model

It is assumed that the charge relaxation processes dominates over direct spin relaxation. The most relevant sources of decoherence in the present system are charge relaxation effects due to the phonon environment ($\gamma_1$) and dephasing due to charge noise ($\gamma_\phi$); therefore, the Liouvillian can be written as $$\mathcal{L}_{ph}\rho = \frac{\gamma_1}{2}(2\sigma_-\rho\sigma_+ - \sigma_+\sigma_-\rho - \rho\sigma_+\sigma_-) + \frac{\gamma_\phi}{4}(2\sigma_z\rho\sigma_z - \sigma_z\sigma_z\rho - \rho\sigma_z\sigma_z), \tag{A1}$$

where $\sigma_\pm = |\pm\rangle\langle\mp|$ and $\sigma_z = |+\rangle\langle +| - |-\rangle\langle -|$. (Note that in this section the Pauli operators $\sigma\alpha$ are in the basis of bonding and antibonding states, $|\pm\rangle$, instead of left and right.)

The interaction Hamiltonian for charge decays can be written as $$H_{ph} = \sum_k c_k(|+\rangle\langle -|b_k^\dagger + |-\rangle\langle +|b_k), \tag{A2}$$

where $b_k$ annihilates a phonon in mode k. Therefore, the relaxation rate at zero temperature can be obtained using Fermi's golden rule, $$\gamma_1 = \frac{2\pi}{\hbar}\sum_f |\langle f|\langle -|H_{ph}|+\rangle|0\rangle|^2 \delta(\Omega - E_f), \tag{A3}$$

where $|0\rangle$ and $|f\rangle$ are the initial phonon vacuum and single-phonon final states, $\Omega$ is the orbital energy ($\Omega=\sqrt{\epsilon^2+4t_c^2}$), and $E_f$ denotes the phonon energy. Substituting Eq. (A2) into Eq. (A3), the result is $$\gamma_1 = \frac{2\pi}{\hbar}\sum_k |c_k|^2 \delta(\Omega - E_k) = \frac{2\pi}{\hbar}|c_k|^2 D(\Omega), \tag{A4}$$

where k is the modulus of the k vector evaluated at the energy $\Omega$. Here, D(E) is the phonon density of states. In general, $\gamma_1$ depends on the parameters $t_c$ and $\epsilon$ both via D($\Omega$) and $c_k$, since k=k($\Omega$). A constant $\gamma_1$ is assumed since it is expected that this approximation will hold in a small transition energy window around the cavity frequency.

The pure dephasing term is due to charge noise in the environment. A contribution to the dephasing rate $\gamma_\phi$ is proportional to the first derivative of the energy transition with respect to $\epsilon$, i.e., $$\gamma_\phi^{(1)} \sim \frac{\partial(E_+ - E_-)}{\partial\epsilon} = \sin\theta, \tag{A5}$$

and therefore is zero at the "sweet spot" $\epsilon=0$. However, as observed in recent experiments, the charge noise at the sweet spot cannot be neglected. To account for this observation, an offset value to $\gamma_\phi$ has been added, which is modeled then as $\gamma_\phi = \gamma_\phi^{(0)} + \gamma_\phi^{(1)}$.

Using the Liouvillian in Eq. (A1), one can calculate the decoherence dynamics for the mean value of any operator as $\langle \dot{A}\rangle = \text{tr}\{A\mathcal{L}_{ph}\rho\}$. (In the following the brackets are omitted for simplicity.) The coherences decay as $$\dot{\sigma}_\pm = -\gamma_c\sigma_\pm = -\left(\frac{\gamma_1}{2} + \gamma_\phi\right)\sigma_\pm. \tag{A6}$$

In this discussion, the spin degree of freedom is included and spin-independent rates are assumed. In the main discussion above, it was defined $\sigma_\tau = |-\rangle\langle +|$, $\downarrow\rangle\langle +|$, $\downarrow|$ and $\sigma_s = |-\rangle\langle +|$, $\downarrow\rangle\langle +|$, $\uparrow|$. While $\sigma_\tau$ decays as $\dot{\sigma}_\tau = -\gamma_c\sigma_\tau$, the same type of calculation taking into account the spin reveals $\dot{\sigma}_s = 0$. The decoherence part of the dynamics entering in Eq. (5) is obtained via a rotation of the previous uncoupled equations into the eigenbasis of $H_0$, which results in $$\dot{\sigma}_{nm} \sum_{n',m'} \gamma_{nm,n'm'} 0_{n'm'}. \tag{A7}$$

From the form of the eigenstates in the bonding-antibonding basis [Eqs. (13) to (16)], one can determine the effect of charge dephasing in the eigenbasis of $H_0$. Since $$\sigma_{01} \simeq \cos\frac{\Phi}{2}\sigma_s + \sin\frac{\Phi}{2}\sigma_\tau, \tag{A8}$$

$$\sigma_{02} \simeq \sin\frac{\Phi}{2}\sigma_s - \cos\frac{\Phi}{2}\sigma_\tau, \tag{A9}$$

the decoherence dynamics can be expressed as $$\begin{pmatrix}\dot\sigma_{01}\\\dot\sigma_{02}\end{pmatrix} \simeq -\gamma_c \begin{pmatrix} \sin^2\frac{\Phi}{2} & -\frac{\sin\Phi}{2} \\ -\frac{\sin\Phi}{2} & \cos^2\frac{\Phi}{2} \end{pmatrix}\begin{pmatrix}\sigma_{01}\\\sigma_{02}\end{pmatrix}. \tag{A10}$$

Note also that $\sigma_{03} \simeq |-, \downarrow\rangle\langle+, \uparrow|$; therefore, its decoherence is decoupled from the other transitions, $\dot\sigma_{03} \simeq (\gamma_1+\gamma_\phi)\sigma_{03}/2$.

Multilevel RWA

The time-dependent equations of motion, Eqs. (4) and (5), can be solved within a rotating-wave-approximation (RWA) if the driving frequency is close to the transition energies of the system. Defining $\tilde\sigma_{n,n+j}=\sigma_{n,n+j}e^{i\omega_R t}$ for j>0, these equations include both time-independent terms and terms which oscillate at frequency $2\omega_R$, $$\dot a = i\Delta_0 a - \frac{\kappa}{2}a + \sqrt{\kappa_1}\,a_{in,1} + \sqrt{\kappa_2}\,a_{in,2} - \tag{B1}$$

$$ig_c\sum_{n=0}^{2}\sum_{j=1}^{3-n} d_{n,n+j}\tilde\sigma_{n,n+j} - ig_c\sum_{n=1}^{3}\sum_{j=1}^{n} d_{n,n-j}\tilde\sigma_{n,n-j}e^{2i\omega_R t},$$

$$\dot{\tilde\sigma}_{n,n+j} = -i(E_{n+j} - E_n - \sigma_R)\tilde\sigma_{n,n+j} - \tag{B2}$$

$$\sum_{n',j'} \gamma_{a,n+1,n,n'+i}\tilde\sigma_{n',n'+j'} - \sum_{n',j'} \gamma_{n,n+j,n',n'-j'}e^{2i\omega_R t}\tilde\sigma_{R',n'-j'} +$$

$$\sqrt{2\gamma}\,\mathcal{F}e^{i\omega_g t} - ig_c(a + a^\dagger e^{2i\omega_g t})d_{n+j,n}\delta_{n,0}.$$

Here, j,j'>0. The RWA consists in neglecting the fastoscillating, i.e., counter-rotating terms. For the mean value of the operators and using $\sigma_{n,n+j}$ instead of $\tilde\sigma_{n,n+j}$ to simplify the notation, the equations in the RWA read $$\dot a = i\Delta_0 a - \frac{\kappa}{2}a + \sqrt{\kappa_1}\,a_{in,1} - ig_c\sum_{n=0}^{2}\sum_{j=1}^{3-n} d_{n,n+j}\sigma_{n,n+j}, \tag{B3}$$

$$\dot\sigma_{n,n+j} = \tag{B4}$$

$$-i(E_{n+j} - E_n - \omega_R)\sigma_{n,n+j} - \sum_{n',j'}\gamma_{n,n+j,n',n'+j'}\sigma_{n',n'+j'} - ig_c a d_{n+j,n}\delta_{a0},$$

since $\langle a_{in,2}\rangle=0$ and $\langle \mathcal{F}\rangle=0$. In the equations, as in the main discussion above, the brackets are omitted for simplicity.

General Magnetic Field Gradient Direction

In the discussion above, it has been assumed that the micromagnet in a given external magnetic field introduces a gradient of the magnetic field in a perpendicular direction between the positions of the two quantum dots. In a more realistic situation, the micromagnet could also introduce a net magnetic field in this perpendicular direction or a gradient in the direction of the external magnetic field. These situations can be described in a general way with a model Hamiltonian like the one presented in the discussion above [Eq. (1)] plus a contribution corresponding to a magnetic field gradient in z direction between the two quantum dots, i.e., $H_0'=H_0+\Delta_z\sigma_z\tau_z/2$.

Analogous to Eq. (8), in the product basis of antibonding and bonding orbitals ± with spin $\uparrow\downarrow$ in the z direction, $\{|+, \uparrow\rangle, |-, \uparrow\rangle, |+, \downarrow\rangle, |-, \downarrow\rangle\}$, the Hamiltonian reads $$H_0'^{orb} = \tag{C1}$$

$$\frac{1}{2}\begin{pmatrix} \Omega_+\cos\alpha_+ + B_z & -\Omega_+\sin\alpha_+ & B_x\sin\theta & -B_x\cos\theta \\ -\Omega_+\sin\alpha_+ & -\Omega_+\cos\alpha_+ + B_z & -B_x\cos\theta & -B_x\sin\theta \\ B_x\sin\theta & -B_x\cos\theta & \Omega_-\cos\alpha_- - B_z & \Omega_-\sin\alpha_- \\ -B_x\cos\theta & -B_x\sin\theta & \Omega_-\sin\alpha_- & -\Omega_-\cos\alpha_- - B_z \end{pmatrix},$$

where it is defined the two different orbital energies $\Omega_\pm=\sqrt{4t_c^2(\epsilon\pm\Delta_z)^2}$ and the angles $$\alpha_\pm = \arctan\frac{2t_c\Delta_z}{4t_c^2 + \epsilon(\epsilon\pm\Delta_z)}. \tag{C2}$$

As expected, the parallel gradient $\Delta_z$ couples bonding and antibonding states with the same spin. Now, a rotation can be applied to the orbital states from $\{|+, \sigma\rangle, |-, \sigma\rangle\}$ to the new $\{|+', \sigma\rangle, |-', \sigma\rangle\}$ such that $$H_0'^{orb} = \frac{1}{2}\begin{pmatrix} \Omega_+ + B_z & 0 & B_x\sin\left(\theta + \frac{\alpha_+-\alpha_-}{2}\right) & -B_x\cos\left(\theta + \frac{\alpha_+-\alpha_-}{2}\right) \\ 0 & -\Omega_+ + B_z & -B_x\cos\left(\theta + \frac{\alpha_+-\alpha_-}{2}\right) & -B_x\sin\left(\theta + \frac{\alpha_+-\alpha_-}{2}\right) \\ B_x\sin\left(\theta + \frac{\alpha_+-\alpha_-}{2}\right) & -B_x\cos\left(\theta + \frac{\alpha_+-\alpha_-}{2}\right) & \Omega_- - B_z & 0 \\ -B_x\cos\left(\theta + \frac{\alpha_+-\alpha_-}{2}\right) & -B_x\sin\left(\theta + \frac{\alpha_+-\alpha_-}{2}\right) & 0 & -\Omega_- - B_z \end{pmatrix}. \tag{C3}$$

Therefore, under approximately the same conditions as in the case of the discussion above, the eigenstates can be approximated by $$|1\rangle \simeq \cos\frac{\Phi'}{2}|-', \uparrow\rangle + \sin\frac{\Phi'}{2}|+', \downarrow\rangle, \tag{C4}$$

$$|2\rangle \simeq \sin\frac{\Phi'}{2}|-', \uparrow\rangle - \cos\frac{\Phi'}{2}|+', \downarrow\rangle, \tag{C5}$$

$$|0\rangle \simeq \sin\frac{\Phi}{2}|-', \downarrow\rangle, \tag{C6}$$

$$|3\rangle \simeq |+', \uparrow\rangle, \tag{C7}$$

with the spin-orbit mixing angle $$\Phi' = \arctan\frac{B_x \cos\left(\theta + \frac{\alpha_+ - \alpha_-}{2}\right)}{\frac{\Omega_+ + \Omega_-}{2} - B_z}, \tag{C8}$$

Finally, the relevant dipole matrix elements read $$d_{01} \simeq -\cos(\theta - \alpha_-)\sin\frac{\Phi'}{2}, \tag{C9}$$

$$d_{02} \simeq \cos(\theta - \alpha_-)\cos\frac{\Phi'}{2}. \tag{C10}$$

Figure 21A:
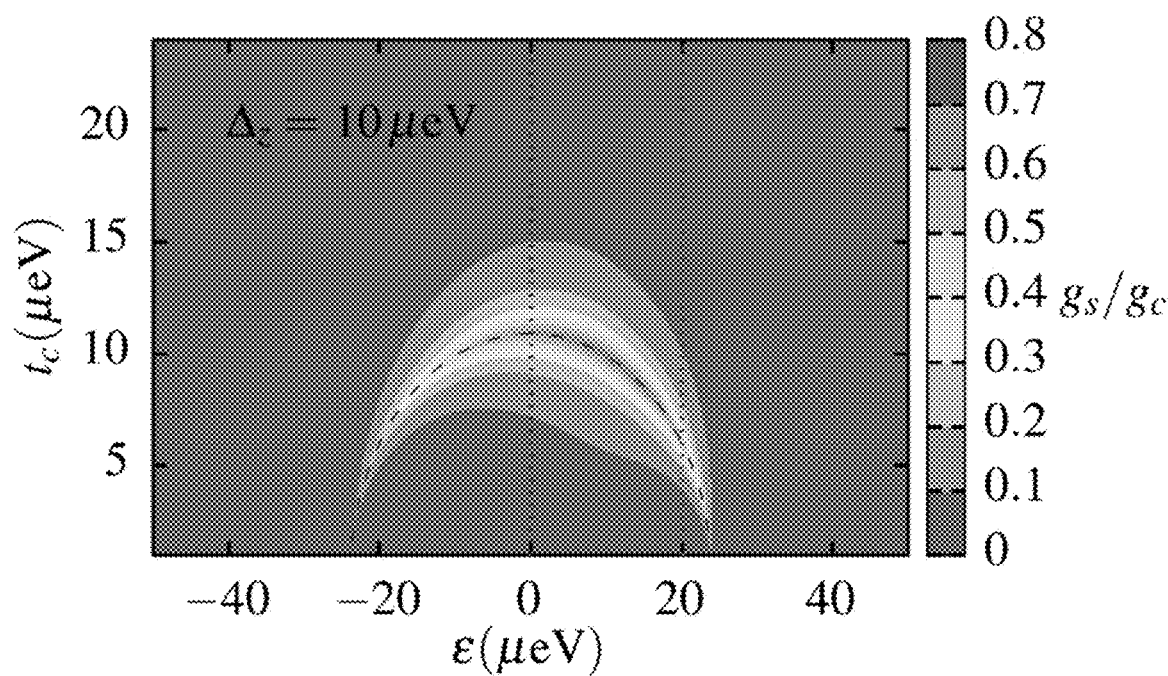
FIG. 21A shows expected spin-photon coupling strength as a function of the DQD detuning and the tunnel coupling.
Figure 21B:
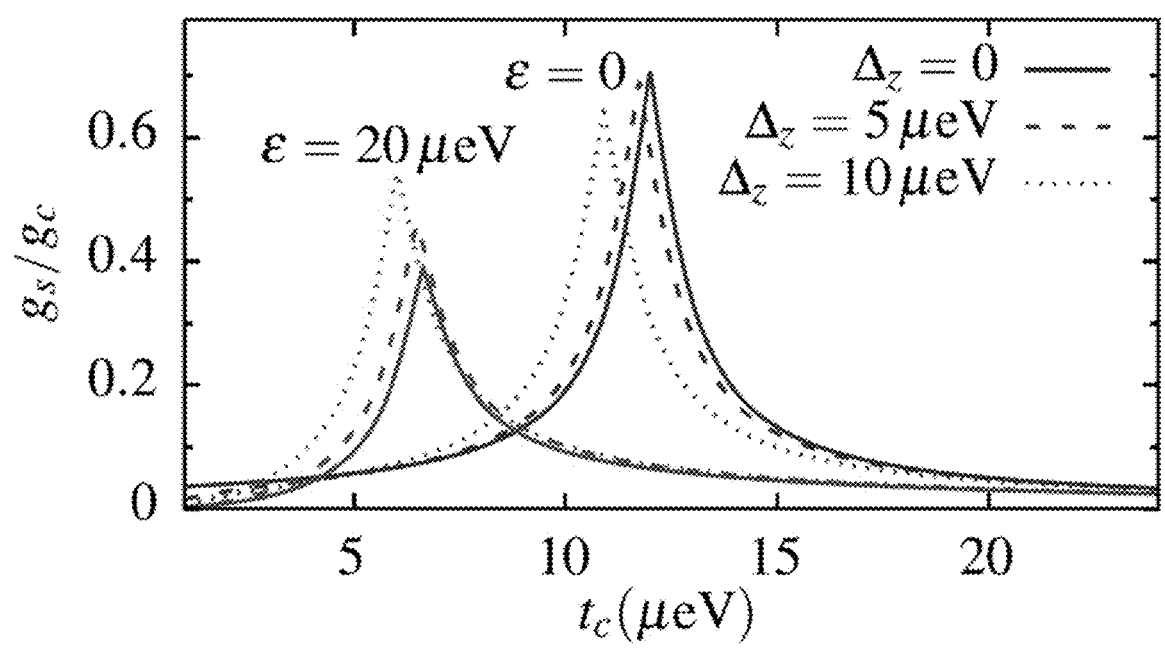
FIG. 21B shows cavity transmission $|A|$ as a function of $\Delta_0$.

In FIGS. 21A-B, the expected spin-photon coupling strength is represented as a function of the DQD detuning and the tunnel coupling. As compared to FIG. 16A, the map in FIG. 21A is distorted due to the introduced asymmetry, but importantly a strong coupling can be also achieved, even for a large value of $\Delta_z$.

Characterization of the Spin-Photon Coupling

The calculation of the strong-coupling condition for a two-level equivalent system is described in this section. For this, first is analyzed the simpler case of a Jaynes-Cummings model, often studied in the literature. This model describes the interaction of a two-level system (TLS) to a photonic mode in a cavity in the RWA. The Hamiltonian reads H=$-\Delta_0 a^\dagger a + \Delta_{JC}\sigma_z - g_{JC}(a^\dagger \sigma_- + a\sigma^+)$, where $\Delta_0$ is the detuning between the driving and the cavity and $\Delta_{JC}$ the detuning between the TLS and the driving. The TLS decoherence rate is $\gamma_{JC}$ and the cavity decay rate is K. If the transition energy of the two-level system is near the cavity frequency, one can probe the coherent light-matter interaction by driving the cavity close to resonance and observing resonances coming from the hybridized one-excitation light-matter states, superpositions of the excited states $\{|0,n+1\rangle, |1, n\rangle\}$, where n is the number of photons in the cavity and 0(1) the two-level state. However, this is only observable if the coupling is strong enough in comparison with the decay rates. To determine how strong the coupling should be in order to observe separate resonances, it is useful to diagonalize the non-Hermitian Hamiltonian in the one-excitation subspace containing the decay rates, $$H_{JC} = -\begin{pmatrix} \Delta_0 + i\kappa/2 & g_{JC} \\ g_{JC} & -\Delta_{JC} + i\gamma_{JC} \end{pmatrix}. \tag{D1}$$

The eigenvalues are of the form $$\mu_\pm = A - iB/2 \pm \sqrt{C + iD}, \tag{D2}$$

with A, B, C, D all real. A can be seen to be the average frequency of the system, while B is the average damping. However, the C and D terms are more subtle. The strong-coupling condition is defined as having a sufficiently large interaction such that two separated peaks are observable in the photon response ($C > B^2/4$) and system modes that are near equal combinations of matter and light ($C > 0$, $D=0$), which occurs when $\Delta_0 = -\Delta_{JC}$. If this is the case, the combined condition is $$g_{JC} > \sqrt{\frac{\gamma_{JC}^2 + (\kappa/2)^2}{2}}, \tag{D3}$$

which reduces to the usual $g_{JC} > \gamma_{JC}$, K/2 for $2\gamma_{JC} \approx K$.

FIG. 21A shows expected effective coupling $g_s/g_c = |d_{01(2)}|$, according to Eqs. (C9) and (C10) as a function of tc and $\epsilon$. The black dashed line corresponds to $\Omega_+ + \Omega_- = 2B_z$ and separates the region where $g_s/g_c = |d_{0,1}|$ (above) from the region where $g_s/g_c = |d_{0,2}|$ (below). FIG. 21B shows vertical cuts for $\epsilon=0$ (black) and $\epsilon=20$ µeV (blue) for different values of $\Delta_z$. Chosen values include $B_x$, 1.62 µeV, $B_z=24$ µeV and the values of $\Delta_z$ indicated on the figures.

Let us now consider weak versus strong coupling for the two-level equivalent system, whose interaction is described by Eqs. (39) and (40). In the one-excitation subspace, the effective non-Hermitian Hamiltonian reads $$H_{eff} = -\begin{pmatrix} \Delta_0 + i\kappa'/2 & 0 \\ 0 & -\Delta_s + i\gamma_s \end{pmatrix} - \eta\begin{pmatrix} \Delta_\tau \cos^2\alpha & (\Delta_\tau + i\gamma_c)\sin\alpha\cos\alpha \\ (\Delta_\tau + i\gamma_c)\sin\alpha\cos\alpha & \Delta_\tau \sin^2\alpha \end{pmatrix}. \tag{D4}$$

The eigenvalues of this Hamiltonian have the same form; therefore, resonance can be defined as D=0 and strong coupling as $C > B^2/4$, as above. First is examined the on-resonance condition. The detuning for resonance is $$(\Delta_s + \Delta_0)^{res} = -\Delta_\tau \eta \frac{2\gamma_c \eta + \kappa \cos 2\alpha}{\kappa + 2\gamma_c \eta \cos 2\alpha}. \tag{D5}$$

This value corresponds to setting the detuning to match the (quantum) "Stark shifted" response of the spin and the photon. If one does not choose the detunings such that D=0, then the two vacuum Rabi-split peaks will have different linewidths. A modification of the strong-coupling condition is also found. This arises for $$g_s > \Gamma \equiv \frac{|\kappa + 2\gamma_c \eta \cos 2\alpha|}{2\sqrt{2}\sqrt{\frac{4\gamma_c^2\eta^2 + 4\gamma_c\eta\kappa\cos 2\alpha + \kappa^2}{4\gamma_c^2\eta^2 + 4\gamma_c\eta\kappa\cos^2\alpha + \kappa^2}}} \tag{D6}$$

with the definition $$g_s = |\Delta_\tau|\eta\sin\alpha\cos\alpha = |\Delta_\tau|\frac{B_x g_c \cos^2\theta}{2(\Delta_\tau^2 + \gamma_c^2)}. \tag{D7}$$

Third Section: Long-Range Microwave Mediated Interactions Between Electron Spins Nonlocal qubit interactions are a hallmark of advanced quantum information technologies. The ability to transfer quantum states and generate entanglement over distances much larger than qubit length scales greatly increases connectivity and is an important step towards maximal parallelism and the implementation of two-qubit gates on arbitrary pairs of qubits. Qubit coupling schemes based on cavity quantum electrodynamics also offer the possibility of using high quality factor resonators as quantum memories. Extending qubit interactions beyond the nearest neighbor is particularly beneficial for spin-based quantum computing architectures, which are limited by short-range exchange interactions. Despite rapidly maturing device technology for silicon spin qubits, experimental progress towards achieving long-range spin-spin coupling has so far been restricted to interactions between individual spins and microwave photons. Here is demonstrated microwave-mediated spin-spin coupling between two electrons that are physically separated by more than 4 mm. An enhanced vacuum Rabi splitting is observed when both spins are tuned into resonance with the cavity, indicative of a coherent spin-spin interaction. The results demonstrate that microwave-frequency photons can be used as a resource to generate long-range two-qubit gates between spatially separated spins.

Figure 22A:
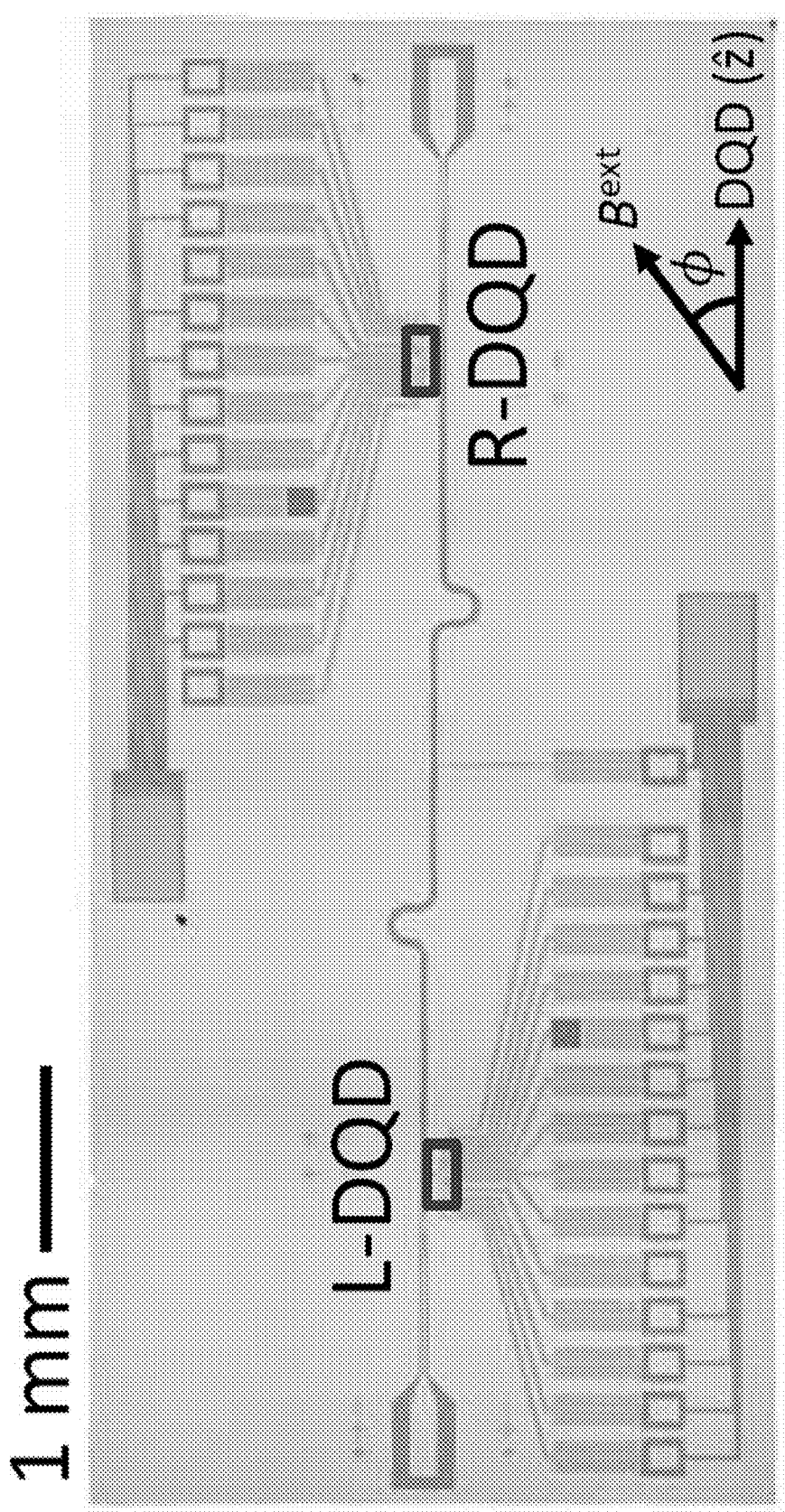
FIG. 22A shows an example optical micrograph of the superconducting cavity containing two single electron DQDs.
Figure 22B:
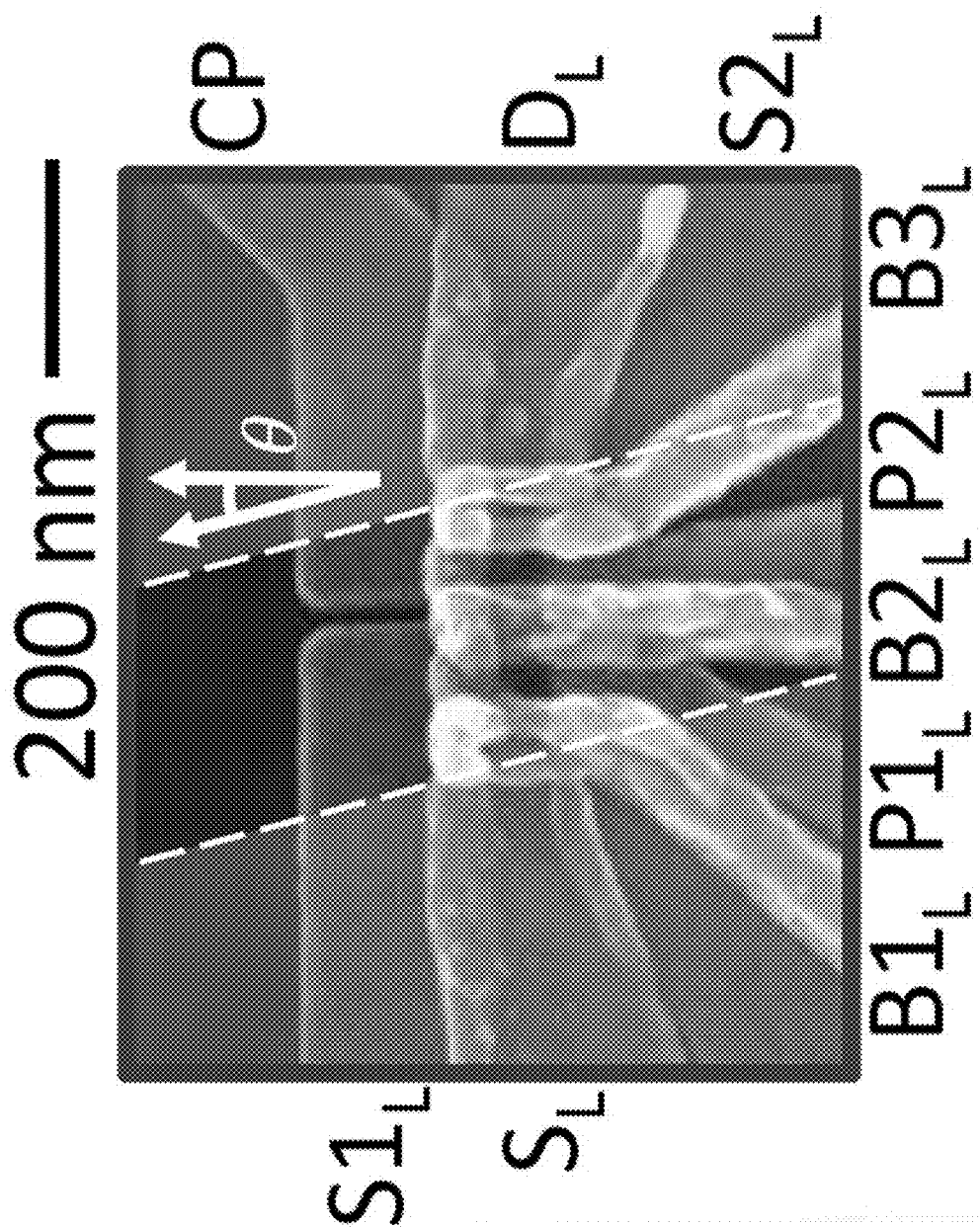
FIG. 22B shows an example false-color scanning electron microscope image of the L-DQD.

The devices studied in this example comprise (e.g., or consist of) two double quantum dots (DQDs), denoted L-DQD and R-DQD, that are fabricated on a Si/SiGe heterostructure and positioned at the antinodes of a half-wavelength Nb superconducting cavity (FIG. 22A). Device 1 is fabricated on a nat-Si quantum well and has a cavity center frequency $f_c=6.745$ GHz and decay rate $\kappa/2\pi=1.98$ MHz. Device 2 utilizes an enriched Si quantum well with an 800 ppm residual concentration of Si. A single electron is isolated in each DQD and interacts with the electric field of the cavity through the electric dipole interaction. The device design uses a split-gate cavity coupler (labelled CP in FIG. 22B) that is galvanically connected to the center pin of the superconducting cavity.

First is demonstrated a strong coupling of a spin trapped in each DQD to a cavity photon. In the example device architecture a large electric dipole coupling rate $g_c/2\pi \approx 40$ MHz is combined with an artificial spin-orbit interaction generated by a micromagnet to achieve spin-photon coupling. To probe spin-photon coupling, the cavity transmission $A/A_0$ is plotted as a function of cavity probe frequency $f$ and $B^{ext}$ in FIG. 22C. The Zeeman splitting increases with the total magnetic field $\vec{B}^{tot}=\vec{B}^{ext}+\vec{B}^M$, where $\vec{B}^{ext}$ is the externally applied field and $\vec{B}^M$ is the stray field of the micromagnet. Field tuning allows bringing each spin into resonance with the cavity photon of energy $hf_c$, where h is Planck's constant. Coherent coupling between the spin trapped in the L-DQD (L-spin) and the cavity photon is observed, as evidenced by the vacuum Rabi splitting, when $B^{ext}=109.1$ mT. Strong spinphoton coupling is achieved with the spin-cavity coupling rate $g_{s,L}/2\pi=10.7\pm0.1$ MHz exceeding the cavity decay rate $\kappa/2\pi=1.98$ MHz and spin decoherence rate $\gamma_{s,L}/2\pi=4.7$ MHz. Likewise, strong spin-photon coupling is observed for the R-spin at $B^{ext}=103.1$ mT with $g_{s,L}/2\pi=12.0\pm0.2$ MHz exceeding $\gamma_{s,L}/2\pi=5.3$ MHz and $\kappa/2\pi$. Factoring in the susceptibility of the micromagnet, $\chi \approx 0.6$, the 6 mT difference in $B^{ext}$ is equivalent to a 268 MHz difference in the spin resonance frequencies and precludes the observation of resonant spin-spin coupling.

Figure 22C:
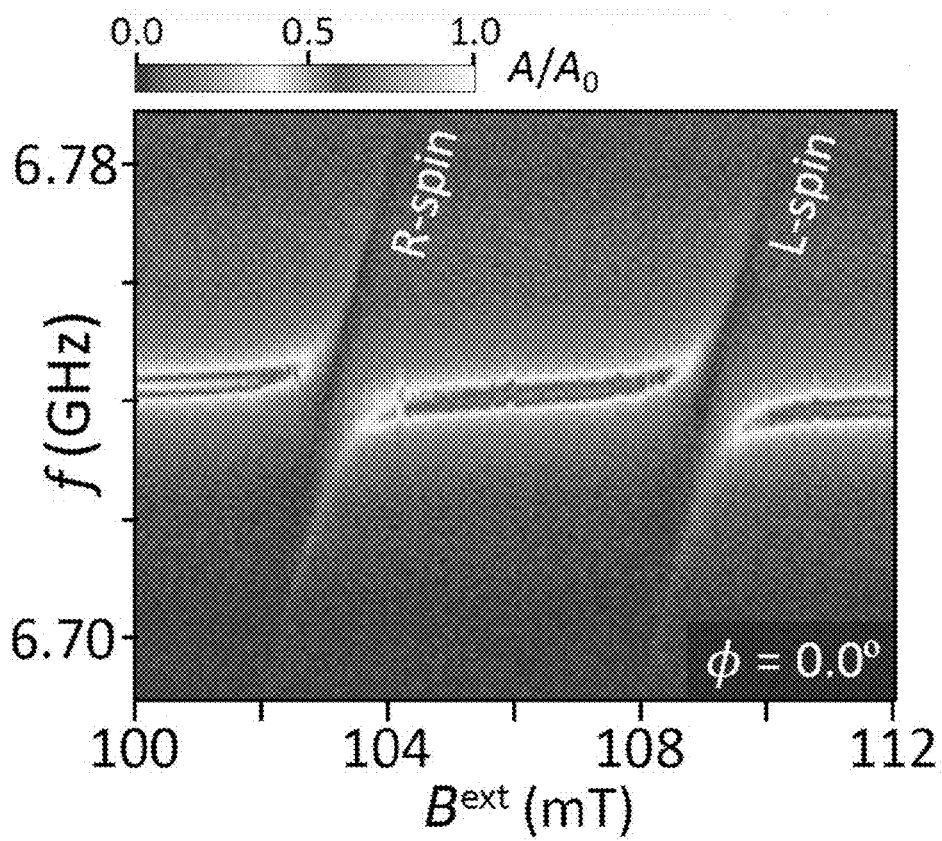
FIG. 22C shows cavity transmission $A/A_0$ as a function of $B^{ext}$ and $f$.
Figure 22D:
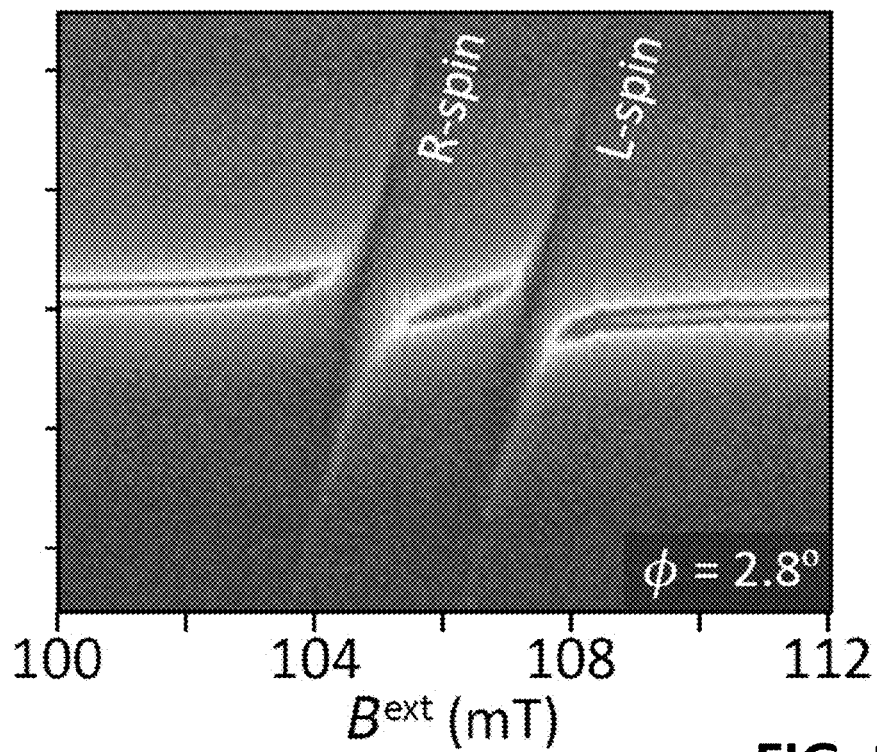
FIG. 22D shows that increasing the field angle to $\phi=2.8°$ dramatically reduces the field separation.

FIG. 22A-D shows an example cavity-coupler for spins. FIG. 22A shows an example optical micrograph of the superconducting cavity containing two single electron DQDs. The electron spin in each DQD is coupled to the cavity through a combination of electric-dipole and artificial spin-orbit interactions. FIG. 22B shows an example false-color scanning electron microscope image of the L-DQD. A double well potential is formed beneath plunger gates P1L and P2L, and the barrier gate B2L is used to adjust interdot tunnel coupling. Spin-orbit coupling is induced by a Co micromagnet (dashed lines). FIG. 22C shows cavity transmission $A/A_0$ as a function of $B^{ext}$ and $f$. Vacuum Rabi splitting, a hallmark of strong coupling, is observed for each spin. For a field angle $\phi=0°$ the R-spin and L-spin resonance conditions are separated by $B^{ext}=6$ mT. FIG. 22D shows that increasing the field angle to $\phi=2.8°$ dramatically reduces the field separation.

To compensate for local differences in the magnetic field, the device was purposely fabricated with the long axis of the Co micromagnets tilted by $\phi=\pm15$ degrees relative to the interdot axis of the DQDs (e.g., FIG. 22B). Because of this intentional asymmetry, adjusting the angle $\phi$ of the in-plane magnetic field relative to the DQD axis provides an additional degree of freedom for simultaneous tuning of both spins into resonance with the cavity. Qualitatively, the high permeability Co micromagnet concentrates the magnetic field lines, leading to a maximum total field when $\vec{B}^{ext}$ is aligned with the long axis of the micromagnet. This technique is well-suited for controlling the spin resonance frequencies in FIG. 1d, where the magnetic field angle is set to $\phi=2.8°$. Here, the R-spin resonance condition shifts up to $B^{ext}=104.7$ mT and the L-spin resonance condition shifts down to $B^{ext}=107.4$ mT.

Figures 23A, 23B:
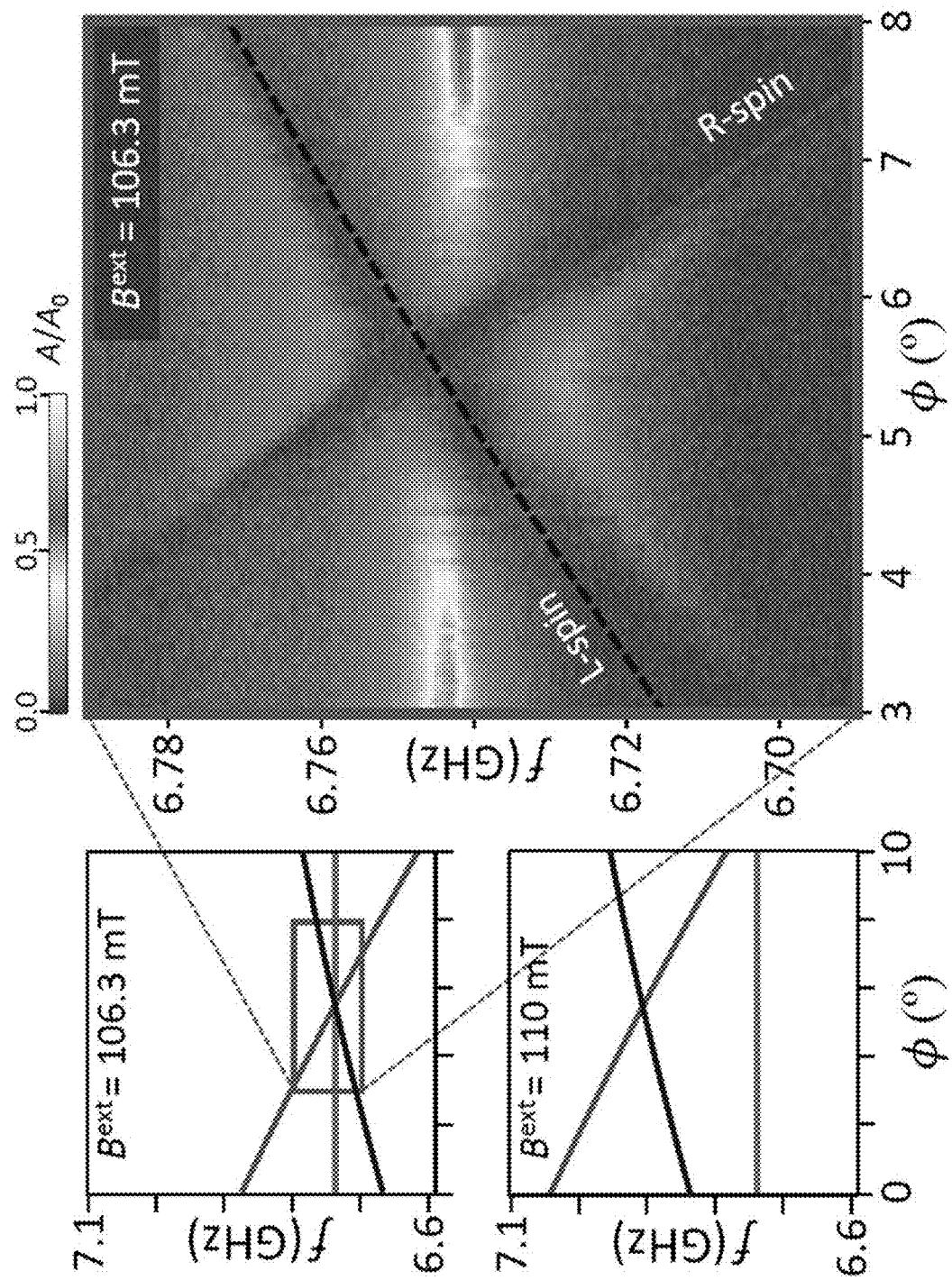
FIG. 23A shows expected spin resonance frequencies as a function of $\phi$ for $B^{ext}=106.3$ mT (top panel) and $B^{ext}=110$ mT (bottom panel).
FIG. 23B shows $A/A_0$ as a function of $f$ and $\phi$ demonstrates simultaneous tuning of both spins into resonance with the cavity at $\phi=5.6°$ and $B^{ext}=106.3$ mT.
Figure 23C:
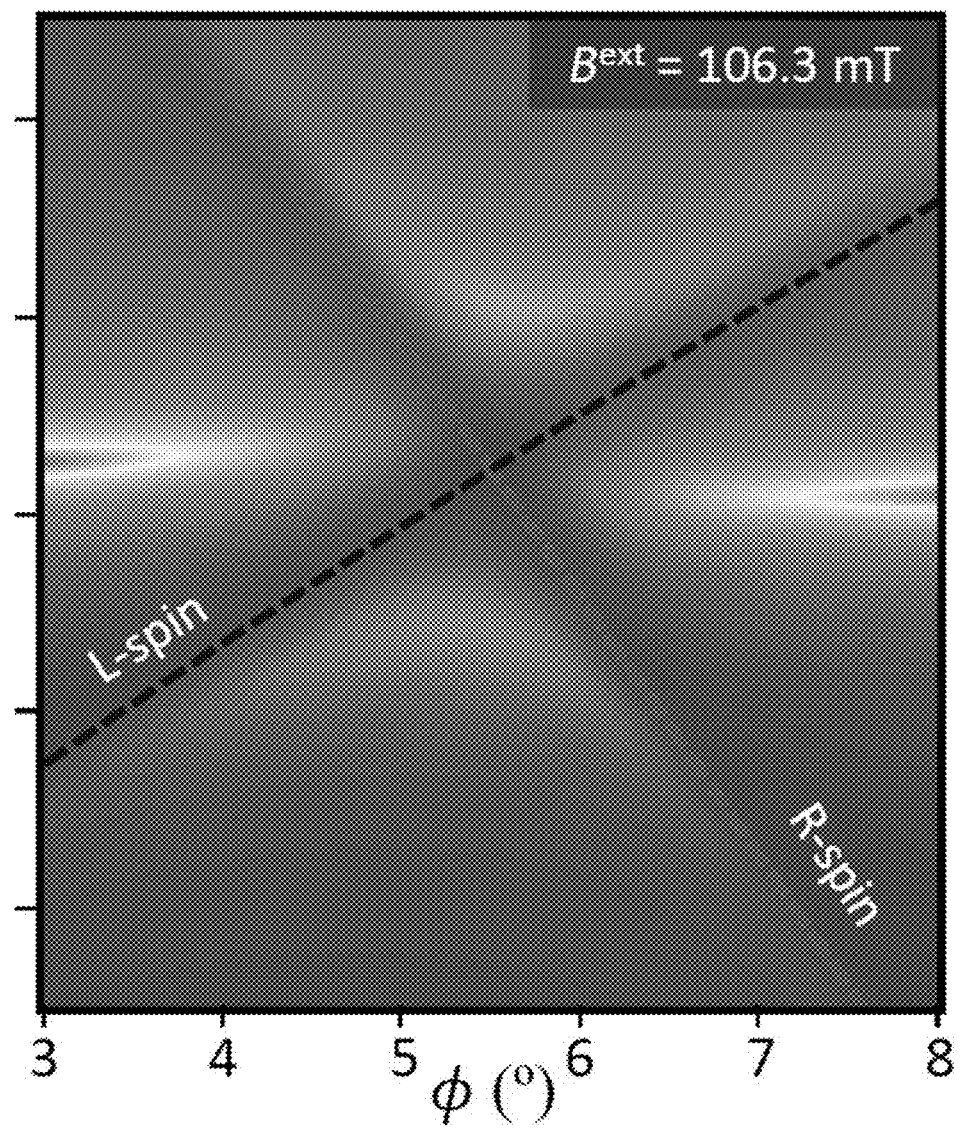
FIG. 23C shows an example theoretical prediction for $A/A_0$.

FIG. 23A shows expected spin resonance frequencies as a function of $\phi$ for $B^{ext}=106.3$ mT (top panel) and $B^{ext}=110$ mT (bottom panel). $B^{ext}$ allows control over both spin frequencies with respect to the cavity, while 0.0 allows control over the spin frequencies with respect to each other. The frequency of the left (right) spin is plotted in blue (purple). FIG. 23B shows $A/A_0$ as a function of $f$ and $\phi$ demonstrates simultaneous tuning of both spins into resonance with the cavity at $\phi=5.6°$ and $B^{ext}=106.3$ mT. Dashed lines indicate left and right spin transition frequencies. FIG. 23C shows an example theoretical prediction for $A/A_0$.

Control over the difference between the spin resonance frequencies is demonstrated by fixing the external magnetic field magnitude $B^{ext}$ and varying the angle $\phi$ of $B^{ext}$ in the plane of the sample. The expected spin resonance frequencies are plotted in FIG. 23A as a function of $\phi$ with $B^{ext}=106.3$ mT (upper panel) and $B^{ext}=110$ mT (lower panel), confirming that these two control parameters will bring the two spins into resonance with the cavity and each other. Based on microwave spectroscopy measurements of the spins, resonance is expected to occur around $\phi=6°$ and $B^{ext}=106.3$ mT. FIG. 23B maps out the field angle dependence of the spin resonance frequencies over a range $\phi=3-8°$ with $B^{ext}=106.3$ mT. The resonance frequency of the R-spin monotonically moves to lower f as $\phi$ is increased, while the L-spin shows the opposite dependence. With $\phi=5.6°$ both spins are tuned into resonance with the cavity. These results are well captured by the theoretical prediction of transmission through the cavity shown in FIG. 23C.

Figure 24A:
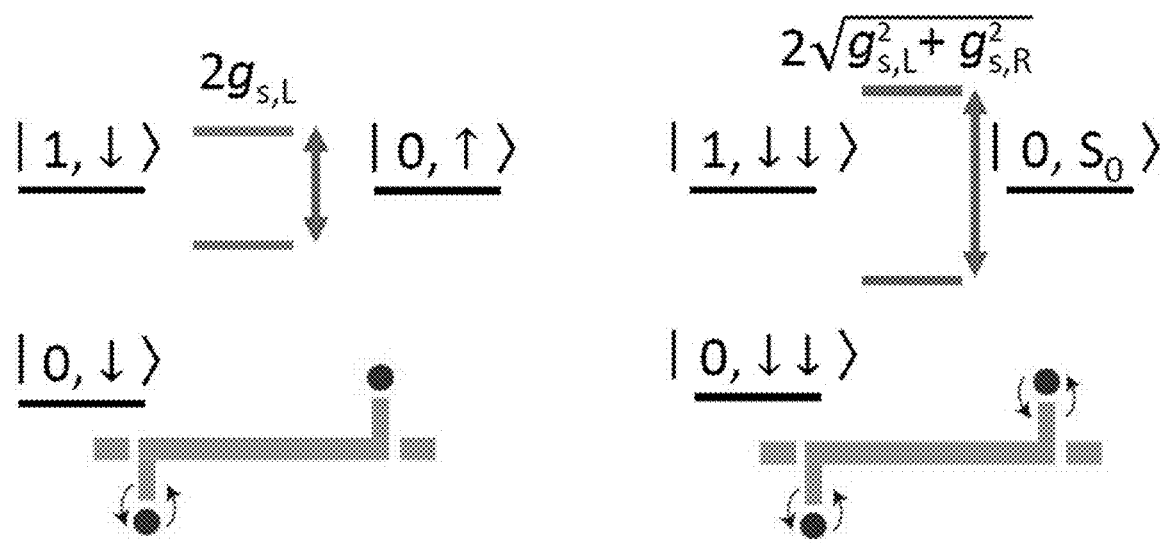
FIG. 24A shows tuning the L-spin into resonance with the cavity results in vacuum Rabi splitting with magnitude $2g_{s,L}$.

The spectrum of the Jaynes-Cummings model for a single spin and a single photon in the cavity is shown in FIG. 24A. With the L-spin tuned into resonance with the cavity, the spin and cavity photon hybridize leading to a vacuum Rabi splitting of magnitude $2g_{s,L}$ in the cavity transmission. In contrast, when both spins are simultaneously tuned into resonance with the cavity, the excited state spectrum of the Jaynes-Cummings model splits into a sub-radiant state and two bright states. For N identical spins the Jaynes-Cummings model predicts a $\sqrt{N}$ enhancement of the coupling rate. In our device geometry, the sub-radiant state is the spin-triplet $|0, T_0\rangle = 1/\sqrt{2}(|0, \uparrow, \downarrow\rangle + |0, \uparrow, \downarrow\rangle)$ because the DQDs are located at opposite ends of the cavity where the electric fields are 180 out of phase. Here, the spin states of the L/R-spin are quantized along their local total magnetic field axis. The bright states are hybridizations between the singlet state $|0, S_0\rangle = 1/\sqrt{2}(|0, \uparrow, \downarrow\rangle + |0, \uparrow, \downarrow\rangle)$ and the state with a single photon $|1, \downarrow, \downarrow\rangle$ that are separated in energy by twice the collectively enhanced vacuum Rabi coupling, $2g_{s,LR} = 2\sqrt{g_{s,L}^2 + g_{s,R}^2}$. Evidence of cavity-mediated single spin coupling is further discussed below.

Figure 24B:
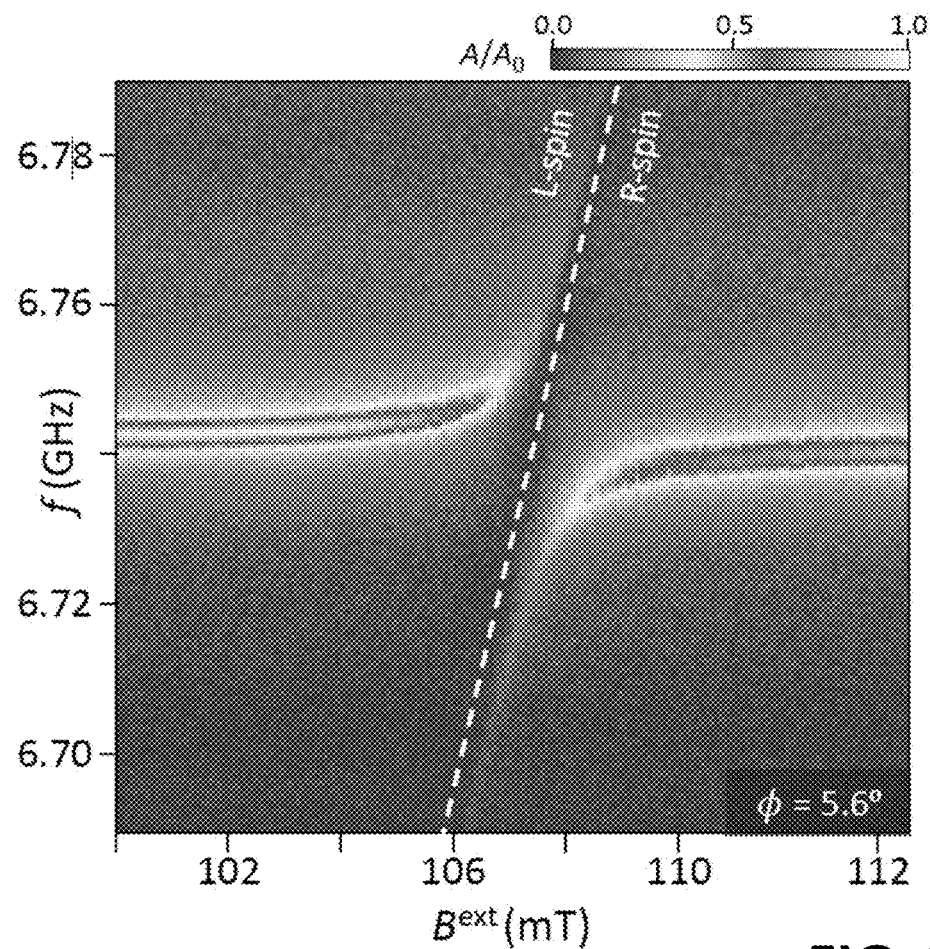
FIG. 24B shows $A/A_0$ as a function of $f$ and $B^{ext}$ with $\phi=5.6°$ indicates an enhanced vacuum Rabi splitting when the L-spin and R-spin are tuned into resonance with the cavity.

FIG. 24B shows $A/A_0$ as a function of $f$ and $B^{ext}$ with $\phi=5.6°$, where both spins are in resonance with the cavity. As $B^{ext}$ is increased, both spins are simultaneously tuned into resonance with the cavity at $B^{ext}=106.3$ mT resulting in observation of an enhancement in the vacuum Rabi splitting relative to the data sets shown in FIGS. 22C-D. The vacuum Rabi splitting is quantitatively analyzed for Device 1 in FIG. 24C and Device 2 in FIG. 24D. These devices have slight differences in gate geometry, and the micromagnets in Device 2 are canted at angles of $\theta = \pm 10$ degrees. In Device 1, $g_{am}$ is extracted by measuring $A/A_0$ at $\phi=5.6°$ and detuning the right/left spin using $\epsilon$. In Device 2, the $g_{s,L/R}$ is extracted by measuring $A/A_0$ at an off-resonant angle, at the now separated resonant fields. For Device 1, a vacuum Rabi splitting of $2g_{s,L}/2\pi = 21.4 \pm 0.2$ MHz is observed when the L-spin is in resonance with the cavity, $2g_{s,R}/2\pi = 24.0 \pm 0.4$ MHz when the R-spin is in resonance with the cavity, and $2g_{s,LR}/2\pi = 30.2 \pm 0.2$ MHz when both spins are in resonance with the cavity. Device 2 shows similar behavior and again exhibits an enhanced vacuum Rabi splitting $2g_{s,LR}/2\pi = 18.4 \pm 0.4$ MHz when both spins are tuned into resonance with the cavity, compared to the individual splittings $2g_{s,L}/2\pi = 13.2 \pm 0.2$ MHz and $2g_{s,R}/2\pi = 12.4 \pm 0.2$ MHz. Combined, these two data sets give strong evidence for microwave assisted spin-spin interactions across a 4 mm length scale that is many orders of magnitude larger than what can be achieved using direct wavefunction overlap. Moreover, these measurements show that both field angle and DQD level detuning can be used to modulate the strength of the spin-spin interactions.

Figure 24C:
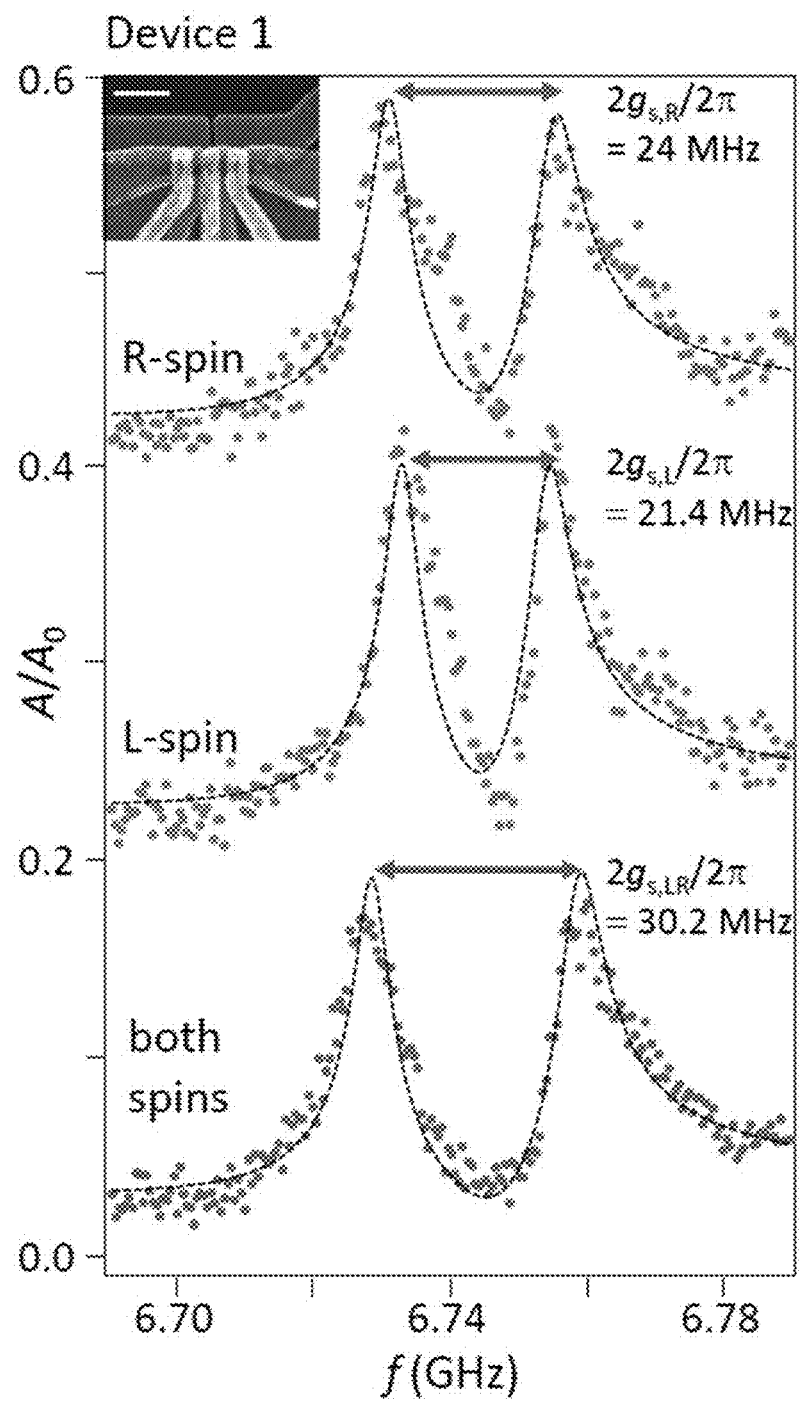
FIG. 24C shows $A/A_0$ as a function of $f$ for the R-spin in resonance (upper curve), L-spin in resonance (middle curve), and both spins in resonance (bottom curve).
Figure 24D:
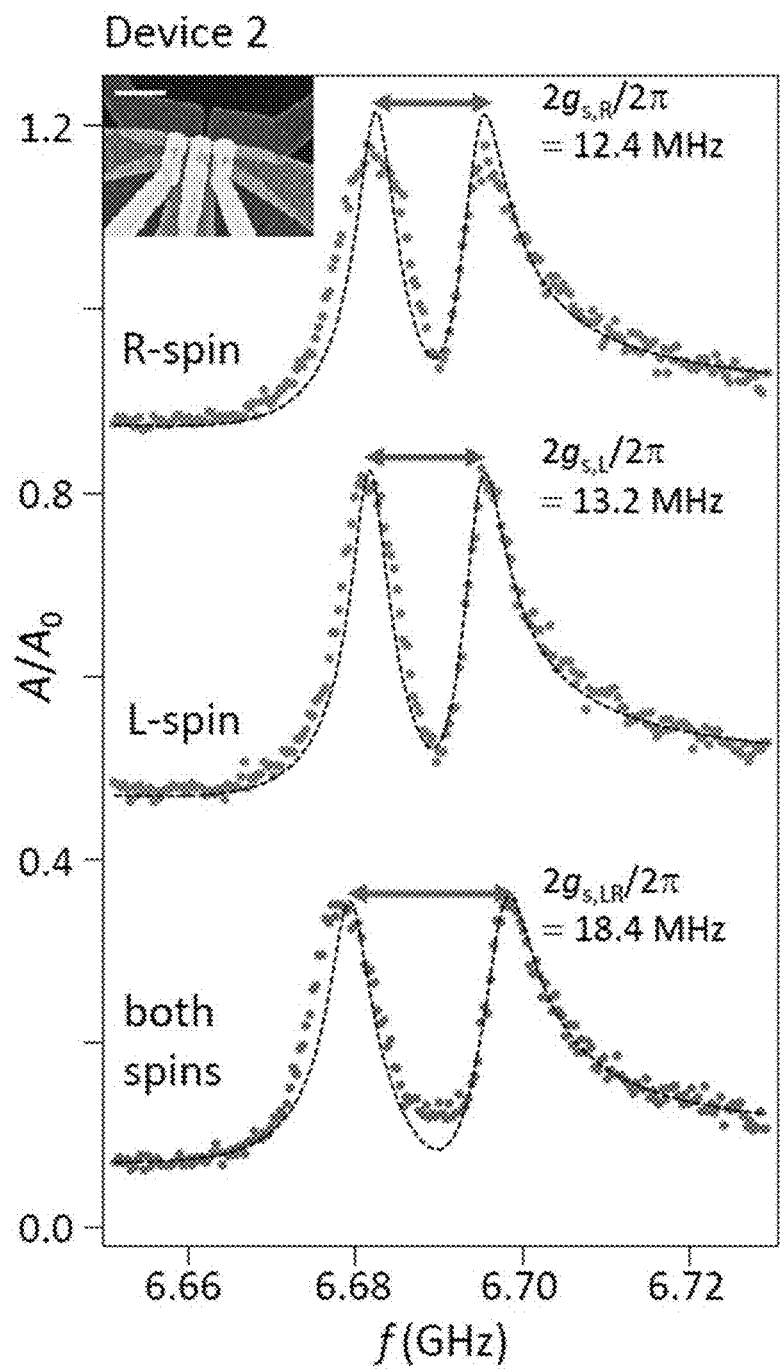
FIG. 24D shows cavity-assisted spin-spin coupling is also observed in a second device with a different gate pattern.

The data in FIGS. 24C-D are fit using a master equation description of the spin-cavity system. The Zeeman splittings $\hbar \omega_{L/R}$ and linewidths $\gamma_{s,L/R}$ are independent measured using microwave spectroscopy. The cavity linewidth $\kappa$, as well as a complex Fano factor q, are obtained by fitting the bare cavity response with the spins detuned from resonance. The spin-photon coupling rates $g_{s,L/R}$ for each device are obtained by fitting the data with the spins individually tuned into resonance with the cavity as shown in FIGS. 24C-D. From the Jaynes-Cummings model the bright states are expected to split with the enhanced collective coupling rate $2g_{s,LR} = 2\sqrt{g_{s,L}^2 + g_{s,R}^2}$. The extracted splittings agree with the theoretical predictions of $2g_{s,LR}/2\pi = 32.1$ MHz for Device 1 and $2g_{s,LR}/2\pi = 18.1$ MHz for Device 2 to within 6%.

FIGS. 24A-D show cavity-mediated spin-spin coupling. FIG. 24A shows tuning the L-spin into resonance with the cavity results in vacuum Rabi splitting with magnitude $2g_{s,L}$. A vacuum Rabi splitting of magnitude $2g_{s,LR} = 2\sqrt{g_{s,L}^2 + g_{s,R}^2}$ is expected when both spins are tuned into resonance with the cavity. FIG. 24B shows $A/A_0$ as a function of $f$ and $B^{ext}$ with $\phi=5.6°$ indicates an enhanced vacuum Rabi splitting when the L-spin and R-spin are tuned into resonance with the cavity. FIG. 24C shows $A/A_0$ as a function of $f$ for the R-spin in resonance (upper curve), L-spin in resonance (middle curve), and both spins in resonance (bottom curve). The enhancement of the vacuum Rabi splitting with both spins on resonance with the cavity is indicative of spin-spin coupling via the cavity mode. FIG. 24D shows cavity-assisted spin-spin coupling is also observed in a second device with a different gate pattern. Dashed lines in FIGS. 24C-D are fits to a master equation simulation. Insets in FIGS. 24C-D are scanning electron microscope images of the devices, with 200 nm scale bars.

The observation of enhanced vacuum Rabi splitting when the separated spins are simultaneously on resonance with the cavity is evidence of long-range spin-spin coupling. The nonlocal interaction of two spins marks an important milestone for all-to-all qubit connectivity and scalability in silicon-based quantum circuits. In the near term, this demonstration shows that the disclosed techniques allow for the implementation of modular qubit architectures in silicon, wherein nearest-neighbor coupled registers of spin qubits can be interfaced with other sparsely distributed registers via microwave photons. Further improvements in cavity quality factors and spin-photon coupling rates, will allow additional time-domain demonstrations of cavity-assisted spin-spin coupling.

The system can be modeled with an effective Jaynes-Cummings Hamiltonian $$H = \sum_j \frac{\hbar \omega_j}{2} \sigma_j^z + \hbar \left[ \omega_c a^\dagger a + \hbar g_{s,j}(\sigma_j^+ a + \sigma_j^- a^\dagger) \right],$$

where $j=L, R$, and $\hbar \omega_j$ is the energy level splitting of the effective j-spin, $\sigma_n^\mu$ an are the Pauli operators in the j-spin Hilbert space, $\omega_c/2\pi$ the cavity frequency and $g_{s,j}$ is the effective spin-cavity coupling rate. Dephasing can be introduced in our system by coupling the spin-cavity system to external baths. Integrating out these baths in a Born-Markov approximation leads to a Lindblad master equation for the spin-cavity dynamics $$\frac{d\rho}{dt} = -\frac{i}{\hbar}[H, \rho] + \sum_j (\gamma_{s,j}^d \mathcal{D}[\sigma_j^z] + \gamma_{s,j}^r \mathcal{D}[\sigma_j^-])\rho + \kappa \mathcal{D}[a]\rho,$$

where $\mathcal{D}[A](\rho) = A\rho A^\dagger - \frac{1}{2}(A^\dagger A\rho + \rho A^\dagger A)$ is the Lindblad super-operator, $\Upsilon_{s,j}^d$ is the spin-dephasing rate, $\Upsilon_{s,j}^r$ is the relaxation rate of the spins, and is the total cavity decay rate. The spin linewidth (FWHM) is given by $2\Upsilon_{s,j} = \Upsilon_{s,j}^d + \Upsilon_{s,j}^r$. Decompose $\kappa = \kappa_1 + \kappa_2 + \kappa_{in}$ into the contributions from the decay rates into the two transmission lines $\kappa_{1,2}$ and an intrinsic cavity decay rate $\kappa_{in}$.

The cavity transmission can be computed from the master equation evolution using input-output theory, which relates the output field operator $a_{n,out}$ of each transmission line to the input field operator $a_{n,in}$ through the relation $$a_{n,out}(t) = \sqrt{\kappa_n} a(t) - a_{n,in}(t).$$

where $a(t)$ is found from the operator evolution under the Lindblad master equation with the addition of a drive term $H_{drive} = \Sigma_n \sqrt{\kappa_n}(a^\dagger a_{n,in} + h.c.)$. In the limit of weak driving, $\sqrt{\kappa_n} \langle a_n a_{in} \rangle \ll \kappa$, one can neglect the population of the excited states of the Jaynes-Cummings model with more than one excitation, leaving the reduced spin-photon Hilbert space $$|0,\downarrow,\downarrow\rangle, |0,\uparrow,\downarrow\rangle, |0,\downarrow,\uparrow\rangle, |1,\downarrow,\downarrow\rangle$$

where the first quantum number labels the number of photons in the cavity and the left/right spin labels refer to the L/R-spin direction quantized along the axis of the local magnetic field. When $g_{s,j}\text{Tr}[\rho a] \ll \gamma_{s,j}$, one can further neglect populations outside of the ground state $|0,\downarrow,\downarrow\rangle$ and only need to account for off-diagonal coherences in the master equation evolution. In this limit, the complex transmission amplitude takes the approximate form $$A = \frac{\langle a_{2,out}\rangle}{\langle a_{1,in}\rangle} = \frac{\sqrt{\kappa_2}\,Tr[\rho a]}{\langle a_{1,in}\rangle} = \frac{-i(\sqrt{\kappa_1\kappa_2} + \Delta_0/q)}{-\Delta_0 - i\frac{\kappa}{2} - i\sum_j \frac{g_{s,j}^2}{\gamma_{s,j} + i\delta_j}}$$

where $\Delta_0 = \omega_d - \omega_c$ is the detuning of the cavity drive $\omega_d$ from the cavity frequency, $\delta_j = \omega_j - \omega_d$ is the detuning of the j-spin from the drive frequency, and a complex parameter q is introduced to account for Fano interference effects in the bare cavity transmission. For simplicity, all higher order corrections in $g_{s,j}/q$ to the cavity transmission are neglected.

From the spin-photon transitions in FIGS. 22C-D, the qubit frequency is fit and the magnetic susceptibility $\chi$ of the micromagnet is extracted, finding $\chi \approx 0.6$ at $\phi = 0°$ over small ranges of magnetic field. To generate the fit in FIG. 23C, the angular dependence of the resonance frequencies of the two DQDs is extracted using microwave spectroscopy in the dispersive regime. Substituting the extracted qubit frequencies $\omega_j$ into Eq. 5, the prediction for $A/A_0$ can be generated.

The fits to the R-spin and L-spin line cuts shown in FIGS. 24C-D are modeled with Eq. 5, using the input parameters in Table I. The parameter $g_s$ can remain as a free parameter in nonlinear regression fits and fix the remaining parameters extracted from separate measurements. The errors on $g_s$ given in the main text are determined from these fits. The gradient field can be assumed between the two dots is $\Delta B_x = 30$ mT based on previous experiments. $t_{c,L/R}$ is the interdot tunnel coupling of the left (right) DQDs. To fit the data in FIGS. 24C-D with both spins on resonance, an effective model is used where the splitting of the two bright states are extracted using a single collective coupling $g_{s,LR}$ and a single effective decay rate $\gamma_{s,LR}$.

The present disclosure may comprise at least the following aspects.

Aspect 1. A device comprising, consisting of, or consisting essentially of: at least one semiconducting layer; one or more conducting layers configured to define at least two quantum states in the at least one semiconducting layer and confine an electron in or more of the at least two quantum states; a magnetic field source configured to generate an inhomogeneous magnetic field, wherein the inhomogeneous magnetic field causes a first coupling of an electric charge state of the electron and a spin state of the electron; and a resonator configured to confine a photon, wherein an electric-dipole interaction causes a second coupling of an electric charge state of the electron to an electric field of the photon.

Aspect 2. The device of Aspect 1, wherein the photon is coupled to the spin state of the electron based on the first coupling and the second coupling.

Aspect 3. The device of any one of Aspects 1-2, wherein adjusting one or more of a field strength or an angle of an external magnetic field applied to one or more of the resonator or the at least one semiconducting layer causes coupling of the spin state to the photon.

Aspect 4. The device of any one of Aspects 1-3, wherein causing resonance of the energy of the electron and the energy of the photon causes coupling of the spin state to the photon.

Aspect 5. The device of any one of Aspects 1-4, wherein the first coupling comprises hybridization of the electric charge state of the electron and the spin state of the electron.

Aspect 6. The device of any one of Aspects 1-5, wherein the second coupling comprises hybridization of the electric charge state of the electron and the electric field of the photon.

Aspect 7. The device of any one of Aspects 1-6, wherein a spin-photon coupling between the photon and the electron occurs with a spin-photon coupling rate in a range of one or more of: about 10 Mhz to about 15 Mhz or about 5 MHz to about 150 MHz.

Aspect 8. The device of any one of Aspects 1-7, wherein the resonator is configured to couple the spin state of the electron to an additional spin state of another electron separated from the electron by a distance in a range of one or more of: about 1 mm to about 5 mm, about 2 mm to about 4 mm, about 3 mm to about 4 mm, about 3 mm to about 4 mm, about 1 mm to about 10 mm, or about 3 mm to about 8 mm.

Aspect 9. The device of any one of Aspects 1-8, wherein the resonator is coupled to a structure configured to confine an additional electron, wherein the structure is in a material stack separate from a material stack comprising the electron, wherein the photon mediates coupling of a spin state of the electron and a spin state of the additional electron.

Aspect 10. The device of Aspect 9, wherein adjusting one or more of an angle or an amplitude of an external magnetic field allows for simultaneous tuning of the spin state of the electron and the spin state of the additional electron in resonance with one or more of the photon or the resonator.

Aspect 11. The device of any one of Aspects 1-10, wherein the device enables coupling of a plurality of quantum states to the cavity to generate long range quantum gates between the plurality of quantum states.

Aspect 12. The device of any one of Aspects 1-11, wherein the at least one semiconducting layer comprises one or more of silicon, germanium, or silicon germanium.

Aspect 13. The device of any one of Aspects 1-12, wherein the at least one semiconducting layer comprises an isotopically enriched material.

Aspect 14. The device of Aspect 13, wherein the isotopically enriched material comprises isotopically enriched silicon.

Aspect 15. The device of Aspect 14, wherein the isotopically enriched silicon comprises nuclear spin zero silicon 28 isotope.

Aspect 16. The device of any one of Aspects 1-15, wherein the at least one semiconducting layer comprises a silicon layer disposed on a silicon germanium layer.

Aspect 17. The device of any one of Aspects 1-16, wherein the one or more conducting layers comprises a layer electrically coupled to the resonator.

Aspect 18. The device of Aspect 17, wherein the layer electrically coupled to the resonator comprises a split-gate layer comprising a first gate and a second gate separated from the first gate by a gap.

Aspect 19. The device of Aspect 18, wherein one or more of a size or a location of the gap increases (e.g., maximizes, optimizes) an electric field in a region of the at least two quantum state.

Aspect 20. The device of any one of Aspects 18-19, wherein one or more of a size or a location of the gap increases (e.g., maximizes, optimizes) coherent coupling between one or more of the at least two quantum states and the photon.

Aspect 21. The device of any one of Aspects 18-20, wherein the gap occurs in a layer of a material stack comprising the one or more conducting layers, and wherein the gap is below or above one or more of a plunger gate or a barrier gate.

Aspect 22. The device of any one of Aspects 1-21, wherein the at least two quantum states comprise a gate defined silicon double quantum dot.

Aspect 23. The device of any one of Aspects 1-22, wherein the one or more conducting layers comprise a first conducting layer comprising one or more barrier gates configured to define the at least two quantum states, and wherein one or more conducting layers comprise a second conducting layer comprising one or more plunger gates configured to cause the first electron to move between the at least two quantum states.

Aspect 24. The device of Aspect 23, wherein a first plunger gate of the one or more plunger gates is electrically coupled to the resonator.

Aspect 25. The device of any one of Aspects 1-24, wherein the at least one magnetic field source comprises at least one micro-magnet disposed in a material stack comprising the at least one semiconducting layer.

Aspect 26. The device of any one of Aspects 1-25, wherein the at least one magnetic field source comprises a first micro-magnet and a second micro-magnet separated from the first micro-magnet.

Aspect 27. The device of any one of Aspects 1-26, wherein the at least one magnetic field source is tilted such that a long axis of the at least one magnetic field source is angled relative to an axis between the at least two quantum states.

Aspect 28. The device of any one of Aspects 1-27, wherein the at least one magnetic field source comprises a current carrying wire configured to generate a magnetic field to enable spin-photon coupling.

Aspect 29. The device of any one of Aspects 1-8, wherein the resonator comprises one or more of a cavity, a superconductive cavity, or a microwave cavity.

Aspect 30. The device of any one of Aspects 1-29, wherein resonator comprises a path, a first mirror disposed on the path, and a second mirror disposed on the path opposite the first mirror.

Aspect 31. The device of any one of Aspects 1-30, wherein the resonator comprises a center pin adjacent a vacuum gap.

Aspect 32. The device of Aspect 31, wherein the center pin has a thickness in a range of one or more of: about 50 nm to about 10 μm. or about 0.5 μm to about 1 μm Aspect 33. The device of any one of Aspects 31-32, wherein the vacuum gap has a thickness in a range of one or more of: about 15 μm to about 25 μm or about 50 nm to about 30 μm.

Aspect 34. The device of any one of Aspects 1-33, wherein the resonator has an impedance in a range of one or more of: about 50Ω to about 200Ω, about 50Ω to about 300Ω, about 50Ω to about 3 kΩ, about 200Ω to about 300Ω, about 200Ω to about 200Ω, about 1 kΩ to about 2 kΩ, about 200Ω to about 3 kΩ, or about 1 kΩ to about 3kΩ.

Aspect 35. The device of any one of Aspects 1-34, wherein a length of the resonator is between about 10,000 and about 1,000,000 times a length in which the electron is confined.

Aspect 36. The device of any one of Aspects 1-35, wherein the resonator has a center frequency in a range of one or more of: about 2 GHz to about 12 GHz or about 7 GHz and about 8 GHz.

Aspect 37. A system comprising, consisting of, or consisting essentially of: a first structure configured to define at least two first quantum states in a first semiconducting layer and confine a first electron in or more of the at least two first quantum states, wherein the first structure comprises at least one magnetic field source configured to supply an inhomogeneous magnetic field to the first electron; a second structure configured to define at least two second quantum states in a second semiconducting layer and confine a second electron in or more of the at least two second quantum states; and a resonator disposed adjacent the first structure and the second structure, wherein tuning of an external magnetic field allows for a photon in the resonator to mediate coupling a first spin state of the first electron to a second spin state of the second electron.

Aspect 38. The system of Aspect 37, wherein the inhomogeneous magnetic field enables a first coupling of an electric charge state of the first electron and a first spin state of the first electron, and wherein an electric-dipole interaction causes a second coupling of an electric charge state of the first electron to an electric field of the photon.

Aspect 39. The system of Aspect 38, wherein the photon is coupled to the first spin state of the first electron based on the first coupling and the second coupling.

Aspect 40. The system of any one of Aspects 38-39, wherein the first coupling comprises hybridization of the electric charge state of the first electron and the first spin state of the first electron.

Aspect 41. The system of any one of Aspects 38-40, wherein the second coupling comprises hybridization of the electric charge state of the first electron and the electric field of the photon.

Aspect 42. The system of any one of Aspects 37-41, wherein adjusting one or more of a field strength or an angle of an external magnetic field applied to one or more of the resonator or the first structure causes coupling of the first spin state to the photon.

Aspect 43. The system of any one of Aspects 37-42, wherein causing resonance of an energy of the first electron and an energy of the photon causes coupling of the first spin state to the photon.

Aspect 44. The system of any one of Aspects 37-43, wherein a spin-photon coupling between the photon and the first electron occurs with a spin-photon coupling rate in a range of one or more of: about 10 Mhz to about 15 Mhz or about 5 MHz to about 150 MHz.

Aspect 45. The system of any one of Aspects 37-44, wherein the first electron is separated from the second electron by a distance in a range of one or more of: about 1 mm to about 5 mm, about 2 mm to about 4 mm, about 3 mm to about 4 mm, about 3 mm to about 4 mm, about 1 mm to about 10 mm, or about 3 mm to about 8 mm.

Aspect 46. The system of any one of Aspects 37-45, wherein the first structure is comprised in a material stack separate from a material stack comprising the second structure.

Aspect 47. The system of Aspect 46, wherein adjusting one or more of an angle or an amplitude of an external magnetic field allows for simultaneous tuning of the first spin state of the first electron and the second spin state of the second electron in resonance with one or more of the photon or the resonator.

Aspect 48. The system of any one of Aspects 37-47, wherein the system enables coupling of a plurality of quantum states to the cavity to generate long range quantum gates between the plurality of quantum states.

Aspect 49. The system of any one of Aspects 37-48, wherein one or more of the first semiconducting layer or the second semiconducting layer comprises one or more of silicon, germanium, or silicon germanium.

Aspect 50. The system of any one of Aspects 37-49, wherein one or more of the first semiconducting layer or the second semiconducting layer comprises an isotopically enriched material.

Aspect 51. The system of Aspect 50, wherein the isotopically enriched material comprises isotopically enriched silicon.

Aspect 52. The system of Aspect 51, wherein the isotopically enriched silicon comprises nuclear spin zero silicon 28 isotope.

Aspect 53. The system of any one of Aspects 37-52, wherein one or more of the first semiconducting layer or the second semiconducting layer comprises a silicon layer disposed on a silicon germanium layer.

Aspect 54. The system of any one of Aspects 37-53, wherein one or more of the first semiconducting layer or the second semiconducting layer comprises a layer electrically coupled to the resonator.

Aspect 55. The system of Aspect 54, wherein the layer electrically coupled to the resonator comprises a split-gate layer comprising a first gate and a second gate separated from the first gate by a gap.

Aspect 56. The system of Aspect 55, wherein one or more of a size or a location of the gap increases (e.g., maximizes, optimizes) an electric field in a region of the at least two first quantum states.

Aspect 57. The system of any one of Aspects 55-56, wherein one or more of a size or the location of the gap increases (e.g., maximizes, optimizes) coherent coupling between one or more of the at least two first quantum states and the photon.

Aspect 58. The system of any one of Aspects 55-57, wherein the gap occurs in a layer of a material stack comprising one or more conducting layers, and wherein the gap is below or above one or more of a plunger gate or a barrier gate.

Aspect 59. The system of any one of Aspects 37-58, wherein the at least two first quantum states comprise a gate defined silicon double quantum dot.

Aspect 60. The system of any one of Aspects 37-59, wherein one or more of the first structure or the second structure comprise one or more conducting layers, wherein the one or more conducting layers comprise a first conducting layer comprising one or more barrier gates configured to define the at least two first quantum states, and wherein the one or more conducting layers comprise a second conducting layer comprising one or more plunger gates configured to cause the first electron to move between the at least two first quantum states.

Aspect 61. The system of Aspect 60, wherein a first plunger gate of the one or more plunger gates is electrically coupled to the resonator.

Aspect 62. The system of any one of Aspects 37-61, wherein the at least one magnetic field source comprises at least one micro-magnet disposed in a material stack comprising the first semiconducting layer.

Aspect 63. The system of any one of Aspects 37-62, wherein the at least one magnetic field source comprises a first micro-magnet and a second micro-magnet separated from the first micro-magnet.

Aspect 64. The system of any one of Aspects 37-63, wherein the at least one magnetic field source is tilted such that a long axis of the at least one magnetic field source is angled relative to an axis between the at least two first quantum states of the first structure.

Aspect 65. The system of any one of Aspects 37-64, wherein the at least one magnetic field source comprises a current carrying wire configured to generate a magnetic field to enable spin-photon coupling.

Aspect 66. The system of any one of Aspects 37-65, wherein the resonator comprises one or more of a cavity, a superconductive cavity, or a microwave cavity.

Aspect 67. The system of any one of Aspects 37-66, wherein resonator comprises a path, a first minor disposed on the path, and a second mirror disposed on the path opposite the first mirror.

Aspect 68. The system of any one of Aspects 37-67, wherein the resonator comprises a center pin adjacent a vacuum gap.

Aspect 69. The system of Aspect 68, wherein the center pin has a thickness in a range of one or more of: about 50 nm to about 10 μm. or about 0.5 μm to about 1 μm Aspect 70. The system of any one of Aspects 68-69, wherein the vacuum gap has a thickness in a range of one or more of: about 15 μm to about 25 μm or about 50 nm to about 30 μm.

Aspect 71. The system of any one of Aspects 37-70, wherein the resonator has an impedance in a range of one or more of: about 50Ω to about 200Ω, about 50Ω to about 300Ω, about 50Ω to about 3 kΩ, about 200Ω to about 300Ω, about 200Ω to about 2 kΩ, about 1 kΩ to about 2 kΩ, about 200Ω to about 3 kΩ, or about 1 kΩ to about 3 kΩ.

Aspect 72. The system of any one of Aspects 37-71, wherein a length of the resonator is between about 10,000 and about 1,000,000 times a length in which the first electron is confined.

Aspect 73. The system of any one of Aspects 37-72, wherein the resonator has a center frequency in a range of one or more of: about 2 GHz to about 12 GHz or about 7 GHz and about 8 GHz.

Aspect 74. A method comprising, consisting of, or consisting essentially of: confining a first electron with a first structure, wherein the first structure defines two quantum states in at least one semiconducting layer using one or more conducting layers; causing, based on an inhomogeneous magnetic field source, a first coupling of an electric charge state of the first electron and a first spin state of the first electron; causing, based on an electric-dipole interaction, a second coupling of an electric field of a photon in a resonator to an orbital state of the first electron; and causing, based on the first coupling and the second coupling, a coupling of the photon and the first spin state of the first electron.

Aspect 75. The method of Aspect 74, wherein causing the coupling of the photon and the first spin state of the first electron comprises adjusting one or more of a field strength or an angle of an external magnetic field applied to one or more of the resonator or the at least one semiconducting layer to cause coupling of the first spin state to the photon.

Aspect 76. The method of any one of Aspects 74-75, wherein causing the second coupling comprises causing resonance of an energy of the first electron and an energy of the photon.

Aspect 77. The method of any one of Aspects 74-76, wherein the first coupling comprises hybridization of an electric charge state of the first electron and the first spin state of the first electron.

Aspect 78. The method of any one of Aspects 74-77, wherein the second coupling comprises hybridization of an electric charge state of the first electron and the electric field of the photon.

Aspect 79. The method of any one of Aspects 74-78, wherein a spin-photon coupling between the photon and the first electron occurs with a spin-photon coupling rate in a range of one or more of: about 10 Mhz to about 15 Mhz or about 5 MHz to about 150 MHz.

Aspect 80. The method of any one of Aspects 74-79, further comprising causing coupling of the first spin state of the first electron to a second spin state of a second electron.

Aspect 81. The method of Aspect 80, wherein the first electron is separated from the second electron by a distance in a range of one or more of: about 1 mm to about 5 mm, about 2 mm to about 4 mm, about 3 mm to about 4 mm, about 3 mm to about 4 mm, about 1 mm to about 10 mm, or about 3 mm to about 8 mm.

Aspect 82. The method of any one of Aspects 80-81, wherein the resonator is coupled to a structure configured to confine the second electron, wherein the structure is in a material stack separate from a material stack comprising the first electron, wherein the photon mediates coupling of a first spin state of the first electron and a second spin state of the second electron.

Aspect 83. The method of Aspect 82, wherein causing coupling of the first spin state and the second spin state comprises adjusting one or more of an angle or an amplitude of an external magnetic field to allow simultaneously tuning of the first spin state of the first electron and the second spin state of the second electron in resonance with one or more of the photon or the resonator.

Aspect 84. The method of any one of Aspects 74-83, further coupling of a plurality of quantum states to the resonator to generate long range quantum gates between the plurality of quantum states.

Aspect 85. The method of any one of Aspects 74-84, wherein the at least one semiconducting layer comprises one or more of silicon, germanium, or silicon germanium.

Aspect 86. The method of any one of Aspects 74-85, wherein the at least one semiconducting layer comprises an isotopically enriched material.

Aspect 87. The method of Aspect 86, wherein the isotopically enriched material comprises isotopically enriched silicon.

Aspect 88. The method of Aspect 87, wherein the isotopically enriched silicon comprises nuclear spin zero silicon 28 isotope.

Aspect 89. The method of any one of Aspects 74-88, wherein the at least one semiconducting layer comprises a silicon layer disposed on a silicon germanium layer.

Aspect 90. The method of any one of Aspects 74-89, wherein the one or more conducting layers comprise a layer electrically coupled to the resonator.

Aspect 91. The method of Aspect 90, wherein the layer electrically coupled to the resonator comprises a split-gate layer comprising a first gate and a second gate separated from the first gate by a gap.

Aspect 92. The method of Aspect 91, wherein one or more of a size or a location of the gap increases (e.g., maximizes, optimizes) an electric field in a region of the at least two quantum state.

Aspect 93. The method of any one of Aspects 91-92, wherein one or more of a size or a location of the gap increases (e.g., maximizes, optimizes) coherent coupling between one or more of the at least two quantum states and the photon.

Aspect 94. The method of any one of Aspects 91-93, wherein the gap occurs in a layer of a material stack comprising the one or more conducting layers, and wherein the gap is below or above one or more of a plunger gate or a barrier gate.

Aspect 95. The method of any one of Aspects 74-94, wherein the at least two quantum states comprise a gate defined silicon double quantum dot.

Aspect 96. The method of any one of Aspects 74-95, wherein the one or more conducting layers comprise a first conducting layer comprising one or more barrier gates configured to define the at least two quantum states, and wherein one or more conducting layers comprise a second conducting layer comprising one or more plunger gates configured to cause the first electron to move between the at least two quantum states.

Aspect 97. The method of Aspect 96, wherein a first plunger gate of the one or more plunger gates is electrically coupled to the resonator.

Aspect 98. The method of any one of Aspects 74-97, wherein the inhomogeneous magnetic field source comprises at least one micro-magnet disposed in a material stack comprising the at least one semiconducting layer.

Aspect 99. The method of any one of Aspects 74-98, wherein the inhomogeneous magnetic field source comprises a first micro-magnet and a second micro-magnet separated from the first micro-magnet.

Aspect 100. The method of any one of Aspects 74-99, wherein the inhomogeneous magnetic field source is tilted such that a long axis of the at least one magnetic field source is angled relative to an axis between the at least two quantum states.

Aspect 101. The method of any one of Aspects 74-100, wherein the inhomogeneous magnetic field source comprises a current carrying wire configured to generate a magnetic field to enable spin-photon coupling.

Aspect 102. The method of any one of Aspects 74-101, wherein the resonator comprises one or more of a cavity, a superconductive cavity, or a microwave cavity.

Aspect 103. The method of any one of Aspects 74-102, wherein resonator comprises a path, a first mirror disposed on the path, and a second mirror disposed on the path opposite the first mirror.

Aspect 104. The method of any one of Aspects 74-103, wherein the resonator comprises a center pin adjacent a vacuum gap.

Aspect 105. The method of Aspect 104, wherein the center pin has a thickness in a range of one or more of: about 50 nm to about 10 µm. or about 0.5 µm to about 1 µm.

Aspect 106. The method of any one of Aspects 104-105, wherein the vacuum gap has a thickness in a range of one or more of: about 15 µm to about 25 µm or about 50 nm to about 30 µm.

Aspect 107. The method of any one of Aspects 74-106, wherein the resonator has an impedance in a range of one or more of: about 50Ω to about 200Ω, about 50Ω to about 300Ω, about 50Ω to about 3 kΩ, about 200Ω to about 300Ω, about 200Ω to about 2 kΩ, about 1 kΩ to about 2 kΩ, about 200Ω to about 3 kΩ, or about 1 kΩ to about 3 kΩ.

Aspect 108. The method of any one of Aspects 74-107, wherein a length of the resonator is between about 10,000 and about 1,000,000 times a length in which one or more of the first electron or second electron is confined.

Aspect 109. The method of any one of Aspects 74-108, wherein the resonator has a center frequency in a range of one or more of: about 2 GHz to about 12 GHz or about 7 GHz and about 8 GHz.

Aspect 110. A spin to photon transducer, comprising, consisting of, or consisting essentially of: a semiconductor heterostructure adapted to confine electrons in a 2-dimensional plane; a plurality of overlapping conducting layers of electrodes, configured to confine an electron within a double quantum dot; a superconducting cavity positioned adjacent to the double quantum dot; and a micro-magnet positioned over the double quantum dot.

Aspect 111. The spin to photon transducer of Aspect 110, wherein the semiconductor heterostructure is Si/SiGe.

Aspect 112. The spin to photon transducer of any one of Aspects 110-111, wherein the electrodes are aluminum.

Aspect 113. The spin to photon transducer of any one of Aspects 110-112, wherein the superconducting cavity is niobium.

Aspect 114. The spin to photon transducer of any one of Aspects 110-113, wherein the superconducting cavity has a center frequency between 7 and 8 GHz.

Aspect 115. The spin to photon transducer of any one of Aspects 110-114, wherein a length of the superconducting cavity is between 10,000 and 1,000,000 times a length in which the single electron is confined.

Aspect 116. The spin to photon transducer of any one of Aspects 110-115, wherein the plurality of overlapping conducting layers consists of three layers including a first layer consisting of at least 2 gates, a second layer consisting of at least 2 plunger gates, and third layer consisting of at least 3 barrier gates.

Aspect 117. A method for coupling the electric field of the cavity photon to the spin state of the electron, the method comprising, consisting of, or consisting essentially of the steps of: confining electrons in a 2-dimensional plane within a semiconductor heterostructure; confining an electron within a double quantum dot; coupling an electric field of a superconducting cavity photon to an orbital state of the electron through electric dipole interaction; and producing a local magnetic field gradient to hybridize the orbital state of the electron with its spin state.

Aspect 118. The method of Aspect 117, wherein the semiconductor heterostructure is Si/SiGe.

Aspect 119. The method of any one of Aspects 117-118, wherein the superconducting cavity is niobium.

Aspect 120. The method of any one of Aspects 117-119, further comprising tuning the transition frequency of the electron spin to about the cavity frequency.

It is to be understood that the methods and systems are not limited to specific methods, specific components, or to particular implementations. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Components are described that may be used to perform the described methods and systems. When combinations, subsets, interactions, groups, etc., of these components are described, it is understood that while specific references to each of the various individual and collective combinations and permutations of these may not be explicitly described, each is specifically contemplated and described herein, for all methods and systems. This applies to all aspects of this application including, but not limited to, operations in described methods. Thus, if there are a variety of additional operations that may be performed it is understood that each of these additional operations may be performed with any specific embodiment or combination of embodiments of the described methods.

As will be appreciated by one skilled in the art, the methods and systems may take the form of an entirely hardware embodiment, an entirely software embodiment, or an embodiment combining software and hardware aspects. Furthermore, the methods and systems may take the form of a computer program product on a computer-readable storage medium having computer-readable program instructions (e.g., computer software) embodied in the storage medium. More particularly, the present methods and systems may take the form of web-implemented computer software. Any suitable computer-readable storage medium may be utilized including hard disks, CD-ROMs, optical storage devices, or magnetic storage devices.

Embodiments of the methods and systems are described herein with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, may be implemented by computer program instructions. These computer program instructions may be loaded on a general-purpose computer, special-purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that may direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

The various features and processes described above may be used independently of one another, or may be combined in various ways. All possible combinations and sub-combinations are intended to fall within the scope of this disclosure. In addition, certain methods or process blocks may be omitted in some implementations. The methods and processes described herein are also not limited to any particular sequence, and the blocks or states relating thereto may be performed in other sequences that are appropriate. For example, described blocks or states may be performed in an order other than that specifically described, or multiple blocks or states may be combined in a single block or state. The example blocks or states may be performed in serial, in parallel, or in some other manner. Blocks or states may be added to or removed from the described example embodiments. The example systems and components described herein may be configured differently than described. For example, elements may be added to, removed from, or rearranged compared to the described example embodiments.

While the methods and systems have been described in connection with preferred embodiments and specific examples, it is not intended that the scope be limited to the particular embodiments set forth, as the embodiments herein are intended in all respects to be illustrative rather than restrictive.

It will be apparent to those skilled in the art that various modifications and variations may be made without departing from the scope or spirit of the present disclosure. Other embodiments will be apparent to those skilled in the art from consideration of the specification and practices described herein. It is intended that the specification and example figures be considered as exemplary only, with a true scope and spirit being indicated by the following claims.

What is claimed:

1. A method comprising:
   confining a first electron with a first structure, wherein the first structure defines at least two quantum states in at least one semiconducting layer using one or more conducting layers;
   causing, based on an inhomogeneous magnetic field source, a first coupling of an electric charge state of the first electron and a first spin state of the first electron;
   causing, based on an electric-dipole interaction, a second coupling of an electric field of a photon in a resonator to an orbital state of the first electron; and
   causing, based on the first coupling and the second coupling, a coupling of the photon and the first spin state of the first electron.

2. The method of claim 1, wherein causing the coupling of the photon and the first spin state of the first electron comprises adjusting one or more of a field strength or an angle of an external magnetic field applied to one or more of the resonator or the at least one semiconducting layer to cause coupling of the first spin state to the photon.

3. The method of claim 1, wherein causing the second coupling comprises causing resonance of an energy of the first electron and an energy of the photon.

4. The method of claim 1, wherein the first coupling comprises hybridization of an electric charge state of the first electron and the first spin state of the first electron.

5. The method of claim 1, wherein the second coupling comprises hybridization of an electric charge state of the first electron and the electric field of the photon.

6. The method of claim 1, further comprising causing coupling of the first spin state of the first electron to a second spin state of a second electron.

7. The method of claim 6, wherein the resonator is coupled to a structure configured to confine the second electron, wherein the structure is in a material stack separate from a material stack comprising the first electron, wherein the photon mediates coupling of the first spin state of the first electron and a second spin state of the second electron.

8. The method of claim 7, wherein causing coupling of the first spin state and the second spin state comprises adjusting one or more of an angle or an amplitude of an external magnetic field to allow simultaneously tuning of the first spin state of the first electron and the second spin state of the second electron in resonance with one or more of the photon or the resonator.

9. The method of claim 1, further comprising coupling of a plurality of quantum states to the resonator to generate long range quantum gates between the plurality of quantum states.

10. The method of claim 1, wherein the at least one semiconducting layer comprises an isotopically enriched material.

11. The method of claim 1, wherein the one or more conducting layers comprise a layer electrically coupled to the resonator.

12. The method of claim 11, wherein the layer electrically coupled to the resonator comprises a split-gate layer comprising a first gate and a second gate separated from the first gate by a gap.

13. The method of claim 1, wherein the at least two quantum states comprise a gate defined silicon double quantum dot.

14. The method of claim 1, wherein the one or more conducting layers comprise a first conducting layer comprising one or more barrier gates configured to define the at least two quantum states, and wherein one or more conducting layers comprise a second conducting layer comprising one or more plunger gates configured to cause the first electron to move between the at least two quantum states.

15. The method of claim 14, wherein a first plunger gate of the one or more plunger gates is electrically coupled to the resonator.

16. The method of claim 1, wherein the inhomogeneous magnetic field source comprises at least one micro-magnet disposed in a material stack comprising the at least one semiconducting layer.

17. The method of claim 1, wherein the inhomogeneous magnetic field source comprises a first micro-magnet and a second micro-magnet separated from the first micro-magnet.

18. The method of claim 1, wherein the inhomogeneous magnetic field source is tilted such that a long axis of the inhomogeneous magnetic field source is angled relative to an axis between the at least two quantum states.

19. The method of claim 1, wherein the inhomogeneous magnetic field source comprises a current carrying wire configured to generate a magnetic field to enable spin-photon coupling.

20. The method of claim 1, wherein the resonator comprises one or more of a cavity, a superconductive cavity, or a microwave cavity.

* * * * *